United States Patent
Koyama et al.

(10) Patent No.: US 6,441,758 B1
(45) Date of Patent: *Aug. 27, 2002

(54) D/A CONVERSION CIRCUIT AND SEMICONDUCTOR DEVICE

(75) Inventors: Jun Koyama; Mitsuaki Osame; Yukio Tanaka; Munehiro Azami, all of Kanagawa; Naoko Yano, Yamagata; Shou Nagao, Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 40 days.

(21) Appl. No.: 09/197,766

(22) Filed: Nov. 23, 1998

(30) Foreign Application Priority Data

Nov. 27, 1997 (JP) ............................................. 9-344351
Dec. 19, 1997 (JP) ............................................. 9-365054
May 12, 1998 (JP) .......................................... 10-146592

(51) Int. Cl.[7] .......................... H03M 1/00; H03M 1/66; H01L 27/01
(52) U.S. Cl. ........................ 341/136; 341/145; 257/351
(58) Field of Search ................................ 341/136, 137, 341/144, 145; 257/347, 350, 351; 348/14; 345/98

(56) References Cited

U.S. PATENT DOCUMENTS

| 4,398,207 A | | 8/1983 | Hoff, Jr. et al. |
| 4,801,819 A | | 1/1989 | Theus et al. |
| 5,570,105 A | * | 10/1996 | Koyama ........................ 345/98 |
| 5,572,211 A | * | 11/1996 | Erhart et al. ................. 341/144 |
| 6,111,557 A | * | 8/2000 | Koyama et al. ............... 345/89 |

FOREIGN PATENT DOCUMENTS

JP 08-237097 9/1996

OTHER PUBLICATIONS

Lewis et al, "Switched–Capacitor Circuit using Polysilicon on Quartz Thin Film Technology," IEEE International Solid–State Circuits Conference, 122–123, 1992.*
Ohtani et al., "LP–B: Late–News Poster: A 60–in. HDTV Rear–Projector with Continuous–Grain–Silicon Technology" May 17–22, 1998, pp. 467–470, SID 98 Digest, International Symposium Digest of Technical Papers, vo.l. XXIX.
Furuhashi et al., "23.4: A 64–Gray–Scale Digital Signal Driver for Color TFT–LCDs", jun. 14, 1994, pp. 359–362, SID 94 Digest.
Patent Abstracts of Japan. Publication No. 58–030231, Junichi Oguchi, Feb. 22, 1983, "Analog Switching Circuit with Selector".
European Search Report, Oct. 27, 2000, 3 pages.

* cited by examiner

Primary Examiner—Patrick Wamsley
(74) Attorney, Agent, or Firm—Eric J. Robinson; Nixon Peabody LLP

(57) ABSTRACT

A D/A conversion circuit with a small area is provided. In the D/A conversion circuit, according to a digital signal transmitted from address lines of an address decoder, one of four gradation voltage lines is selected. A circuit including two N-channel TFTs is connected in series to a circuit including two P-channel TFT, and a circuit including the circuits connected in series to each other is connected in parallel to each of the gradation voltage lines. Further, an arrangement of the circuit including the two N-channel TFTs and the circuit including the two P-channel TFTs is reversed for every gradation voltage line. By this, the crossings of wiring lines in the D/A conversion circuit becomes small and the area can be made small.

51 Claims, 37 Drawing Sheets

SOURCE LINE

5nm

5nm 0.1nm 0.1nm

D/A CONVERSION CIRCUIT AND SEMICONDUCTOR DEVICE

BACKGROUND OF THE INVENTION

1. Field of the Invention

The present invention relates to a D/A conversion circuit for converting a digital signal into an analog signal, and particularly, to a D/A conversion circuit used in a driving circuit of a semiconductor display device.

2. Description of the Related Art

In recent years, a technique for manufacturing a semiconductor device in which a semiconductor thin film is formed on an inexpensive glass substrate, such as a thin film transistor (TFT), has been rapidly developed. The reason is that a demand for an active matrix type semiconductor display device (particularly, an active matrix type liquid crystal display device) has been increased.

The active matrix type liquid crystal display device is structured such that a TFT is disposed for each of several tens to several millions of pixel regions disposed in matrix, and an electric charge going in and out of respective pixel electrodes is controlled by the switching function of the TFT.

Among them, with the improvement of fineness and picture quality of a display device, attention comes to be paid to a digital driving system active matrix type liquid crystal display device capable of being driven at high speed.

FIG. 31 shows a conventional digital driving system active matrix type liquid crystal display device. As shown in FIG. 31, the conventional digital driving system active matrix type liquid crystal display device includes a source signal line side shift register 01, address lines 02 of a digital decoder, latch circuits 03 (LAT1), latch circuits 04 (LAT2), a latch pulse line 05, D/A conversion circuits (digital/analog conversion circuits) 06, source signal lines 07, a gate signal line side shift register 08, gate signal lines (scanning lines) 09, pixel TFTs 10, and the like. Here, the 2-bit digital driving system active matrix type liquid crystal display device is taken for instance. Incidentally, in the latch circuits LAT1 and LAT2, respectively, two latch circuits are shown in one bundle for convenience.

Digital gradation signals supplied to address lines 02 (1 and 2) of the digital decoder are written in the LAT1 group by timing signals from the source signal line side shift register 01.

A time in which writing of the digital gradation signals into the LAT1 group is roughly completed, is referred to as one line period. That is, one line period is a time interval between the start point of writing of a gradation signal from the digital decoder into the leftmost LAT1 and the end point of writing of a gradation signal from the digital decoder into the rightmost LAT1.

After the writing of the gradation signals into the LAT1 group is completed, when a latch pulse flows to the latch pulse line 05 synchronously with the operation timing of the shift register, the gradation signals written in the latch 1 group are transmitted all at once into the LAT2 group and are written.

Into the LAT1 group which have finished transmission of the gradation signals into the LAT2 group, writing of gradation signals supplied to the digital decoder is again sequentially carried out by a signal from the source signal line side shift register 01.

In the second one line period, according to the gradation signals transmitted to the LAT2 group synchronously with the start of the second one line period, one of four gradation voltages is selected by the D/A conversion circuits 06.

The selected gradation voltage is supplied to the corresponding source signal line in one line period.

By repeating the above-mentioned operation, images are supplied to the entire pixel portion of the liquid crystal display device.

Here, the conventional D/A conversion circuit used in the foregoing driving circuit will be described.

FIG. 32 shows the D/A conversion circuit 06 of the foregoing active matrix type liquid crystal display device. As shown in FIG. 32, the D/A conversion circuit 06 is made up of four NAND circuits 22.1 to 22.4, four gradation voltage lines (V0 to V3) 23, and four P-channel TFTs 24.1 to 24.4.

Such a structure is adopted that one of the four P-channel TFTs 24.1 to 24.4 is selected according to signals supplied from the LAT2 group to signal lines 21a and 21b and their inversion signals. Then a voltage is applied to the source signal line 07 from the gradation voltage line connected to the selected TFT.

A circuit pattern diagram and a circuit diagram of the NAND circuit 22 of the above D/A conversion circuit 06 are shown in FIGS. 33A and 33B, respectively. In FIG. 33A, wiring lines having the same pattern indicate the same wiring layers. Reference numerals 33, 34 and 38 denote gate electrode wiring layers, and 35 to 37 denote second wiring layers formed over the gate electrode wiring layers with an insulating layer interposed therebetween.

Reference numeral 31 denotes a semiconductor active layer of a P-channel TFT, and 32 denotes a semiconductor active layer of an N-channel TFT. Reference numerals 33 and 34 denote gate electrode wiring lines, and form TFTs Tr1 and Tr4, and TFTs Tr2 and Tr3, respectively. An input signal Vin1 is inputted to the gate electrode wiring line 34, and an input signal Vin2 is inputted to the gate electrode wiring line 33. Reference numeral 35 denotes a wiring line for supplying a voltage from Vdd, which is connected to source regions of the TFTs Tr1 and Tr2. The second wiring layer 36 is connected to drain regions of the TFTs Tr1 and Tr2 and a drain region of the TFT Tr3, and supplies an output signal to the gate electrode wiring layer 38 Vout. The second wiring layer 37 denotes a GND wiring line, and is connected to a source region of the TFT Tr4. Blackened portions 39 indicate portions where the semiconductor active layer is connected to the second wiring layer, or the gate electrode wiring layer is connected to the second wiring layer.

FIG. 33B shows an equivalent circuit of the circuit pattern of the NAND circuit of the D/A conversion circuit shown in FIG. 33A.

According to FIGS. 33A and 33B, in the NAND circuit, there are many (five) portions (typically denoted by reference numeral 40) where the second wiring layer is connected to the semiconductor active layer or the gate electrode wiring layer. In these connection portions, in order to compensate a shift which occurs at the time of making a contact hole for the above connection, the semiconductor active layer must be made large more than needs. Thus, there is a defect that the whole area of the circuit becomes large.

In the foregoing 2-bit D/A conversion circuit, four such NAND circuits are required. Moreover, in the whole driving circuit, the number of required D/A conversion circuits is equal to the number of source signal lines. As a result, the rate of the area of the D/A conversion circuits (NAND circuits) occupying the driving circuit becomes large. This is one of causes of hindering the miniaturization of a semiconductor display device.

In order to improve the fineness of the semiconductor display device, it becomes necessary to increase the number of pixels, that is, the number of source signal lines. However, as described above, one D/A conversion circuit is necessary for one signal line, which is one of causes of hindering the improvement in the fineness.

FIG. 34 shows another conventional digital driving system active matrix type liquid crystal display device. As shown in FIG. 34, the conventional digital driving system active matrix type liquid crystal display device includes a source signal line side shift register 51, address lines (a to d) 52 of a digital decoder, latch circuits (LAT1) 53, latch circuits (LAT2) 54, a latch pulse line 55, D/A conversion circuits 56, gradation voltage lines 57, source signal lines 58, a gate signal line side shift register 59, gate signal lines (scanning lines) 60, pixel TFTs 61, and the like. Here, the 4-bit digital driving system active matrix type liquid crystal display device is taken for instance. Incidentally, in the latch circuits LAT1 and LAT2, respectively, four latch circuits are shown in one bundle for convenience.

Digital signals (digital gradation signals) supplied to the address lines (a to d) 52 of the digital decoder are sequentially written in the LAT1 group by timing signals from the source signal line side shift register 51.

A time in which writing of the digital signals into the LAT1 group is roughly completed, is referred to as one line period. That is, one line period is a time interval between the start point of writing of a digital signal from the digital decoder into the leftmost LAT1 53 and the end point of writing of a digital signal from the digital decoder into the rightmost LAT1.

After the writing of the digital signals into the LAT1 group is completed, when a latch pulse flows to the latch pulse line 55 synchronously with the operation timing of the shift register, the digital signals written in the latch 1 group are transmitted all at once into the LAT2 group and are written.

Into the LAT1 group which have finished transmission of the digital signals into the LAT2 group, writing of digital signals supplied to the digital decoder is again sequentially carried out by signals from the source signal line side shift register 51.

In the second one line period, voltages corresponding to the digital signals transmitted to the LAT2 group are supplied to the source signal lines 58 synchronously with the start of the second one line period. In the driving circuit quoted as an example here, conversion of a digital signal into a gradation voltage is carried out in such a manner that the D/A conversion circuit 56 selects one of 16 gradation voltages.

The selected gradation voltage is supplied to the corresponding source signal line 58 in one line period. By a scanning signal from the gate signal line side shift register 59, switching of a corresponding TFT is carried out and liquid crystal molecules are driven.

One picture (one frame) is formed by repeating the above-mentioned operation a certain number of times, the number being equal to the number of scanning lines. In general, in an active matrix type liquid crystal display device, renewal of pictures of 60 frames a second is carried out.

Here, the conventional D/A conversion circuit 56 used in the foregoing digital driving circuit will be described in FIG. 35.

The conventional 4-bit D/A conversion circuit includes a plurality of switches (sw0 to sw15) and gradation voltage lines (V0 to V15). This circuit is designed such that one of the plurality of switches (sw0 to sw15) is selected by a 4-bit digital signal supplied from the LAT2 group, and a voltage is supplied to the source signal line 58 from the gradation voltage line 57 connected to the selected switch.

Such a D/A conversion circuit 56 is provided for one source signal line 58 in a one-to-one correspondence.

In the case of the conventional 4-bit D/A conversion circuit 56 described here, the number of switches is 16, and the number of gradation voltage lines 57 is 16. In an actual active matrix type liquid crystal display device, the area of a switch is large and the total are a of the driving circuit becomes large.

Here, another example of a conventional 4-bit D/A conversion circuit will be described in FIG. 36. Similarly to the 4-bit D/A conversion circuit described before, the 4-bit D/A conversion circuit shown in FIG. 36 is designed such that one of a plurality of switches (sw0 to sw15) is selected by a 4-bit digital signal supplied from the LAT2 group, and a voltage is supplied to the source signal line from the gradation voltage line connected to the selected switch.

In the D/A conversion circuit shown in FIG. 36, the number of gradation voltage lines is 5 (V0 to V4), which is smaller than that of the previously described 4-bit D/A conversion circuit as shown in FIG. 35. However, the number of switches is 16. Thus, the total area of the driving circuit can not be reduced.

Although the D/A conversion circuit which processes a 4-bit digital signal is described here, if the number of bits is increased, the number of switches is increased exponentially. That is, in a conventional D/A conversion circuit which processes an n-bit digital signal, $2^n$ switches are required. Thus, the area of a driving circuit becomes large.

The largeness of the driving circuit as described above is one of causes of hindering the miniaturization of a semiconductor display device, particularly an active matrix type liquid crystal display device.

Moreover, for the purpose of improving the fineness of a semiconductor display device, it becomes necessary to increase the number of pixels, that is, the number of source signal lines. However, as described above, if the number of source signal lines is increased, the number of D/A conversion circuits is also increased and the area of the driving circuit is increased, which is one of causes of hindering the improvement of fineness.

SUMMARY OF THE INVENTION

From the reasons described above, a D/A conversion circuit with a small area has been earnestly desired.

The present invention has been made in view of the foregoing problems, and an object thereof is to provide a D/A conversion circuit small in area.

According to an aspect of the present invention, in a D/A conversion circuit in which one of $2^n$ gradation voltage lines is selected according to an inputted n-bit (n is an integer not less than 2) digital signal and a gradation voltage is supplied to an output line from the selected gradation voltage line, a first circuit including n P-channel TFTs connected in series to each other is connected in series to a second circuit including n N-channel TFTs connected in series to each other, a circuit including the first circuit and the second circuit is connected in parallel to each of the $2^n$ gradation voltage lines, a connection portion between the first circuit and the second circuit is connected to the output line, and the digital signal switches the n P-channel TFTs and the n N-channel TFTs connected to each of the $2^n$ gradation voltage lines. The above object is achieved by this structure.

The n P-channel TFTs may be connected each other through only a semiconductor layer, and the n N-channel TFTs may be connected each other through only a semiconductor layer.

The D/A conversion circuit may be formed over an insulating substrate.

According to another aspect of the present invention, in a D/A conversion circuit in which one of $2^n$ gradation voltage lines is selected according to an inputted n-bit (n is an integer not less than 2) digital signal and a gradation voltage is supplied to an output line from the selected gradation voltage line, a first circuit including n P-channel TFTs connected in series to each other is connected in series to a second circuit including n N-channel TFTs, a circuit including the first circuit and the second circuit is connected in parallel to each of the $2^n$ gradation voltage lines, a connection portion between the first circuit and the second circuit is connected to the output line, and the digital signal is supplied to gate electrodes of the n P-channel TFTs and gate electrodes of the n N-channel TFTs connected to each of the $2^n$ gradation voltage lines. The above object is achieved by this structure.

The n P-channel TFTs may be connected each other through only a semiconductor layer, and the n N-channel TFTs may be connected each other through only a semiconductor layer.

The D/A conversion circuit may be formed on an insulating substrate.

According to still another aspect of the present invention, in a D/A conversion circuit in which one of $2^n$ gradation voltage lines is selected according to an inputted n-bit (n is an integer not less than 2) digital signal and a gradation voltage is supplied to an output line from the selected gradation voltage line, a first circuit including n P-channel TFTs connected in series to each other is connected in series to a second circuit including n N-channel TFTs connected in series to each other, a circuit including the first circuit and the second circuit is connected in parallel to each of the $2^n$ gradation voltage lines, voltages supplied to the $2^n$ gradation voltage lines become high in a direction from the first gradation voltage line to $2^n$-th gradation voltage line, the x-th ($1 \leq x \leq 2^n$; x is an integer) gradation voltage line and the ($2^n+1-x$)-th gradation voltage line are paired and are adjacent to each other, the arrangements of the first circuit and the second circuit in the paired gradation voltage lines are reverse to each other, a connection portion between the first circuit and the second circuit is connected to the output line, and the digital signal is supplied to gate electrodes of the n P-channel TFTs and gate electrodes of the n N-channel TFTs connected to each of the $2^n$ gradation voltage lines. The above object is achieved by this structure.

The n P-channel TFTs may be connected each other through only a semiconductor layer, and the n N-channel TFTs may be connected each other through only a semiconductor layer.

The D/A conversion circuit may be formed over an insulating substrate.

According to still another aspect of the present invention, a D/A conversion circuit in which a gradation voltage corresponding to an inputted n-bit (n is a natural number not less than 2) digital signal is supplied to an output line, characterized in that: the n-bit digital signal is divided into upper x bits and lower y bits (x+y=n; each of x and y is a natural number); two adjacent gradation voltage lines are selected from the ($2^x+1$) gradation voltage lines by the upper x bits of the n-bit digital signal; $2^y$ gradation voltages are formed from gradation voltages of the two selected adjacent gradation voltage lines; and a corresponding gradation voltage in the $2^y$ gradation voltages is supplied to the output line by the lower y bits of the n-bit digital signal. The above object is achieved by this structure.

The D/A conversion circuit may be formed by using thin film transistors over an insulating substrate.

According to still another aspect of the present invention, a D/A conversion circuit in which a gradation voltage corresponding to an inputted n-bit (n is a natural number not less than 2) digital signal is supplied to an output line, characterized in that: the n-bit digital signal is divided into upper x bits and lower y bits (x+y=n; each of x and y is a natural number); a z-th gradation voltage line and a (z+1)-th gradation voltage line ($1 \leq z \leq 2^x$; z is a natural number) are selected from ($2^x+1$) gradation voltage lines by the upper x bits of the n-bit digital signal, voltages supplied to the gradation voltage lines becoming high in a direction from the first gradation voltage line to the ($2^x+1$)-th gradation voltage line; $2^y$ gradation voltage lines are formed from gradation voltages of the selected z-th and (z+1)-th gradation voltage lines; and a corresponding gradation voltage in the $2^y$ gradation voltages is supplied to the output line by the lower y bits of the n-bit digital signal. The above object is achieved by this structure.

The D/A conversion circuit may be formed by using thin film transistors over an insulating substrate.

According to still another aspect of the present invention, a semiconductor device comprises a plurality of TFTs disposed in matrix; and a source signal line side driving circuit and a gate signal line side driving circuit for driving the plurality of TFTs; and is characterized in that the source signal line side driving circuit includes a D/A conversion circuit which supplies a gradation voltage corresponding to an inputted n-bit (n is a natural number not less than 2) digital signal to an output line; the n-bit digital signal is divided into upper x bits and lower y bits (x+y=n; each of x and y is a natural number); two adjacent gradation voltage lines are selected from ($2^x+1$) gradation voltage lines by the upper x bits of the n-bit digital signal; $2^y$ gradation voltages are formed from gradation voltages of the two selected adjacent gradation voltage lines; and a corresponding gradation voltage in the $2^y$ gradation voltages is supplied to the output line by the lower y bits of the n-bit digital signal. The above object is achieved by this structure.

According to still another aspect of the present invention, a semiconductor device comprises a plurality of TFTs disposed in matrix; and a source signal line side driving circuit and a gate signal line side driving circuit for driving the plurality of TFTs; and is characterized in that the source signal line side driving circuit includes a D/A conversion circuit which supplies a gradation voltage corresponding to an inputted n-bit (n is a natural number not less than 2) digital signal to an output line; the n-bit digital signal is divided into upper x bits and lower y bits (x+y=n; each of x and y is a natural number); a z-th gradation voltage line and a (z+1)-th gradation voltage line ($1 \leq z \leq 2^x$; z is a natural number) are selected from the ($2^x+1$) gradation voltage lines by the upper x bits of the n-bit digital signal, voltages supplied to the gradation voltage lines becoming high in a direction from the first gradation voltage line to the ($2^x+1$)-th gradation voltage line; $2^y$ gradation voltages are formed from gradation voltages of the selected z-th and (z+1)-th gradation voltage lines; and a corresponding gradation voltage in the $2^y$ gradation voltages is supplied to the output line by the lower y bits of the n-bit digital signal. The above object is achieved by this structure.

According to still another aspect of the present invention, a semiconductor device comprises a plurality of TFTs; and a source signal line side driving circuit and a gate signal line side driving circuit for driving the plurality of TFTs; and is characterized in that the source signal line side driving circuit includes a D/A conversion circuit which supplies a gradation voltage corresponding to an inputted n-bit (n is a natural number not less than 2) digital signal to an output line; the n-bit digital signal is divided into upper x bits and lower y bits (x+y=n; each of x and y is a natural number); a z-th gradation voltage line and a (z+1)-th gradation voltage line ($1 \leq z \leq 2^x$; z is a natural number) are selected from ($2^x+1$) gradation voltage lines by the upper x bits of the n-bit digital signal, voltages supplied to the gradation voltage lines becoming high in a direction from the first gradation voltage line to the ($2^x+1$)-th gradation voltage line; $2^y$ gradation voltages are formed from gradation voltages of the selected z-th and (z+1)-th gradation voltage lines; and a corresponding gradation voltage in the $2^y$ gradation voltages is supplied to the output line by the lower y bits of the n-bit digital signal. The above object is achieved by this structure.

The plurality of TFTs, the source signal line side driving circuit, and the gate signal line side driving circuit may be integrally formed by using thin film transistors on an insulating substrate.

A black mask (BM) layer of the semiconductor device may be made of an Al film, or a lamination film of Al and Ti.

DETAILED DESCRIPTION OF THE PREFERRED EMBODIMENTS

The details of a D/A conversion circuit of the present invention will be described with reference to the embodiments below. However, D/A conversion circuits shown in the following embodiments are merely some examples of the present invention, and the D/A conversion circuit of the present invention is not limited to those.

A D/A conversion circuit of the present invention is a resistance voltage dividing type D/A conversion circuit which is capable of converting a n-bit ($n \geq 2$; n is a natural number) digital signal into an analog signal. The D/A conversion circuit of the present invention selects one of $2^n$ voltage lines according to an n-bit digital signal supplied from a digital decoder, and supplies the voltage to a specific signal line.

A circuit including n N-channel TFTs connected in series to each other is connected in series to a circuit including n P-channel TFTs connected in series to each other, and a circuit including the foregoing circuits connected in series to each other is connected in parallel to each of all the voltage lines. Address lines (or lines for supplying inversion signals) from a digital decoder are connected to gate electrodes of the TFTs making up the respective circuits. Switching of the respective TFTs is controlled by a digital signal supplied to the address lines. A connection portion between the circuit including the n N-channel TFTs connected in series to each other and the circuit including the n P-channel TFTs connected in series to each other is connected to a source signal line.

The D/A conversion circuit of the present invention will be described in more detail with reference to the following embodiments. However, the D/A conversion circuit of the present invention is not limited to the following embodiments.

[Embodiment 1]

In this embodiment, an example of a D/A conversion circuit of the present invention will be described. In this embodiment, although description will be made by using a 2-bit D/A conversion circuit as an example, the present invention is not limited to this, but a D/A conversion circuit which processes a signal of more than 2 bits can be realized.

In this embodiment, description will be made to a D/A conversion circuit included in a driving circuit of a liquid crystal display device with the number of pixels of 1920×1080 in horizontal and vertical as an example. The driving circuit of the liquid crystal display device described in this embodiment includes one D/A conversion circuit per source signal line. That is, the driving circuit of the liquid crystal display device explained in this embodiment includes 1920 D/A conversion circuits.

Figure 1:
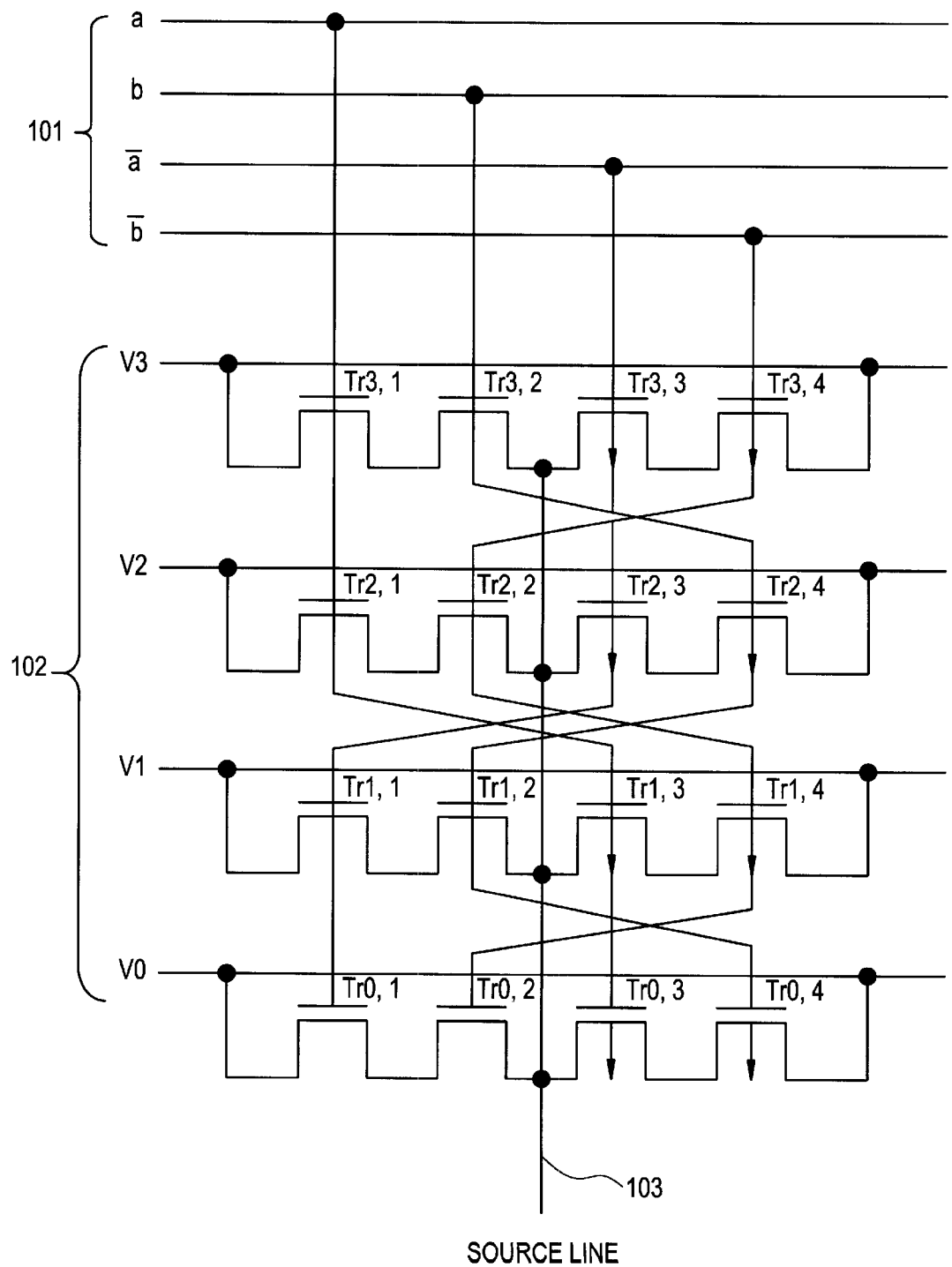
FIG. 1 is a D/A conversion circuit according to embodiment 1 of the present invention.

FIG. 1 shows one D/A conversion circuit of this embodiment. A digital signal from a latch circuit or the like is supplied to signal lines 101 (a, b, inversion a, and inversion b).

As shown in FIG. 1, the D/A conversion circuit of this embodiment includes 8 N-channel TFTs (Tr3.1, Tr3.2, Tr2.1, Tr2.2, Tr1.1, Tr1.2, Tr0.1 and Tr0.2) and 8 P-channel TFTs (Tr3.3, Tr3.4, Tr2.3, Tr2.4, Tr1.3, Tr1.4, Tr0.3, and Tr0.4), and four gradation voltage lines 102 (V0 to V3). A voltage applied between the gradation voltage lines V3 to V0 is resistance-divided so that a desired voltage is applied to each of the four gradation voltage lines V3 to V0. The highest voltage supplied to an output line is applied to the gradation voltage line V3, and the lowest voltage is applied to the gradation voltage line V0.

Voltages can be independently applied to the four gradation voltage lines V3 to V0. However, also in this case, it is necessary to design such that the highest voltage supplied to the output line is applied to the gradation voltage line V3, and the lowest voltage is applied to the gradation voltage line V0.

Attention will be paid to the gradation voltage line V3. Such a structure is adopted that a circuit including two N-channel TFTs (Tr3.1 and Tr3.2) connected in series to each other and a circuit including two P-channel TFTs (Tr3.3 and Tr3.4) connected in series to each other are connected to each other, and both ends of a circuit including the two circuits connected to each other are connected to the gradation voltage line V3. The signal lines a, b, inversion a, and inversion b from a latch circuit or the like are connected to gate electrodes of the TFTs Tr3.1, Tr3.2, Tr3.3, and Tr3.4, respectively. Switching of the TFTs Tr3.1, Tr3.2, Tr3.3, and Tr3.4 is controlled by a digital signal supplied to these signal lines a, b, inversion a, and inversion b. When all these TFTs are turned ON, a voltage supplied to the gradation voltage line V3 is supplied to an output line 103 connected to a source signal line.

Next, attention will be paid to the gradation voltage line V2. Such a structure is adopted that a circuit including two N-channel TFTs (Tr2.1 and Tr2.2) connected in series to each other is connected to a circuit including two P-channel TFTs (Tr2.3 and Tr2.4) connected in series to each other, and both ends of a circuit including the two circuits connected to each other are connected to the gradation voltage line V2. The signal lines a, b, inversion a, and inversion b from the latch circuit or the like are connected to gate electrodes of the TFTs Tr2.1, Tr2.4, Tr2.3, and Tr2.2, respectively. Switching of the TFTs Tr2.1, Tr2.4, Tr2.3, and Tr2.2 is controlled by a digital signal supplied to these signal lines a, b, inversion a, and inversion b. When all these TFTs are turned ON, a voltage supplied to the gradation voltage line V2 is supplied to the output line 103 connected to the source signal line.

Next, attention will be paid to the gradation voltage line V1. Such a structure is adopted that a circuit including two N-channel TFTs (Tr1.1 and Tr1.2) connected in series to each other is connected to a circuit including two P-channel TFTs (Tr1.3 and Tr1.4) connected in series to each other, and both ends of a circuit including the two circuits connected to each other are connected to the gradation voltage line V1. The signal lines a, b, inversion a, and inversion b from the latch circuit or the like are connected to gate electrodes of the TFTs Tr1.3, Tr1.2, Tr1.1, and Tr1.4, respectively. Switching of the TFTs Tr1.3, Tr1.2, Tr1.1, and Tr1.4 is controlled by a digital signal supplied to these signal lines a, b, inversion a, and inversion b. When all these TFTs are turned ON, a voltage supplied to the gradation voltage line V1 is supplied to the output line 103 connected to the source signal line.

Next, attention will be paid to the gradation voltage line V0. Such a structure is adopted that a circuit including two N-channel TFTs (Tr0.1 and Tr0.2) connected in series to each other is connected to a circuit including two P-channel TFTs (Tr0.3 and Tr0.4) connected in series to each other, and both ends of a circuit including the two circuits connected to each other are connected to the gradation voltage line V0. The signal lines a, b, inversion a, and inversion b from the latch circuit or the like are connected to gate electrodes of the TFTs Tr0.3, Tr0.4, Tr0.1, and Tr0.2, respectively. Switching of the TFTs Tr0.3, Tr0.4, Tr0.1, and Tr0.2 is controlled by a digital signal supplied to these signal lines a, b, inversion a, and inversion b. When all these TFTs are turned ON, a voltage supplied to the gradation voltage line V0 is supplied to the output line 103 connected to the source signal line.

The following Table 1 shows gradation voltage lines selected by digital signals supplied to the signal lines a, b, inversion a, and inversion b.

TABLE 1

|    | a  | b  | Inversion a | Inversion b |
|----|----|----|-------------|-------------|
| V3 | Hi | Hi | Lo          | Lo          |
| V2 | Hi | Lo | Lo          | Hi          |
| V1 | Lo | Hi | Hi          | Lo          |
| V0 | Lo | Lo | Hi          | Hi          |

Table 1 shows that one gradation voltage line is selected by a digital signal supplied to the signal lines a, b, inversion a, and inversion b, and a voltage is supplied to a source signal line.

In this embodiment, the foregoing D/A conversion circuit is provided for one source signal line in a one-to-one correspondence. However, it is also possible to reduce the number of D/A conversion circuits by providing a selecting circuit at a portion where a digital signal is supplied from the latch circuit to the D/A conversion circuit and/or a portion where a voltage is supplied from the D/A conversion circuit to the source signal line. A concrete method is disclosed in Japanese Patent Application No. Hei. 9-286098 in detail.

In this embodiment, the description has been made to one of a plurality of D/A conversion circuits installed in the driving circuit. Actually, a plurality of D/A conversion circuits exist (in this embodiment, 1920 circuits), and all the D/A conversion circuits commonly include the gradation voltage lines.

The D/A conversion circuit of this embodiment can be integrally formed on an insulating substrate, such a quartz substrate or a glass substrate, together with other driving circuits and other peripheral devices of the liquid crystal display device. The two P-channel TFTs and the two N-channel TFTs connected to each of the gradation voltage lines of the D/A conversion circuit of this embodiment may be formed on the same semiconductor layer. Alternatively, two independent P-channel TFTs and two independent N-channel TFTs may be connected by metal wiring lines or the like through contacts. However, the former case is preferable since the area of the D/A conversion circuit can be made small.

[Embodiment 2]

In this embodiment, another example of a D/A conversion circuit of the present invention will be described. In this embodiment, although description will be made to a 2-bit D/A conversion circuit as an example, the present invention is not limited to this but a D/A conversion circuit which processes a signal of more than 2 bits can be realized.

Also in this embodiment, description will be made to a D/A conversion circuit installed in a driving circuit of a liquid crystal display device wit h the number of pixels of 1920×1080 in horizontal and vertical as an example.

Figure 2:
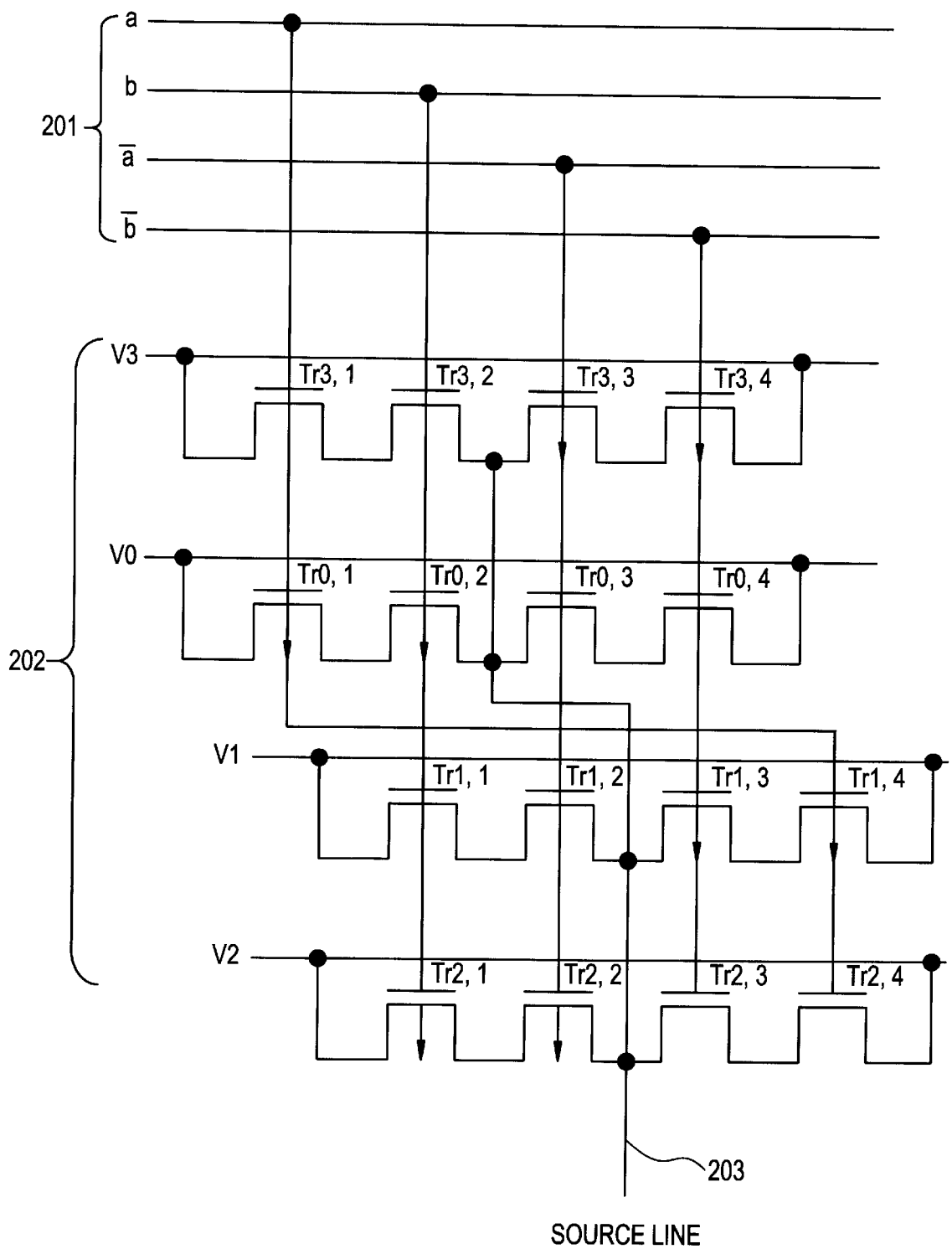
FIG. 2 is a D/A conversion circuit according to embodiment 2 of the present invention.

FIG. 2 shows one D/A conversion circuit of this embodiment. A digital signal from a latch circuit or the like is supplied to signal lines 201 (a, b, inversion a, and inversion b).

As shown in FIG. 2, the D/A conversion circuit of this embodiment includes 8 N-channel TFTs (Tr3.1, Tr3.2, Tr2.3, Tr2.4, Tr1.1, Tr1.2, Tr0.3 and Tr0.4) and 8 P-channel TFTs (Tr3.3, Tr3.4, Tr2.1, Tr2.2, Tr1.3, Tr1.4, Tr0.1, and Tr0.2), and four gradation voltage lines 202 (V0 to V3).

It is seen that the positions of the circuits for selecting third and fourth gradation voltage lines from the above are shifted right. Further, although the four gradation voltage lines V3 to V0 are disposed in the order of V3, V0, V1, and V2, the arrangement of the circuit made up of the N-channel TFTs and the circuit made up of the P-channel TFTs is reversed at every one stage of the gradation voltage lines.

A desired voltage is supplied to each of the four gradation voltage lines V3 to V0 by resistance-division of a voltage applied between the gradation voltage lines V3 to V0. The highest voltage supplied to the source signal line is applied to the gradation voltage line V3, and the lowest voltage is applied to the gradation voltage line V0.

That is, voltages supplied to the gradation voltage lines V0 to V3 become high in a direction from the gradation voltage line V0 to the gradation voltage line V3. Here, when the lowest gradation voltage line V0 is made a first gradation voltage line, the gradation voltage line V1 is made a second gradation voltage line, the gradation voltage line V2 is made a third gradation voltage line, and the gradation voltage line V3 is made a fourth gradation voltage line, the fourth gradation voltage line V3 and the first gradation voltage line V0 are disposed adjacently (in a pair), and the arrangement of a circuit including the two P-channel TFTs and a circuit including the two N-channel TFTs connected to each of the gradation voltage lines is reversed between the adjacent gradation voltage lines. Also, it is seen that the second gradation voltage line V1 and the third D/A conversion circuit V2 are disposed adjacently (in a pair), and the arrangement of a circuit including the two P-channel TFTs and a circuit including the two N-channel TFTs connected to each of the gradation voltage lines is reversed between the adjacent gradation voltage lines.

Although the order of arrangement of these gradation voltage lines appears to be irregular at a glance, they obey some rule. That is, when attention is paid to the number of each of two adjacent gradation voltage lines, the addition of the numbers of both gradation voltage lines becomes 5, such as the fourth and the first gradation voltage lines (4+1=5), or the second and the third gradation voltage lines (2+3=5). The number of 5 means $2^2+1$ (the number of 2 suggests a 2-bit D/A conversion circuit).

Here, an n-bit D/A conversion circuit will be considered. The number of gradation voltage lines is $2^n$, and the gradation voltage lines include a first gradation voltage line to which the lowest voltage is supplied, and a $2^n$-th gradation voltage line to which the highest voltage is supplied. In this case, two adjacent (making a pair) gradation voltage lines are a x-th ($1 \leq x \leq 2^n$; x is an integer) gradation voltage line and ($2^n+1-x$)-th gradation voltage line. In these adjacent (making a pair) two gradation voltage lines, the arrangement of a circuit made up of the n P-channel TFTs and a circuit made up of the n N-channel TFTs is reversed between the adjacent gradation voltage lines.

A desired voltage may be independently supplied to the four gradation voltage lines V3 to V0. However, also in this case, it is necessary to make such a structure that the highest voltage supplied to the source signal line is supplied to the gradation voltage line V3, and the lowest voltage is supplied to the gradation voltage line V0.

The details of the circuit structure of the D/A conversion circuit of this embodiment will be described below.

Attention will be paid to the gradation voltage line V3. Such a structure is adopted that a circuit including two N-channel TFTs (Tr3.1 and Tr3.2) connected in series to each other is connected to a circuit including two P-channel TFTs (Tr3.3 and Tr3.4) connected in series to each other, and both ends of a circuit including the two circuits connected to each other are connected to the gradation voltage line V3. An output line 203 connected to a source signal line is connected to a connection portion between the two circuits (connection portion between the TFTs Tr3.2 and Tr3.3). The signal lines a, b, inversion a, and inversion b from a latch circuit or the like are connected to gate electrodes of the TFTs Tr3.1, Tr3.2, Tr3.3, and Tr3.4, respectively. Switching of the TFTs Tr3.1, Tr3.2, Tr3.3, and Tr3.4 is controlled by a digital signal supplied to these signal lines a, b, inversion a, and inversion b. When all these TFTs are turned ON, a voltage supplied to the gradation voltage line V3 is supplied to the output line 203.

Next, attention will be paid to the gradation voltage line V0. Such a structure is adopted that a circuit including two P-channel TFTs (Tr0.1 and Tr0.2) connected in series to each other is connected to a circuit including two N-channel TFTs (Tr0.3 and Tr0.4) connected in series to each other, and both ends of a circuit including the two circuits connected to each other are connected to the gradation voltage line V0. The output line 203 is connected to a connection portion between the two circuits (connection portion between the TFTs Tr0.2 and Tr0.3). The signal lines a, b, inversion a, and inversion b from the latch circuit or the like are connected to gate electrodes of the TFTs Tr0.1, Tr0.2, Tr0.3, and Tr0.4, respectively. Switching of the TFTs Tr0.1, Tr0.2, Tr0.3, and Tr0.4 is controlled by a digital signal supplied to these signal lines a, b, inversion a, and inversion b. When all these TFTs are turned ON, a voltage supplied to the gradation voltage line V0 is supplied to the output line 203.

Next, attention will be paid to the gradation voltage line V1. Such a structure is adopted that a circuit including two N-channel TFTs (Tr1.1 and Tr1.2) connected in series to each other is connected to a circuit including two P-channel TFTs (Tr1.3 and Tr1.4) connected in series to each other, and both ends of a circuit including the two circuits connected to each other are connected to the gradation voltage line V1. The output line 203 is connected to a connection portion between the two circuits (connection portion between the TFTs Tr1.2 and Tr1.3). The signal lines a, b, inversion a, and inversion b from the latch circuit or the like are connected to gate electrodes of the TFTs Tr1.4, Tr1.1, Tr1.2, and Tr1.3, respectively. Switching of the TFTs Tr1.4, Tr1.1, Tr1.2, and Tr1.3 is controlled by a digital signal supplied to these signal lines a, b, inversion a, and inversion b. When all these TFTs are turned ON, a voltage supplied to the gradation voltage line V1 is supplied to the output line 203.

Next, attention will be paid to the gradation voltage line V2. Such a structure is adopted that a circuit including two P-channel TFTs (Tr2.1 and Tr2.2) connected in series to each other is connected to a circuit including two N-channel TFTs (Tr2.3 and Tr2.4) connected in series to each other, and both ends of a circuit including the two circuits connected to each other are connected to the gradation voltage line V2. The output line 203 is connected to a connection portion between the two circuits (connection portion between the TFTs Tr2.2 and Tr2.3). The signal lines a, b, inversion a, and inversion b from the latch circuit or the like are connected to gate electrodes of the TFTs Tr2.4, Tr2.1, Tr2.2, and Tr2.3, respectively. Switching of the TFTs Tr2.4, Tr2.1, Tr2.2, and Tr2.3 is controlled by a digital signal supplied to these signal lines a, b, inversion a, and inversion b. When all these TFTs are turned ON, a voltage supplied to the gradation voltage line V2 is supplied to the output line 203.

The following Table 2 shows gradation voltage lines selected by digital signals supplied to the signal lines a, b, inversion a, and inversion b.

TABLE 2

|    | a  | b  | inversion a | inversion b |
|----|----|----|-------------|-------------|
| V3 | Hi | Hi | Lo          | Lo          |
| V2 | Hi | Lo | Lo          | Hi          |
| V1 | Lo | Hi | Hi          | Lo          |
| V0 | Lo | Lo | Hi          | Hi          |

Table 2 shows that one gradation voltage line is selected by a digital signal supplied to the signal lines a, b, inversion a, and inversion b, and a voltage is supplied to the source signal line.

If the foregoing circuit structure is adopted, when the signal lines a, b, inversion a, and inversion b are wired from the gradation voltage line V0 to the gradation voltage line V1, crossings of wiring lines can be eliminated other than crossings of only one wiring line with other wiring lines.

Figure 3:
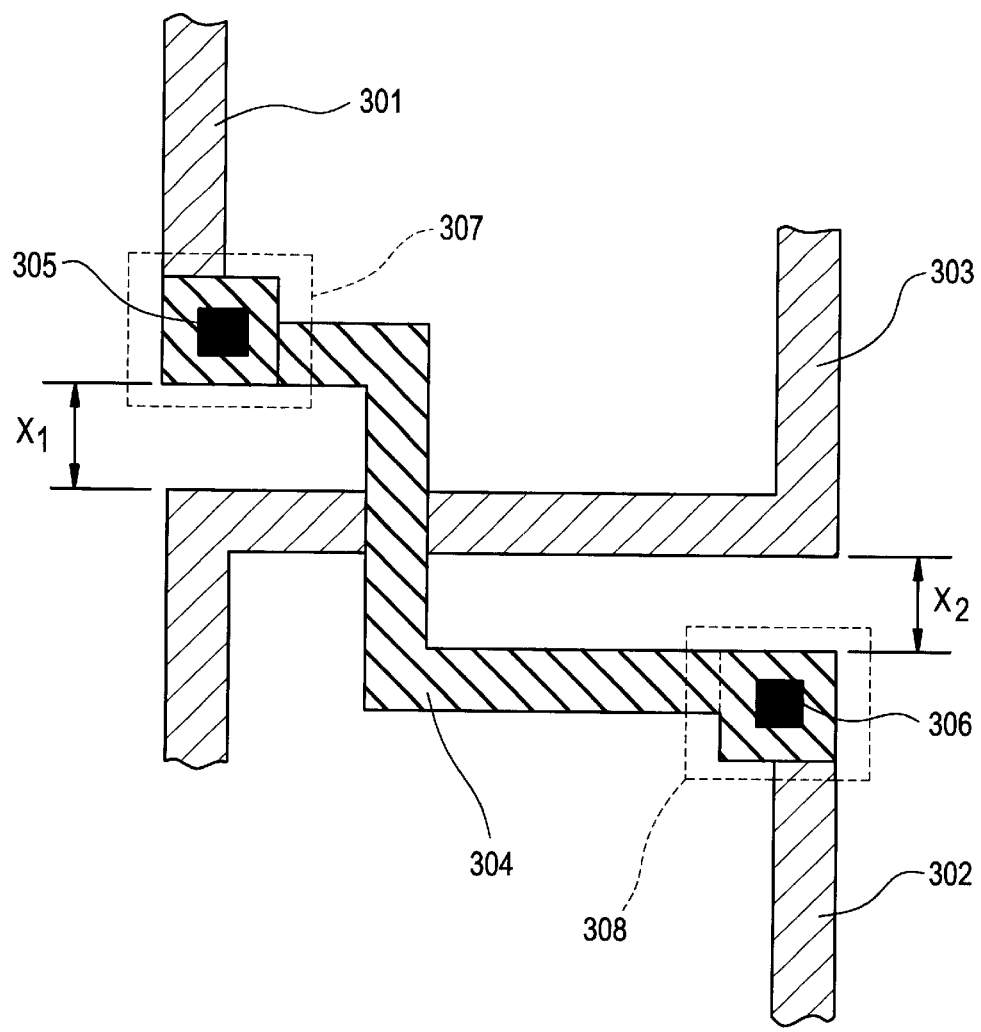
FIG. 3 is a view showing crossings of two or more wiring lines.

In FIG. 3, reference numerals 301, 302, and 303 denote first wiring lines (gate electrode wiring lines), and 304 denotes a second wiring line. Reference numerals 305 and 306 denote portions where the first wiring lines are in contact with the second wiring line.

As shown in FIG. 3, in general, in the case where wiring lines cross, the crossing wiring line is disposed through an insulating film, a contact hole is bored in only a portion where contact is made, and the contact is made at that portion. In this case, in view of a shift of the contact hole, an area of a portion 307 of the wiring line 301 must be made large. Moreover, in order to prevent a short circuit between the wiring line 301 and the wiring line 303, or a short circuit between the wiring line 302 and the wiring line 303, margins as indicated by $X_1$ and $X_2$ must be sufficiently taken. Thus, as the number of crossings of the wiring lines becomes large, the total area of the circuit becomes large.

However, in the D/A conversion circuit of this embodiment, since the number of crossing wiring lines is small, the area of the circuit can be greatly decreased. Further, lowering of a yield due to inferior contact and the like can also be prevented.

In this embodiment, the foregoing D/A conversion circuit is provided for one source signal line in a one-to-one correspondence. However, it is also possible to reduce the number of D/A conversion circuits by providing a selecting circuit at a portion where a digital signal is supplied from the latch circuit to the D/A conversion circuit and/or a portion where a voltage is supplied from the D/A conversion circuit to the source signal line. A concrete method is disclosed in Japanese Patent Application No. Hei. 9-286098 in detail.

The D/A conversion circuit of this embodiment can be integrally formed on an insulating substrate, such a quartz substrate or a glass substrate, together with other driving circuits and other peripheral devices of the liquid crystal display device. The two P-channel TFTs and the two N-channel TFTs connected to each of the gradation voltage lines of the D/A conversion circuit of this embodiment may be formed on the same semiconductor layer. Alternatively, two independent P-channel TFTs and two independent N-channel TFTs may be connected by metal wiring lines or the like through contacts. However, the former case is preferable since the area of the D/A conversion circuit can be made small.

[Embodiment 3]

In this embodiment, in the D/A conversion circuit of the present invention described in the embodiment 2, a specific case where a 4-bit signal is processed will be described.

Figure 4:
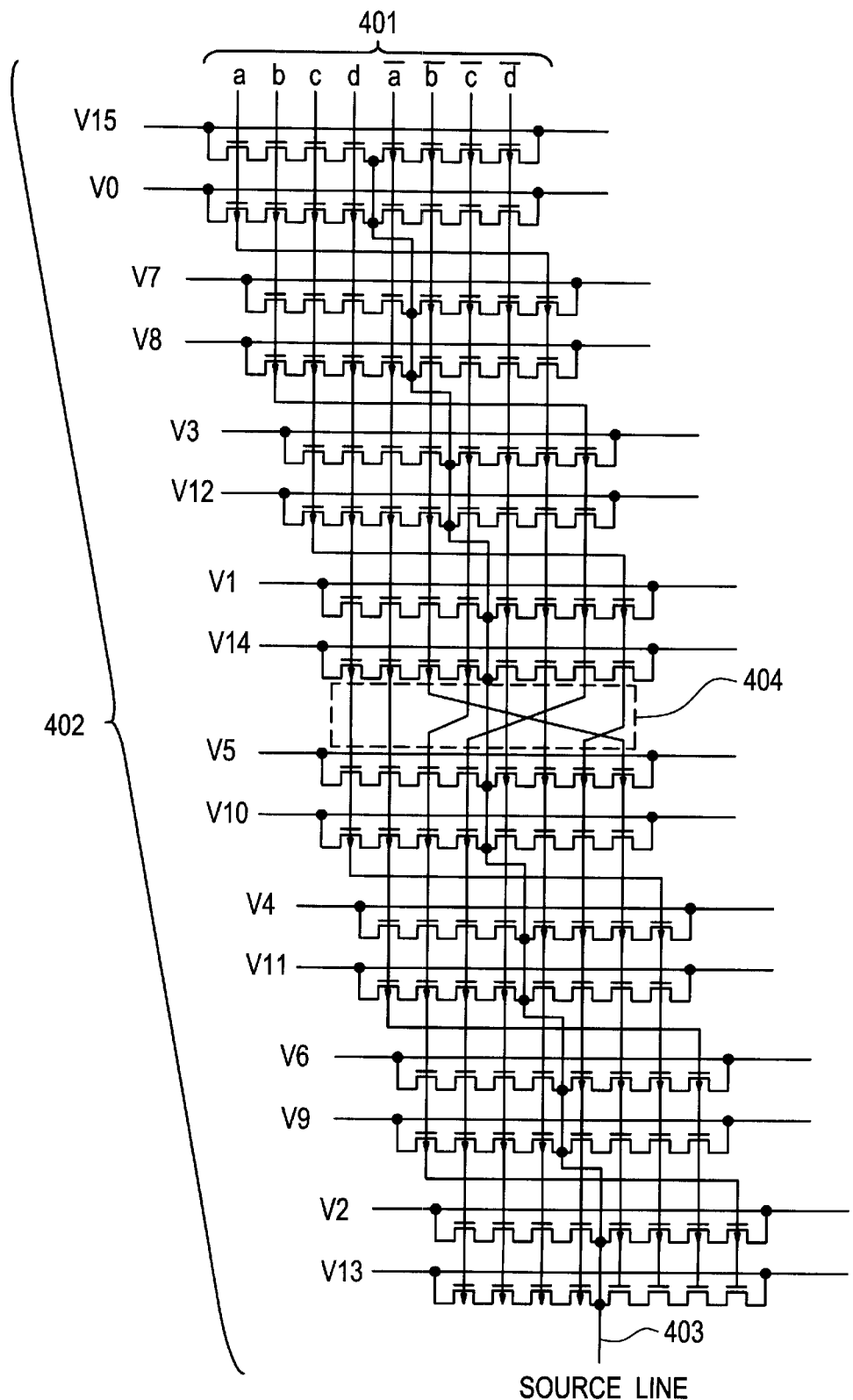
FIG. 4 is a D/A conversion circuit according to embodiment 3 of the present invention.

FIG. 4 shows a D/A conversion circuit of this embodiment. Also in this embodiment, only one of a plurality of D/A conversion circuits of a driving circuit used in a liquid crystal display device is quoted as an example and its description will be made.

As shown in FIG. 4, the D/A conversion circuit of this embodiment includes 64 N-channel TFTs, 64 P-channel TFTs, and 16 gradation voltage lines 402 (V0 to V15). A digital signal from a latch circuit or the like is supplied to signal lines 401 (a, b, c, d, inversion a, inversion b, inversion c, and inversion d).

A circuit in which a circuit including four P-channel TFTs connected in series to each other is connected in series to a circuit including four N-channel TFTs connected in series to each other, is connected in parallel to each of all gradation voltage lines 402 (V0 to V15). A connection portion of the foregoing two circuits is connected to an output line 403 connected to a source signal line.

Also in the D/A conversion circuit of this embodiment, one of the gradation voltage lines V0 to V15 is selected by a digital signal supplied to the signal lines a, b, c, d, inversion a, inversion b, inversion c, and inversion d, and the selected gradation voltage is supplied to the output line 403.

The following Table 3 shows gradation voltage lines selected by digital signals inputted to the signal lines a, b, c, d, inversion a, inversion b, inversion c, and inversion d.

TABLE 3

|     | a  | b  | c  | d  | inversion a | inversion b | inversion c | inversion d |
|-----|----|----|----|----|----|----|----|----|
| V15 | Hi | Hi | Hi | Hi | Lo | Lo | Lo | Lo |
| V14 | Hi | Hi | Hi | Lo | Lo | Lo | Lo | Hi |
| V13 | Hi | Hi | Lo | Hi | Lo | Lo | Hi | Lo |
| V12 | Hi | Hi | Lo | Lo | Lo | Lo | Hi | Hi |
| V11 | Hi | Lo | Hi | Hi | Lo | Hi | Lo | Lo |
| V10 | Hi | Lo | Hi | Lo | Lo | Hi | Lo | Hi |
| V9  | Hi | Lo | Lo | Hi | Lo | Hi | Hi | Lo |
| V8  | Hi | Lo | Lo | Lo | Lo | Hi | Hi | Hi |
| V7  | Lo | Hi | Hi | Hi | Hi | Lo | Lo | Lo |
| V6  | Lo | Hi | Hi | Lo | Hi | Lo | Lo | Hi |
| V5  | Lo | Hi | Lo | Hi | Hi | Lo | Hi | Lo |
| V4  | Lo | Hi | Lo | Lo | Hi | Lo | Hi | Hi |
| V3  | Lo | Lo | Hi | Hi | Hi | Hi | Lo | Lo |
| V2  | Lo | Lo | Hi | Lo | Hi | Hi | Lo | Hi |
| V1  | Lo | Lo | Lo | Hi | Hi | Hi | Hi | Lo |
| V0  | Lo | Lo | Lo | Lo | Hi | Hi | Hi | Hi |

Table 3 shows that one gradation voltage line is selected by a digital signal inputted to the signal lines a, b, c, d, inversion a, inversion b, inversion c, and inversion d, and a voltage is supplied to the source signal line.

Here, that the gradation voltage lines V0 to V15 are arranged in accordance with some fixed rule described in the embodiment 2 will be described.

For example, the fourth gradation voltage line V3 will be quoted as an example. Since the D/A conversion circuit of this embodiment is a 4-bit D/A conversion circuit, the gradation voltage line adjacent (paired) to the fourth gradation voltage line is $2^4+1-4=13$, that is, the thirteenth gradation voltage line. The thirteenth gradation voltage line is the gradation voltage line V12, and as shown in FIG. 4, it is seen that the D/A conversion circuit of this embodiment is also disposed in accordance with the rule described in the embodiment 2.

It is also seen that the arrangement of a circuit including four P-channel TFTs and a circuit including four N-channel TFTs connected to each of the fourth gradation voltage line V3 and the thirteenth gradation voltage line V12 is reversed between the fourth gradation voltage line and the thirteenth gradation voltage line.

In the D/A conversion circuit of this embodiment, the number of crossings of the wiring lines at a portion denoted by 404 is larger than that at other portions. In the case where the present invention is adapted to the 4-bit D/A conversion circuit, such a portion including many crossing wiring lines becomes necessary.

Figure 5A:
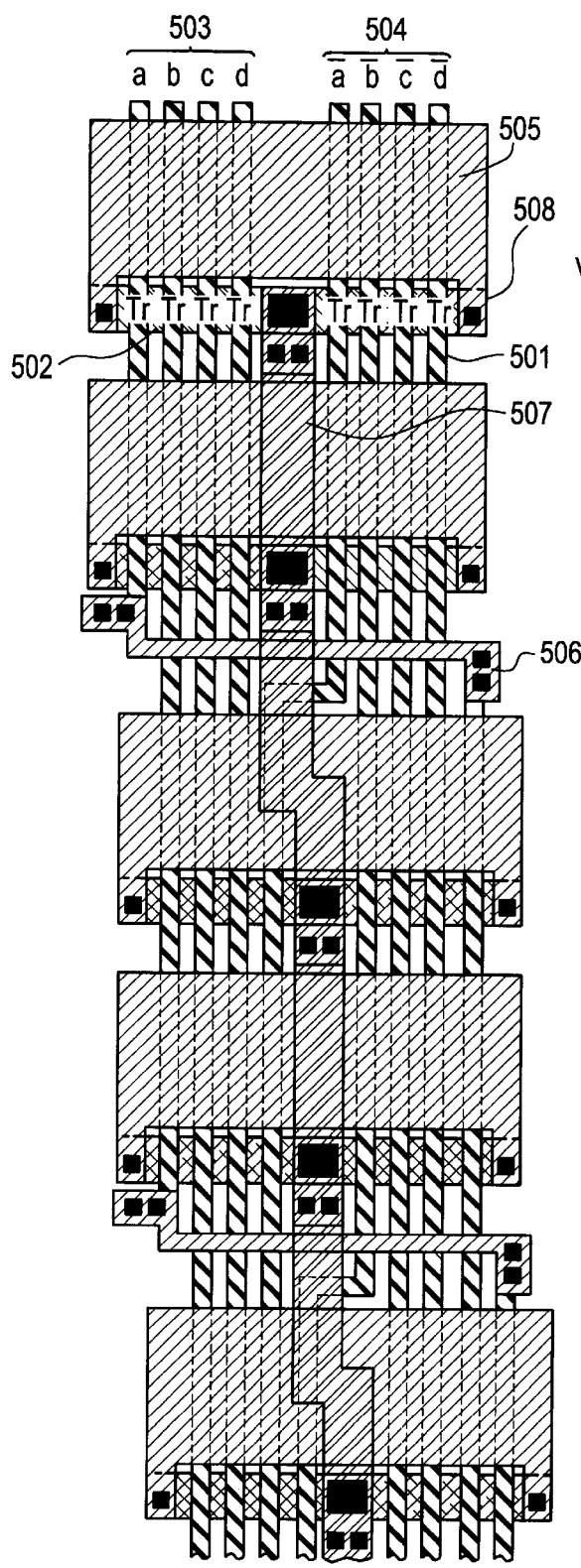
FIG. 5A is a circuit pattern diagram of a D/A conversion circuit according to embodiment 3 of the present invention and FIG. 5B is an equivalent circuit diagram thereof.
Figure 5B:
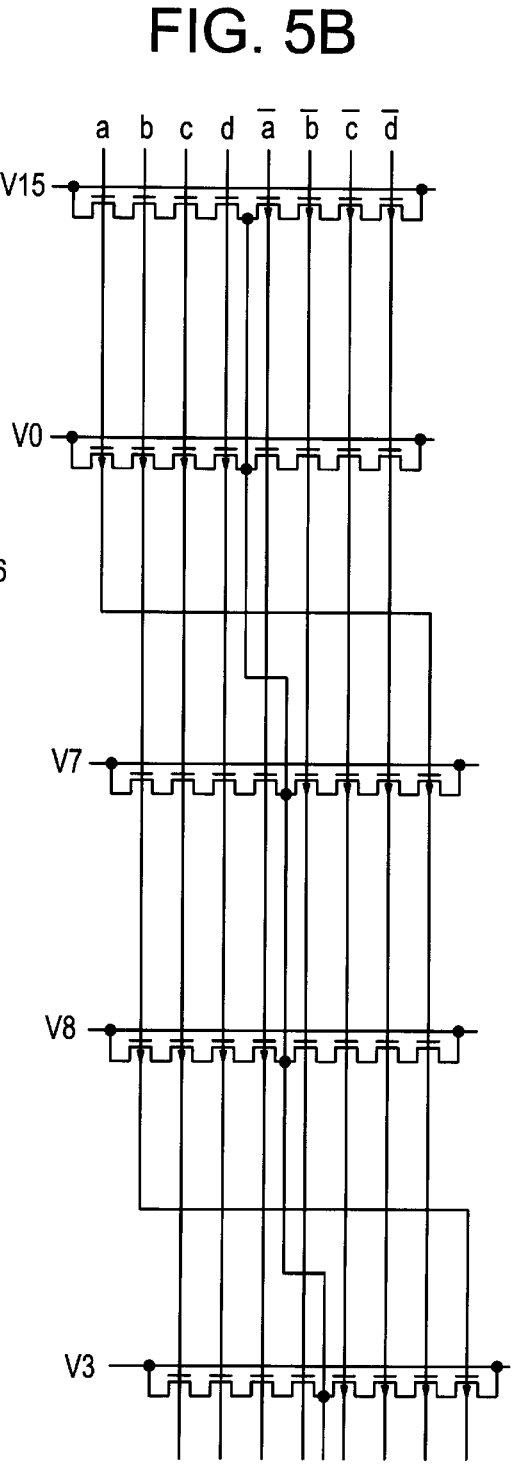

FIG. 5A shows a circuit pattern of a part of the D/A conversion circuit of this embodiment. FIG. 5B shows a part of the D/A conversion circuit of this embodiment, and shows an equivalent circuit of the circuit pattern of FIG. 5A. In FIG. 5A, reference numerals 501 and 502 denote semiconductor active layers. Reference numerals 503 and 504 denote gate electrode wiring lines, and Al (aluminum) is used in this embodiment. Reference numerals 505 and 506 denote second wiring lines, and Al is used in this embodiment. Reference numeral 507 denotes a third wiring line. Reference numeral 508 denotes a portion where the second wiring line is connected to the semiconductor active layer. In the drawing, the wiring lines having the same pattern are positioned at the same wiring layer. Blackened portions indicate portions where the semiconductor active layer is connected to the wiring line or the wiring lines in different layers are connected to each other. Portion indicated by broken lines in the drawing indicate lower wiring lines concealed by upper wiring lines.

This third wiring line may be formed at the same time as formation of a BM (black mask) layer at the active matrix substrate side of the liquid crystal display device. In that case, it is desirable that the line width or the film thickness is changed according to a used material (Al, Ti, etc.). For example, in the case where Ti is used for the material of the third wiring line, since the resistivity of Ti is high as compared with Al, it is desirable that the line width is made thick or the film thickness is made thick. A lamination layer structure of two or more kinds of metals, for example, Al and Ti, may be used for the third wiring line.

In this embodiment, the foregoing D/A conversion circuit is provided for one source signal line in a one-to-one correspondence. However, it is also possible to reduce the number of D/A conversion cirtuits by providing a selecting circuit at a portion where a digital signal is supplied from the latch circuit to the D/A conversion circuit and/or a portion where a voltage is supplied from the D/A conversion circuit to the source signal line. A concrete method is disclosed in Japanese Patent Application No. Hei. 9-286098 in detail.

The D/A conversion circuit of this embodiment can be integrally formed on an insulating substrate, such a quartz substrate or a glass substrate, together with other driving circuits and other peripheral devices of the liquid crystal display device. Although the four P-channel TFTs and the four N-channel TFTs connected to each of the gradation voltage lines of the D/A conversion circuit of this embodiment are formed on the same semiconductor layer, four independent P-channel TFTs and four independent N-channel TFTs may be connected by metal wiring lines or the like through contacts. However, the former case is preferable since the area of the D/A conversion circuit can be made small.

[Embodiment 4]

In this embodiment, another example of the 4-bit D/A conversion circuit described in the embodiment 3 will be described.

Figure 6:
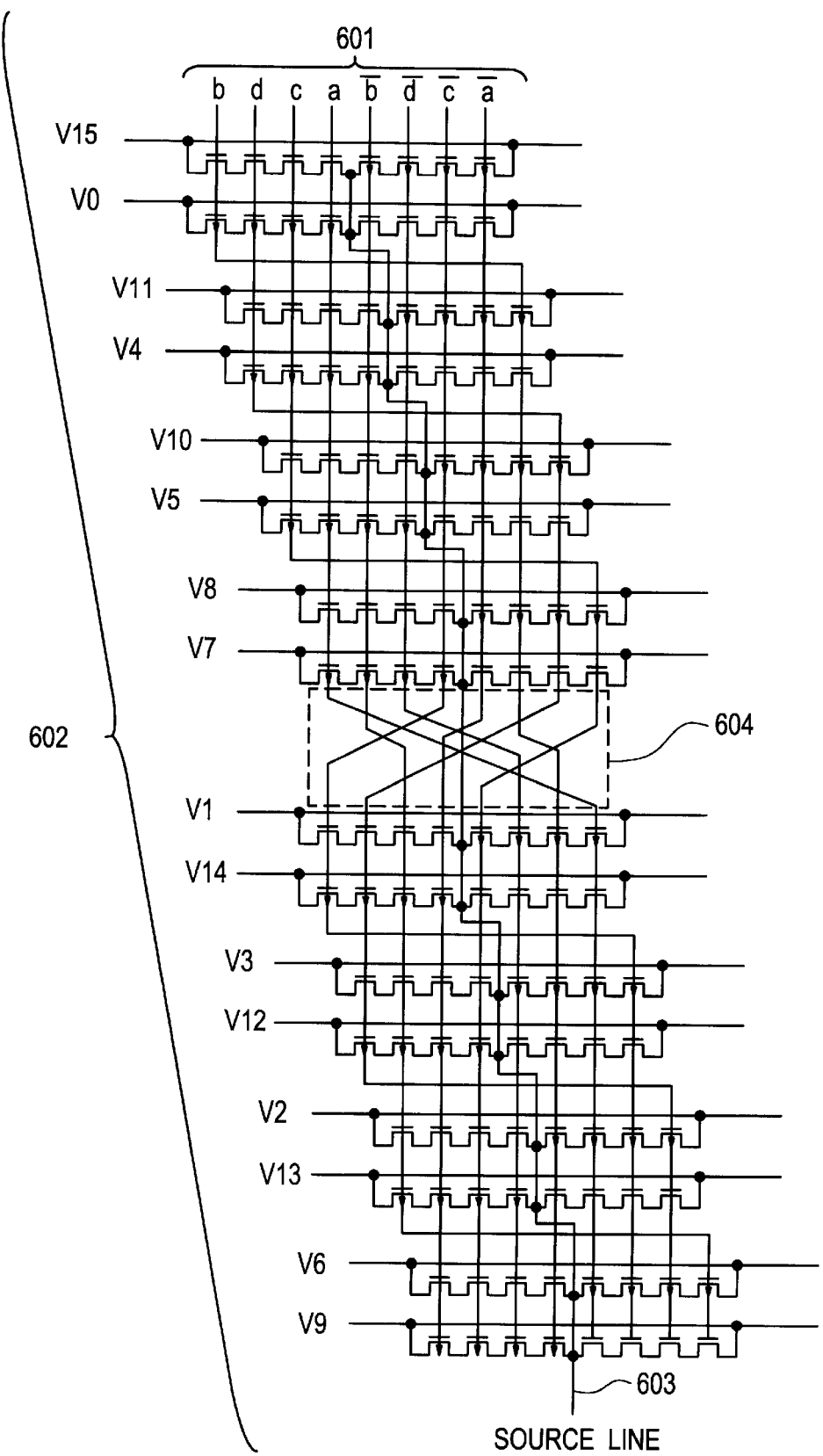
FIG. 6 is a D/A conversion circuit according to embodiment 4 of the present invention.

FIG. 6 shows a 4-bit D/A conversion circuit of this embodiment. As compared with the D/A conversion circuit of the foregoing embodiment 3, the D/A conversion circuit of this embodiment is different in the order of signal lines 601 (a, b, c, d, inversion a, inversion b, inversion c, and inversion d) for supplying a digital signal from a latch circuit or the like.

It is seen that the arrangement of the gradation voltage lines in the D/A conversion circuit of this embodiment, and the arrangement of a circuit including four P-channel TFTs and a circuit including four N-channel TFTs also obey the rule described in the embodiment 2.

The following Table 4 shows gradation voltage lines selected by digital signals inputted to the signal lines a, b, c, d, inversion a, inversion b, inversion c, and inversion d.

TABLE 4

|     | a  | b  | c  | d  | inversion a | inversion b | inversion c | inversion d |
|-----|----|----|----|----|-------------|-------------|-------------|-------------|
| V15 | Hi | Hi | Hi | Hi | Lo | Lo | Lo | Lo |
| V14 | Hi | Hi | Hi | Lo | Lo | Lo | Lo | Hi |
| V13 | Hi | Hi | Lo | Hi | Lo | Lo | Hi | Lo |
| V12 | Hi | Hi | Lo | Lo | Lo | Lo | Hi | Hi |
| V11 | Hi | Lo | Hi | Hi | Lo | Hi | Lo | Lo |
| V10 | Hi | Lo | Hi | Lo | Lo | Hi | Lo | Hi |
| V9  | Hi | Lo | Lo | Hi | Lo | Hi | Hi | Lo |
| V8  | Hi | Lo | Lo | Lo | Lo | Hi | Hi | Hi |
| V7  | Lo | Hi | Hi | Hi | Hi | Lo | Lo | Lo |
| V6  | Lo | Hi | Hi | Lo | Hi | Lo | Lo | Hi |
| V5  | Lo | Hi | Lo | Hi | Hi | Lo | Hi | Lo |
| V4  | Lo | Hi | Lo | Lo | Hi | Lo | Hi | Hi |
| V3  | Lo | Lo | Hi | Hi | Hi | Hi | Lo | Lo |
| V2  | Lo | Lo | Hi | Lo | Hi | Hi | Lo | Hi |
| V1  | Lo | Lo | Lo | Hi | Hi | Hi | Hi | Lo |
| V0  | Lo | Lo | Lo | Lo | Hi | Hi | Hi | Hi |

Table 4 shows that one gradation voltage line is selected by a digital signal inputted to the signal lines a, b, c, d, inversion a, inversion b, inversion c, and inversion d, and a voltage is supplied to the source signal line.

In the D/A conversion circuit of this embodiment, the number of crossings of the wiring lines at a portion denoted by 604 is larger than that at other portions. In the case where the present invention is adapted to the 4-bit D/A conversion circuit, such a portion including many crossing wiring lines becomes necessary.

In this embodiment, the foregoing D/A conversion circuit is provided for one source signal line in a one-to-one correspondence. However, it is also possible to reduce the number of D/A conversion circuits by providing a selecting circuit at a portion where a digital signal is supplied from the latch circuit to the D/A conversion circuit and/or a portion where a voltage is supplied from the D/A conversion circuit to the source signal line. A concrete method is disclosed in Japanese Patent Application No. Hei. 9-286098 in detail.

The D/A conversion circuit of this embodiment can be integrally formed on an insulating substrate, such a quartz substrate or a glass substrate, together with other driving circuits and other peripheral devices of the liquid crystal display device. Although the four P-channel TFTs and the four N-channel TFTs connected to each of the gradation voltage lines of the D/A conversion circuit of this embodiment are formed on the same semiconductor layer, four independent. P-channel TFTs and four independent N-channel TFTs may be connected by metal wiring lines or the like through contacts. However, the former case is preferable since the area of the D/A conversion circuit can be made small.

[Embodiment 5]

In the foregoing embodiments, the examples in which the D/A conversion circuit of the present invention is used for a driving circuit of a liquid crystal display device have been described. In this case, as a display method used for the liquid crystal display device, a TN mode using a nematic liquid crystal, a mode using field controlled birefringence, a so-called polymer dispersion mode using a mixed layer of a liquid crystal and a polymer, and the like may also be used. The D/A conversion circuit of the present invention may be used for a driving circuit of a display device including any display medium having optical characteristics which can be changed according to an applied voltage. For example, the D/A conversion circuit may be used for a driving circuit of a display device using an electroluminescence element and the like.

[Embodiment 6]

In this embodiment, an example of a D/A conversion circuit of the present invention will be described. In this embodiment, an active matrix type liquid crystal display device in which the number of pixels is 800×600 in horizontal and vertical is used, and the D/A conversion circuit which is installed in a source signal line side driving circuit of the display device and converts a digital signal into an analog gradation signal (gradation voltage) will be described in detail.

In this embodiment, although description will be made to a D/A conversion circuit, which processes a 4-bit digital signal, as an example, the D/A conversion circuit of the present invention is not limited to this, but a D/A conversion circuit which processes a digital signal of 2 bits or more can be realized.

Figure 7A:
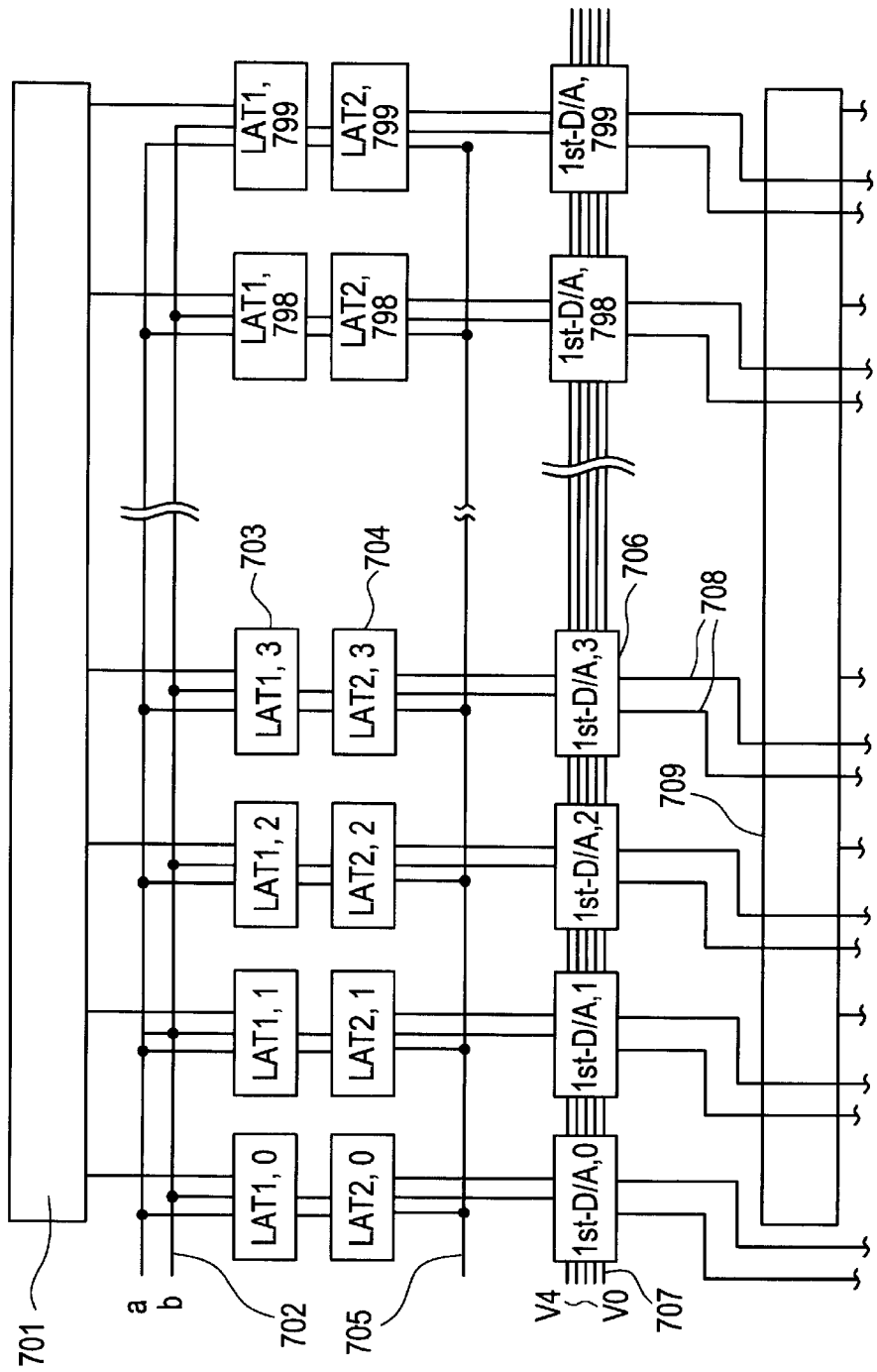
FIG. 7 is a schematic structural view of an active matrix type liquid crystal display device with a D/A conversion circuit according to embodiment 6 of the present invention.
Figure 7B:
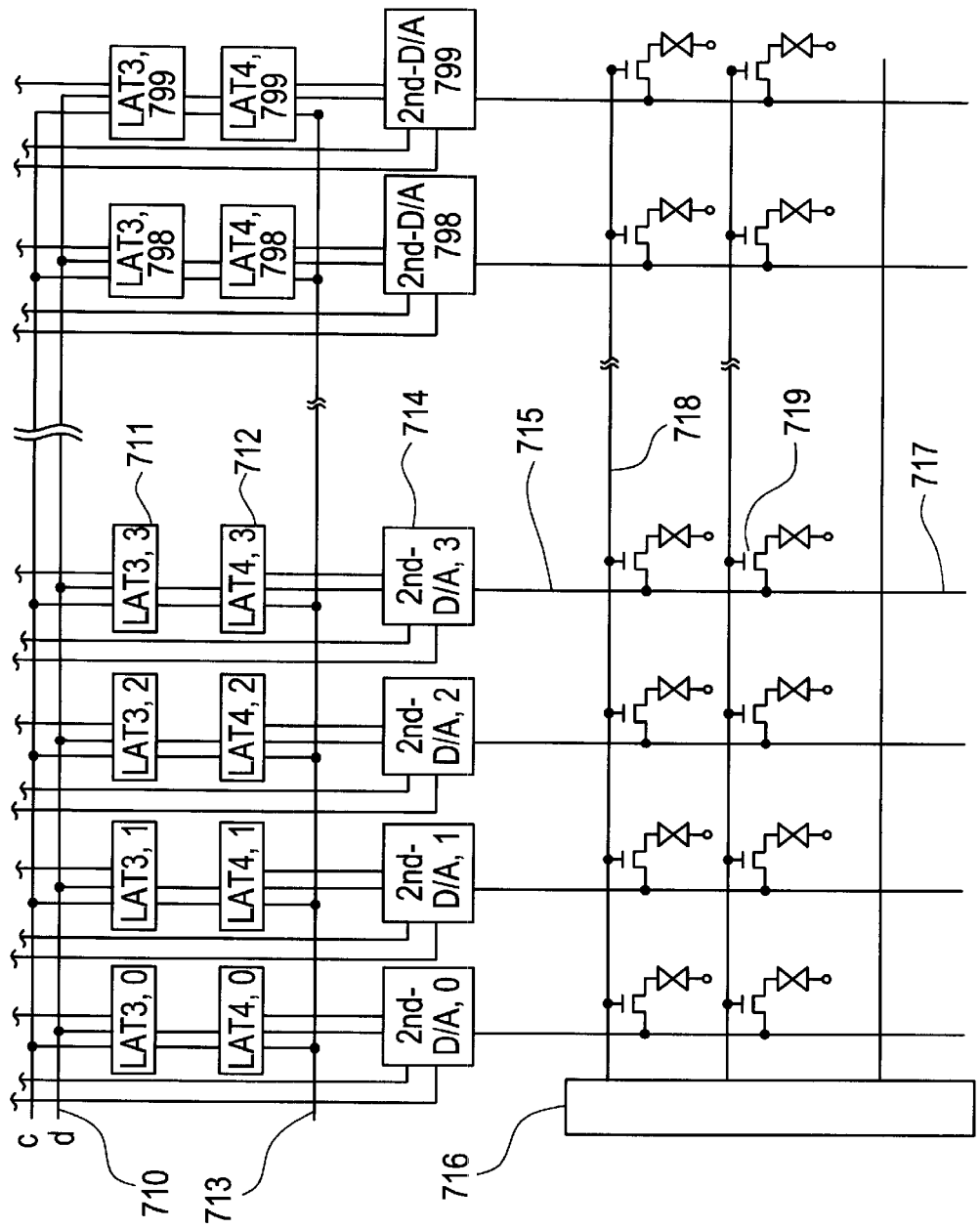

FIG. 7 is a schematic structural view of an active matrix type liquid crystal display device of this embodiment. The active matrix type liquid crystal display device of this embodiment includes a first source signal line side shift register 701, address lines (a, b) of a digital decoder, latch circuits (LAT1.0 to LAT1.799) 703, latch circuit (LAT2.0 to LAT2.799) 704, a latch pulse line 705, first D/A conversion circuits (1st-D/A.0 to 1st-D/A.799), gradation voltage lines (V0 to V4) 707, a first output line 708, a second source signal line side shift register 709, address lines (c, d) 710 of the digital decoder, latch circuits (LAT3.0 to LAT3.799) 711, latch circuits (LAT4.0 to LAT4.799) 712, a latch pulse line 713, second D/A conversion circuits (2nd-D/A.0 to 2nd-D/A.799) 714, a second output line 715, a gate signal line side shift register 716 as a gate signal line side driving circuit, source signal lines 717, gate signal lines (scanning lines) 718, pixel TFTs 719, and the like.

Although omitted in FIG. 7, other buffers, analog switches, and the like are suitably provided.

Among a 4-bit digital signal supplied from the outside, an upper 2-bit digital signal is supplied to the address lines 702 (a and b), and a lower 2-bit digital signal is supplied to the address lines 710 (c and d).

Different voltages are supplied to the five gradation voltage lines (V0 to V4) 707 by resistance-division of a voltage applied between the gradation voltage lines V0 to V4. The highest voltage is applied to the gradation voltage line V4, and the lowest voltage is applied to the gradation voltage line V0.

Here, the gradation voltage line to which the lowest voltage is supplied is made a first gradation voltage line, and the gradation voltage line to which the highest voltage is supplied is made a fifth gradation voltage line. Thus, it is seen that voltages applied to the five gradation voltage lines become high in a direction from the first gradation voltage line to the fifth gradation voltage line.

The first source signal line side shift register 701 sequentially supplies latch signals (timing signals) to the latch circuits (LAT1.0 to LAT1.799) 703. The latch circuits LAT1.0 to LAT1.799 sequentially take in digital signals from the address lines 702 (a and b) by the latch signals supplied from the first source signal line side shift register 701 and holds the digital signals.

At the instance when the input of a digital signal into the latch circuit LAT1.799 is completed, a latch signal is supplied to the latch pulse line 705, the digital signals are entered in all the latch circuits LAT2.0 to LAT2.799 from the latch circuits LAT1.0 to LAT1.799 at the same time, and are held. The digital signals entered in the latch circuits LAT2.0 to LAT2.799 are transmitted to the first D/A conversion circuits 706 in one line period.

Figure 8:
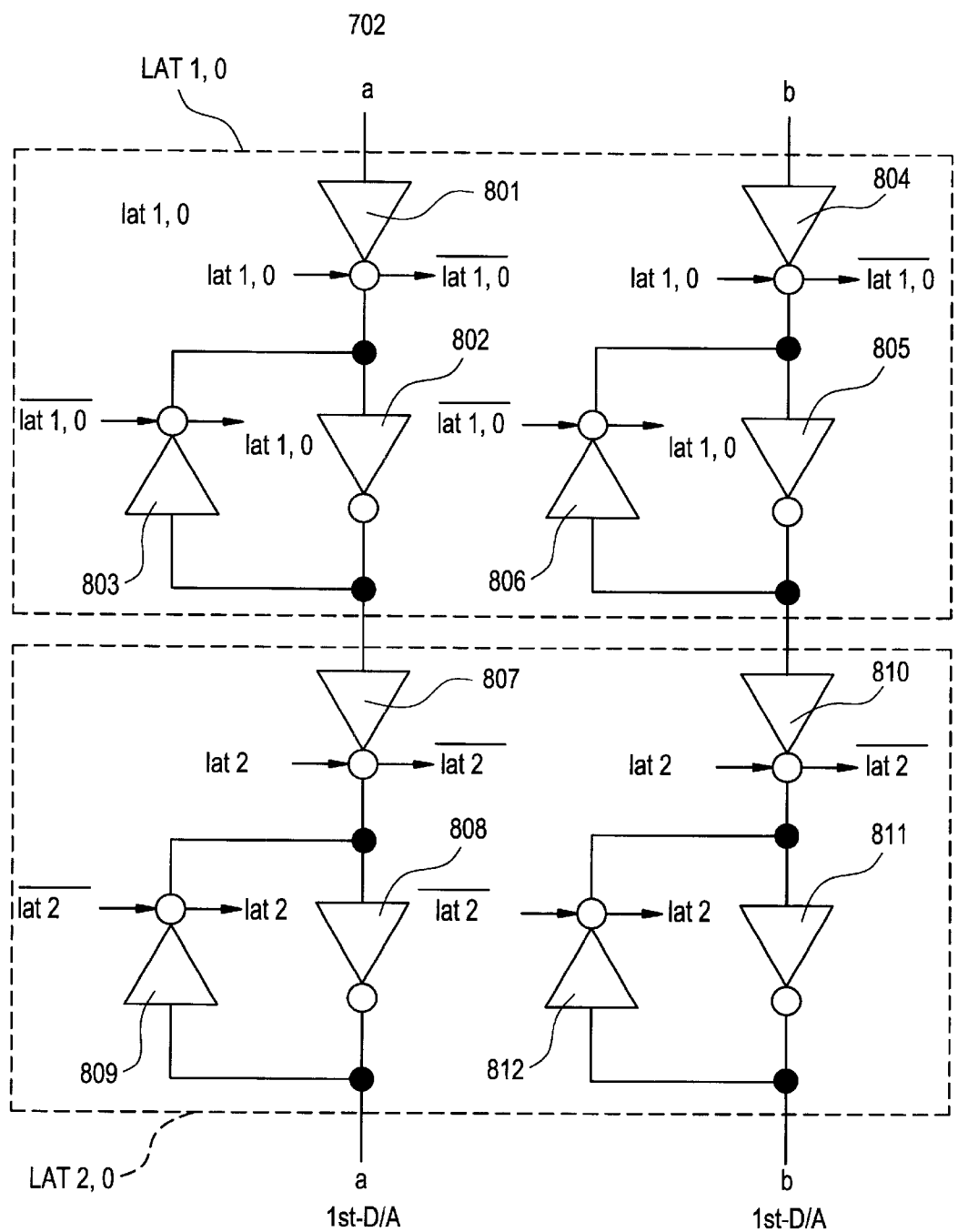
FIG. 8 is a circuit diagram of a latch circuit according to embodiment 6.

Here, FIG. 8 is a circuit diagram of the latch circuits LAT1.0 and LAT2.0. The latch circuit (LAT1.0) and the latch circuit (LAT2.0) are made of the same circuit.

The latch circuit LAT1.0 is made up of clocked inverters 801, 803, 804 and 806, and inverters 802 and 805, takes in a digital signal from the address lines 702 (a and b), and holds the digital signal. For switching of the clocked inverters 801, 803, 804, and 806, a latch signal (lat1.0) and its inversion signal (inversion lat1.0) from the first source signal line side shift register 701 are used.

The latch circuit LAT2.0 is made up of clocked inverters 807, 809, 810, and 812, and inverters 808 and 811, takes in a digital signal from the latch circuit LAT1.0, and holds the digital signal. For switching of the clocked inverters 807, 809, 810, and 812, a latch signal (lat2) and its inversion signal (inversion lat2) from the latch pulse line 705 are used. The latch circuit LAT2.0 transmits a digital signal to the first D/A conversion circuit.

Since a digital signal supplied to the address lines 702 (a and b) is supplied to the first D/A conversion circuit 706 through the two-stage latch circuits, for convenience of explanation, in this embodiment, the signal lines connected to the first D/A conversion circuit are called "a" and "b".

The first D/A conversion circuits (1st-D/A.0 to 1st-D/A.799) 706 are supplied with 2-bit digital signals from the latch circuit LAT2.0 to LAT2.799, respectively. The first D/A conversion circuits (1st-D/A.0 to 1st-D/A.799) 706 converts the supplied 2-bit digital signals into analog signals (gradation voltages), and supplies the analog signals to the second D/A conversion circuits (2nd-D/A.0 to 2nd-D/A.799) 714 through the first output lines 708 (708-1 and 708-2).

Synchronously with the timing when the first source signal line side shift register 701 sequentially transmits latch signals to the latch circuits LAT1.0 to LAT1.799, the second source signal line side shift register 709 sequentially transmit latch signals to the latch circuits LAT3.0 to LAT3.799. That is, the timing when the first source signal line side shift register 701 transmits the latch signal to the latch circuit LAT1.0 is the same as the timing when the second source signal line side shift register 709 transmits the latch signal to the latch circuit LAT 3.0. Also, the timing when the first source signal line side shift register 701 transmits the latch signal to the latch circuit LAT1.1 is the same as the timing when the second source signal line side shift register 709 transmits the latch signal to the latch circuit LAT 3.1.

The latch circuits LAT3.0 to LAT3.799 sequentially take in digital signals from the address lines 710 (c and d) by the latch signals supplied from the second source signal line side shift register 709 and holds the digital signals. At the instance when input of a digital signal into the latch circuit LAT3.799 is completed, a latch signal is supplied to the latch pulse line 713, all the latch circuits LAT4.0 to LAT4.799 take in the digital signals at the same time from the latch circuits LAT3.0 to LAT3.799, and holds the digital signals. The digital signals entered in the latch circuits LAT4.0 to LAT4.799 are transmitted to the second D/A conversion circuits 714.

The second D/A conversion circuits (2nd-D/A.0 to 2nd-D/A.799) 714 supply gradation voltages to the second output lines 715 connected to the source signal lines 717, based on the gradation voltages supplied from the output lines 708 of the first D/A conversion circuits and the supplied 2-bit digital signals.

The gradation voltages supplied to the second output lines 715 are supplied to the source signal lines 717 through buffers (not shown) or the like. According to a scanning signal from the gate signal line side shift register 716, the pixel TFTs 719 connected to the corresponding gate signal line 718 are turned ON, and the gradation voltages are applied to liquid crystal molecules.

In this way, all the pixel TFTs connected to the selected scanning line are turned on at the same time, and liquid crystal molecules are driven. Then all the scanning lines are sequentially selected and a picture of one frame is formed. In this embodiment, pictures of 60 frames are formed in a second.

Here, the first D/A conversion circuit 706 and the second D/A conversion circuit 714 of this embodiment will be described in derail with reference to FIGS. 9 and 10.

Figure 9:
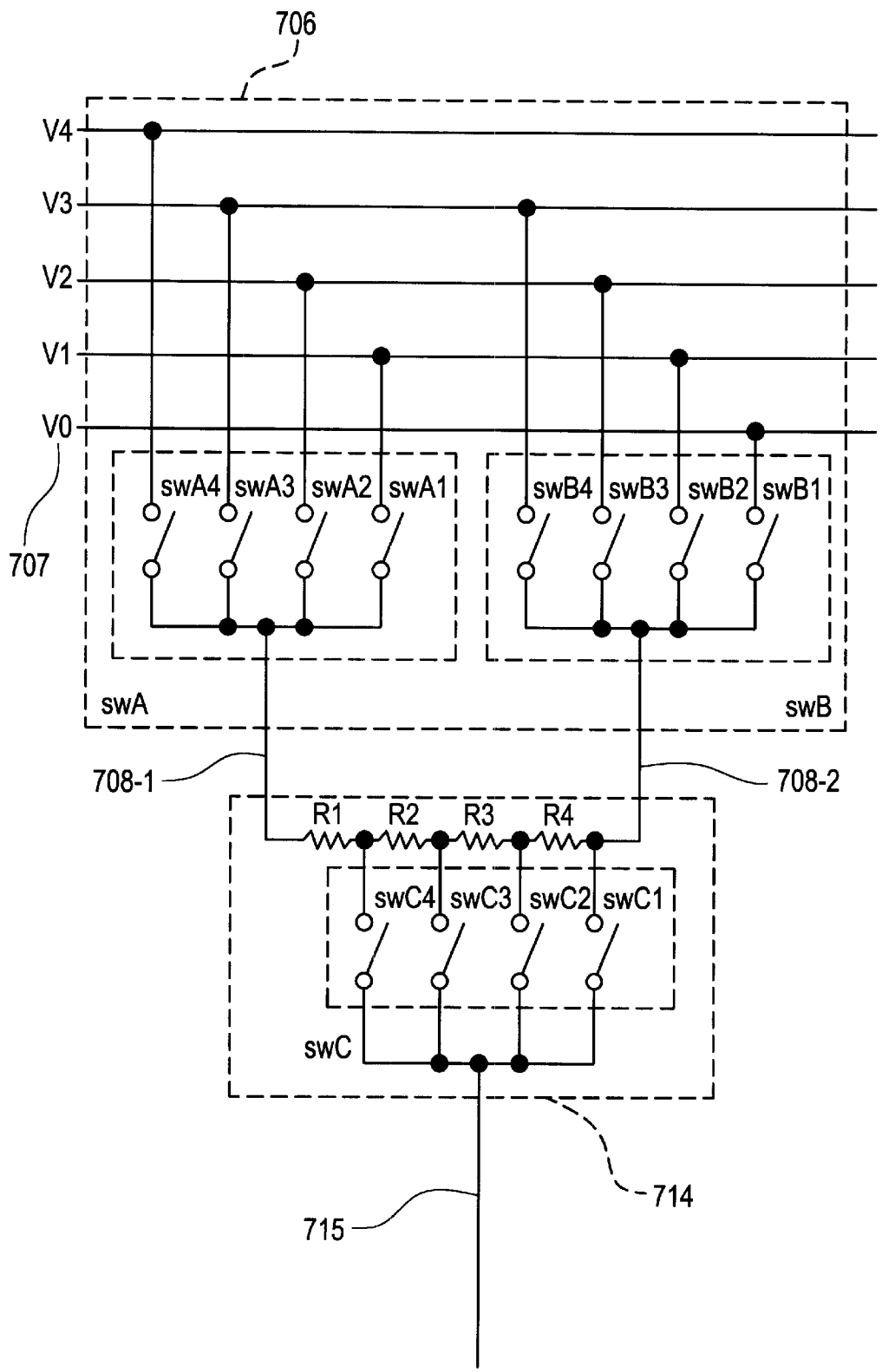
FIG. 9 is a structural view of a D/A conversion circuit according to embodiment 6 of the present invention.

FIG. 9 is a schematic view of the first D/A conversion circuit 706 and the second D/A conversion circuit 714. First, with reference to FIG. 9, the operation of the first D/A conversion circuit 706 and the second D/A conversion circuit 714 will be described.

The first D/A conversion circuit 706 is made up of a switch circuit swA including four inner switches (swA1 to swA4), a switch circuit swB including four inner switches (swB1 to swB4), and gradation voltage lines 707 (V0 to V4). The second D/A conversion circuit 714 is made up of a switch circuit swC including four inner switches (swC1 to swC4) and four resistors (R1 to R4). Here, the intrinsic resistance of a wiring line itself is not taken into consideration for convenience.

In this embodiment, the inner switches swA4 is connected to the gradation voltage line V4. The inner switch swA3 and swB4 are connected to the gradation voltage line V3. The inner switches swA2 and swB3 are connected to the gradation voltage line V2. The inner switches swA1 and swB2 are connected to the gradation voltage line V1. The inner switch swB1 is connected to the gradation voltage line V0.

In the first D/A conversion circuit 706, a 2-bit digital signal supplied from the address lines a and b through the latch circuit controls the switch circuits swA and swB. The D/A conversion circuit is designed such that one of the four inner switches (swA1 to swA4) of the switch circuit swA is closed according to the digital signal supplied from the address lines 702 (a and b) through the latch circuit, and two or more switches are not closed at the same time. The D/A conversion circuit is also designed such that one of the four inner switches (swB1 to swB4) of the switch circuit swB is closed according to the digital signal supplied from the address lines 702 (a and b) through the latch circuit, and two or more switches are not closed at the same time. Further, the following relation comes into existence between the timing when the four inner switches (swA1 to swA4) of the switch circuit swA are closed and the timing when the four inner switches (swB1 to swB4) of the switch circuit swB are closed. That is, the switch circuits are designed such that when the inner switch swA1 is closed, the inner switch swB1 is closed, when the inner switch swA2 is closed, the inner switch swB2 is closed, when the inner switch swA3 is closed, the inner switch swB3 is closed, and when the inner switch swA4 is closed, the inner switch swB4 is closed. Thus, two adjacent gradation voltage lines are always selected by the switch circuits swA and swB. In this way, even in a case where any 2-bit digital signal is inputted, two adjacent gradation voltage lines are selected by the switch circuits swA and swB, and gradation voltages are supplied to the first output lines 708 (708-1 and 708-2). Here, the first output line selected by the four inner switches of the switch circuit swA will be referred to as a first output line (H) 708-1, and the first output line selected by the four inner switches of the switch circuit swB will be referred to as a first output line (L) 708-2.

In the second D/A conversion circuit 714, a 2-bit digital signal supplied from the address lines c and d through the latch circuit controls the switch circuit swC. The D/A conversion circuit is designed such that one of the four inner switches (swC1 to swC4) of the switch circuit swC is closed according to the digital signal supplied from the address lines c and d through the latch circuit. The gradation voltages supplied to the first output line (H) 708-1 and the first output line (L) 708-2 are applied to the second D/A conversion circuit 714. The first output line (H) 708-1 and the first output line (L) 708-2 are connected through four resistors (R1 to R4) connected in series to each other. Four different gradation voltages are formed from the gradation voltages supplied to the first output line (H) 708-1 and the first output line (L) 708-2 by the four resistors (R1 to R4) of the second D/A conversion circuit 714. Thus, one of the four inner switches (swC1 to swC4) of the switch circuit swC is closed, the corresponding gradation voltage is supplied to the second output line 715. The gradation voltage supplied to the second output line 715 is supplied to the source signal line 717 through a buffer (not shown) or the like.

Next, the circuit structure of the first D/A conversion circuit 706 and the second D/A conversion circuit 714 will be described with reference to FIG. 10. However, the circuit structure shown in FIG. 10 is one example of realizing the first D/A conversion circuit and the second D/A conversion circuit, and the present invention is not limited to this.

Figure 10:
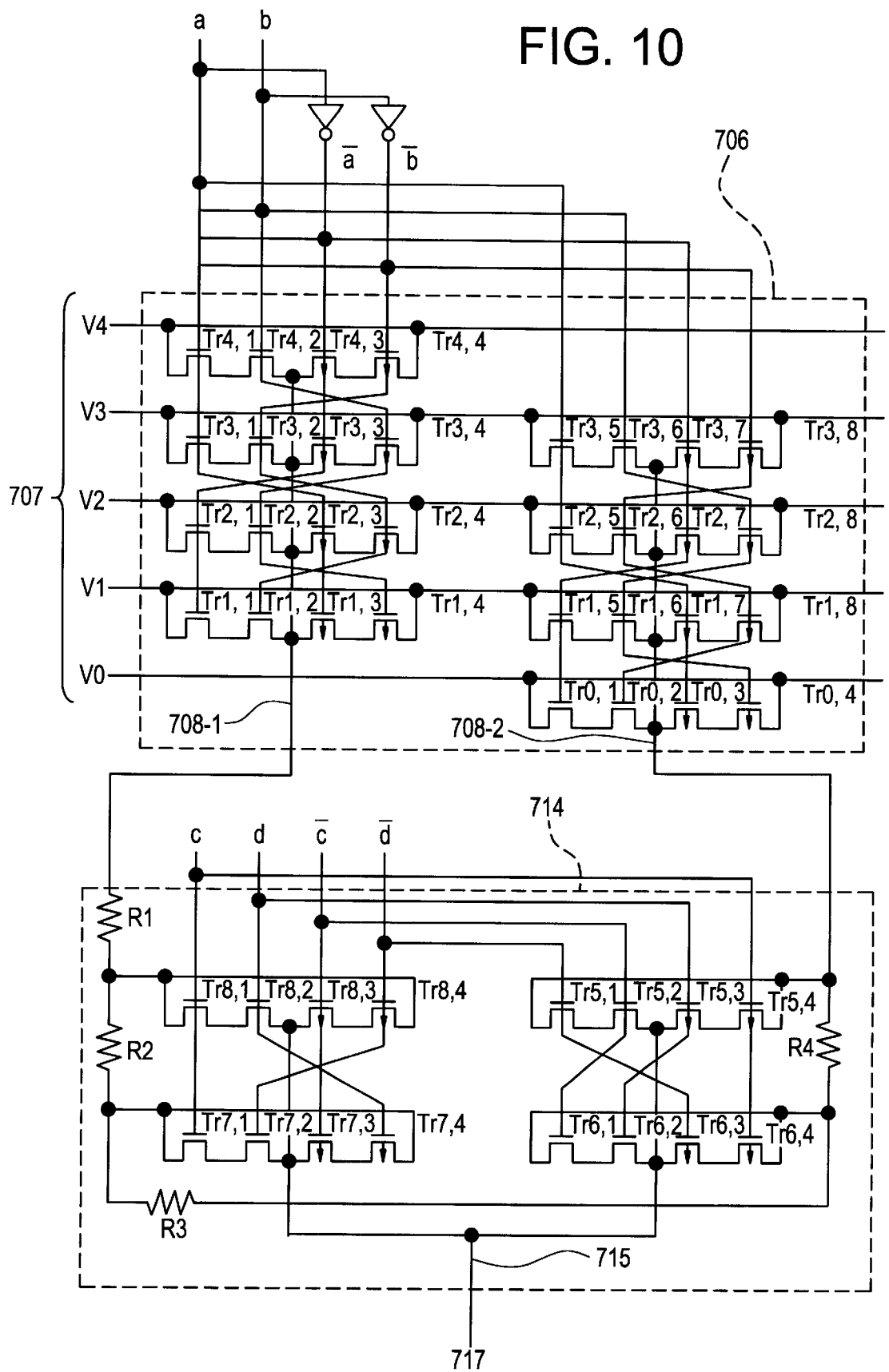
FIG. 10 is a view showing an example of a D/A conversion circuit according to embodiment 6 of the present invention.

As shown in FIG. 10, the first D/A conversion circuit 706 of this embodiment includes sixteen N-channel TFTs (Tr4.1, Tr4.2, Tr3.1, Tr3.2, Tr3.5, Tr3.6, Tr2.1, Tr2.2, Tr2.5, Tr2.6, Tr1.1, Tr1.2, Tr1.5, Tr1.6, Tr0.1, and Tr0.2), sixteen P-channel TFTs (Tr4.3, Tr4.4, Tr3.3, Tr3.4, Tr3.7, Tr3.8, Tr2.3, Tr2.4, Tr2.7, Tr2.8, Tr1.3, Tr1.4, Tr1.7, Tr1.8, Tr0.3, and Tr0.4), and five gradation voltage lines (V0 to V4).

In the five gradation voltage lines (V0 to V4) 707, the highest voltage is applied to the gradation voltage line V4, and the lowest voltage is applied to the gradation voltage line V0.

Voltages may be independently applied to the five gradation voltage lines (V0 to V4) 777. However, also in this case, it is necessary to design such that the highest voltage is applied to the gradation voltage line V4 and the lowest voltage is applied to the gradation voltage line V0.

Attention will be paid to the gradation voltage line V4. A circuit including two N-channel TFTs (Tr4.1 and Tr4.2) connected in series to each other is connected in series to a circuit including two P-channel TFTs (Tr4.3 and Tr4.4) connected in series to each other, and both ends of a circuit including the two circuits connected in series to each other are connected in parallel to the gradation voltage line V4. Since a digital signal from the address lines 702 (a and b) is supplied to the first D/A conversion circuit 706 through the latch circuit 704, for convenience of explanation, the signal lines supplied from the latch circuit 704 are made signal lines a and b, and these inversion signal lines (inversion a and inversion b) are considered. The signal lines a, b, inversion a, and inversion b are connected to gate electrodes of the TFTs Tr4.1, Tr4.2, Tr4.3, and Tr4.4, respectively. Switching of the TFTs Tr4.1, Tr4.2, Tr4.3, and Tr4.4 is controlled by the digital signal supplied to these signal lines a, b, inversion a, and inversion b. When all these TFTs are turned ON, a voltage supplied to the gradation voltage line V4 is supplied to the first output line (H) 708-1.

Next, attention will be paid to the gradation voltage line V3. A circuit including two N-channel TFTs (Tr3.1 and Tr3.2) connected in series to each other is connected in series to a circuit including two P-channel TFTs (Tr3.3 and Tr3.4) connected in series to each other, and both ends of a circuit formed of the two circuits connected in series to each other are connected in parallel to the gradation voltage line V3. The signal lines a, b, inversion a, and inversion b from the latch circuit are connected to gate electrodes of the TFTs Tr3.1, Tr3.4, Tr3.3, and Tr3.2, respectively. Switching of the TFTs Tr3.1, Tr3.2, Tr3.3, and Tr3.4 is controlled by the digital signal supplied to these signal lines a, b, inversion a, and inversion b. When all these TFTs are turned ON, a voltage supplied to the gradation voltage line V3 is supplied to the first output line (H) 708-1.

Further, in the gradation voltage line V3, a circuit including two N-channel TFTs (Tr3.5 and Tr3.6) connected in series to each other is connected in series to a circuit including two P-channel TFTs (Tr3.7 and Tr3.8) connected in series to each other, and both ends of a circuit formed of the two circuits connected in series to each other are further connected in parallel to the gradation voltage line V3. The signal lines a, b, inversion a, and inversion b from the latch circuit are connected to gate electrodes of the TFTs Tr3.5, Tr3.6, Tr3.7, and Tr3.8, respectively. When all these TFTs are turned ON, a voltage supplied to the gradation voltage line V3 is supplied to the first output line (L) 708-2.

Next, attention will be paid to the gradation voltage line V2. A circuit including two N-channel TFTs (Tr2.1 and Tr2.2) connected in series to each other is connected in series to a circuit including two P-channel TFTs (Tr2.3 and Tr2.4) connected in series to each other, and both ends of a circuit formed of the two circuits connected in series to each other are connected in parallel to the gradation voltage line V2. The signal lines a, b, inversion a, and inversion b from the latch circuit are connected to gate electrodes of the TFTs Tr2.3, Tr2.2, Tr2.1, and Tr2.4, respectively. When all these TFTs are turned ON, a voltage supplied to the gradation voltage line V2 is supplied to the first output line (H) 708-1.

Further, in the gradation voltage line V2, a circuit including two N-channel TFTs (Tr2.5 and Tr2.6) connected in series to each other is connected in series to a circuit including two P-channel TFTs (Tr2.7 and Tr2.8) connected in series to each other, and both ends of a circuit formed of the two circuits connected in series to each other are further connected in parallel to the gradation voltage line V2. The signal lines a, b, inversion a, and inversion b from the latch circuit are connected to gate electrodes of the TFTs Tr2.5, Tr2.8, Tr2.7, and Tr2.6, respectively. When all these TFTs are turned ON, a voltage supplied to the gradation voltage line V2 is supplied to the first output line (L) 708-2.

Also in the gradation voltage line V1, a circuit with a structure as described above is connected in parallel to the gradation voltage line V1. The signal lines a, b, inversion a, and inversion b from the latch circuit 704 are connected to gate electrodes of the TFTs Tr1.3, Tr1.4, Tr1.1, and Tr1.2, respectively. When all these TFTs are turned ON, a voltage supplied to the gradation voltage line V1 is supplied to the first output line (H) 708-1. Also, the signal lines a, b, inversion a, and inversion b from the latch circuit are connected to gate electrodes of the TFTs Tr1.7, Tr1.6, Tr1.5, and Tr1.8, respectively. When all these TFTs are turned ON, a voltage supplied to the gradation voltage line V1 is supplied to the first output line (L) 708-2.

Also in the gradation voltage line V0, a circuit with a structure as described above is connected in parallel to the gradation voltage line V0. The signal lines a, b, inversion a, and inversion b from the latch circuit 704 are connected to gate electrodes of the TFTs Tr0.3, Tr0.4, Tr0.1, and Tr0.2, respectively. When all these TFTs are turned ON, a voltage supplied to the gradation voltage line V0 is supplied to the first output line (L) 708-2.

The following Table 5 shows the combination of gradation voltage lines outputted to the first output line (H)708-1 and (L)708-2 by the combination of digital signals supplied to the signal lines a, b, inversion a, and inversion b.

TABLE 5

| First output line (H) | First output line (L) | a | b | inversion a | inversion b |
|---|---|---|---|---|---|
| V4 | V3 | Hi | Hi | Lo | Lo |
| V3 | V2 | Hi | Lo | Lo | Hi |
| V2 | V1 | Lo | Hi | Hi | Lo |
| V1 | V0 | Lo | Lo | Hi | Hi |

Table 5 shows that adjacent two gradation voltage lines are selected by the digital signals inputted to the signal lines a, b, inversion a, and inversion b, and are supplied to the first output line (H) 708-1 and the first output line (L) 708-2.

On the other hand, the second D/A conversion circuit 714 includes eight N-channel TFTs (Tr5.1, Tr5.2, Tr6.1, Tr6.2, Tr7.1, Tr7.2, Tr8.1 and Tr8.2), eight P-channel TFTs (Tr5.3, Tr5.4, Tr6.3, Tr6.4, Tr7.3, Tr7.4, Tr8.3 and Tr8.4), and four resistors (R1 to R4).

The second D/A conversion circuit 714 is connected to the first output line (H) 708-1 and the first output line (L) 708-1 of the first D/A conversion circuit 706 through the four resistors (R1 to R4) connected in series to each other. By such a structure, the second D/A conversion circuit 714 generates four different voltages.

Attention will be paid to a connection point between the resistor R1 and the resistor R2. A circuit including two N-channel TFTs (Tr8.1 and Tr8.2) connected in series to each other is connected in series to a circuit including two P-channel TFTs (Tr8.3 and Tr8.4) connected in series to each other, and both ends of a circuit formed of the foregoing two circuits connected in series to each other are connected to the connection point between the resistors R1 and R2. Since a digital signal from the address lines c and d are supplied to the second D/A conversion circuit through the latch circuit, for convenience of explanation, signal lines supplied from the latch circuit are made signal lines c and d, and their inversion signal lines (inversion c and inversion d) are considered.

The signal lines c, d, inversion c, and inversion d from the latch circuit are connected to gate electrodes of the TFTs Tr8.1, Tr8.2, Tr8.3, and Tr8.4, respectively. When all these TFTs are turned ON, a voltage obtained by subtracting a voltage drop by the resistor R1 from the voltage supplied to the first output line (H) 708-1 is supplied to the second output line 715. In other words, the voltage supplied to the second output line 715 becomes a voltage obtained by adding a voltage drop by the resistors (R2+R3+R4) to the voltage supplied to the first output line (L) 708-2. Thus, the voltage supplied to the second output line is kept constant irrespective of a potential of a pixel TFT to which the voltage is outputted.

Next, attention will be paid to a connection point between the resistor R2 and the resistor R3. A circuit including two N-channel TFTs (Tr7.1 and Tr7.2) connected in series to each other is connected in series to a circuit including two P-channel TFTs (Tr7.3 and Tr7.4) connected in series to each other, and both ends of a circuit formed of the foregoing two circuits connected in series to each other are connected to the connection point between the resistors R2 and R3. The signal lines c, d, inversion c, and inversion d from the latch circuit are connected to gate electrodes of the TFTs Tr7.1, Tr7.4, Tr7.3, and Tr7.2, respectively. When all these TFTs are turned ON, a voltage obtained by subtracting a voltage drop by the resistors (R1+R2) from the voltage supplied to the first output line (H) 708-1 is supplied to the second output line 715. In other words, the voltage supplied to the second output line 715 becomes a voltage obtained by adding a voltage drop by the resistors (R3+R4) to the voltage supplied to the first output line (L) 708-2. Thus, also in this case, the voltage supplied to the second output line 715 is kept constant irrespective of a potential of a pixel TFT to which the voltage is outputted.

Next, attention will be paid to a connection point between the resistor R3 and the resistor R4. A circuit including two N-channel TFTs (Tr6.1 and Tr6.2) connected in series to each other is connected in series to a circuit including two P-channel TFTs (Tr6.3 and Tr6.4) connected in series to each other, and both ends of a circuit formed of the foregoing two circuits connected in series to each other are connected to the connection point between the resistors R3 and R4. The signal lines c, d, inversion c, and inversion d from the latch circuit are connected to gate electrodes of the TFTs Tr6.4, Tr6.2, Tr6.1, and Tr6.3, respectively. When all these TFTs are turned ON, a voltage obtained by subtracting a voltage drop by the resistors (R1+R2+R3) from the voltage supplied to the first output line (H) 708-1 is supplied to the second output line 715. In other words, the voltage supplied to the second output line 715 becomes a voltage obtained by adding a voltage drop by the resistor R4 to the voltage supplied to the first output line (L) 708-2. Thus, also in this case, the voltage supplied to the second output line 715 is kept constant irrespective of a potential of a pixel TFT to which the voltage is outputted.

Next, attention will be paid to a connection point between the resistor R4 and the first output line (L) 708-2. A circuit including two N-channel TFTs (Tr5.1 and Tr5.2) connected in series to each other is connected in series to a circuit including two P-channel TFTs (Tr5.3 and Tr5.4) connected in series to each other, and both ends of a circuit formed of the foregoing two circuits connected in series to each other are connected to the connection point between the resistor R4 and the first output line (L) 708-2. The signal lines c, d, inversion c, and inversion d from the latch circuit are connected to gate electrodes of the TFTs Tr5.4, Tr5.3, Tr5.2, and Tr5.1, respectively. When all these TFTs are turned ON, a voltage obtained by subtracting a voltage drop by the resistors (R1+R2+R3+R4) from the voltage supplied to the first output line (H) 708-1 is supplied to the second output line 715. In other words, the voltage supplied to the second output line 715 becomes a voltage supplied to the first output line (L) 708-2. Thus, also in this case, the voltage supplied to the second output line 715 is kept constant irrespective of a potential of a pixel TFT to which the voltage is outputted.

A current flowing to the second D/A conversion circuit 714 is changed by the combination of gradation voltage lines outputted from the output lines (H) 708-1 and (L) 708-2 of the first D/A conversion circuit 706. Then current flowing to the second D/A conversion circuit 714 is defined as $I_1$ to $I_4$ shown in Table 6.

TABLE 6

| First output line (H) | First output line (L) | Current |
|---|---|---|
| V4 | V3 | $I_1 = (V4 - V3)/(R1 + R2 + R3 + R4)$ |
| V3 | V2 | $I_2 = (V3 - V2)/(R1 + R2 + R3 + R4)$ |
| V2 | V1 | $I_3 = (V2 - V1)/(R1 + R2 + R3 + R4)$ |
| V1 | V0 | $I_4 = (V1 - V0)/(R1 + R2 + R3 + R4)$ |

The following Table 7 shows voltages finally outputted to the second output line 715 by the combination of digital signals supplied to the signal lines a, b, c, d, inversion a, inversion b, inversion c, and inversion d.

TABLE 7

| Second output line | a | b | c | d | Inversion a | Inversion b | Inversion c | Inversion d |
|---|---|---|---|---|---|---|---|---|
| $V4 - R1 \cdot I_1$ | Hi | Hi | Hi | Hi | Lo | Lo | Lo | Lo |
| $V4 - (R1 + R2) \cdot I_1$ | Hi | Hi | Hi | Lo | Lo | Lo | Lo | Hi |
| $V4 - (R1 + R2 + R3) \cdot I_1$ | Hi | Hi | Lo | Hi | Lo | Lo | Hi | Lo |
| $V4 - (R1 + R2 + R3 + R4) \cdot I_1$ | Hi | Hi | Lo | Lo | Lo | Lo | Hi | Hi |
| $V3 - R1 \cdot I_2$ | Hi | Lo | Hi | Hi | Lo | Hi | Lo | Lo |
| $V3 - (R1 + R2) \cdot I_2$ | Hi | Lo | Hi | Lo | Lo | Hi | Lo | Hi |
| $V3 - (R1 + R2 + R3) \cdot I_2$ | Hi | Lo | Lo | Hi | Lo | Hi | Hi | Lo |
| $V3 - (R1 + R2 + R3 + R4) \cdot I_2$ | Hi | Lo | Lo | Lo | Lo | Hi | Hi | Hi |
| $V2 - R1 \cdot I_3$ | Lo | Hi | Hi | Hi | Hi | Lo | Lo | Lo |
| $V2 - (R1 + R2) \cdot I_3$ | Lo | Hi | Hi | Lo | Hi | Lo | Lo | Hi |
| $V2 - (R1 + R2 + R3) \cdot I_3$ | Lo | Hi | Lo | Hi | Hi | Lo | Hi | Lo |
| $V2 - (R1 + R2 + R3 + R4) \cdot I_3$ | Lo | Hi | Lo | Lo | Hi | Lo | Hi | Hi |
| $V1 - R1 \cdot I_4$ | Lo | Lo | Hi | Hi | Hi | Hi | Lo | Lo |
| $V1 - (R1 + R2) \cdot I_4$ | Lo | Lo | Hi | Lo | Hi | Hi | Lo | Hi |
| $V1 - (R1 + R2 + R3) \cdot I_4$ | Lo | Lo | Lo | Hi | Hi | Hi | Hi | Lo |
| $V1 - (R1 + R2 + R3 + R4) \cdot I_4$ | Lo | Lo | Lo | Lo | Hi | Hi | Hi | Hi |

Table 7 shows that sixteen different voltages are outputted to the second output line 715 by digital signals inputted to the signal lines a, b, c, d, inversion a, inversion b, inversion c, and inversion d.

Thus, in this embodiment, the upper 2-bit digital signals in the 4-bit digital signal can select four gradation voltage lines, and the lower 2-bit signal can output further four gradation voltages from a selected gradation voltage. Thus, it is possible to arbitrarily select 4 (upper 2 bits)×4 (lower 2 bits)=16 gradation voltages.

As is seen from FIG. 9 as well, in the D/A conversion circuit of this embodiment, the number of gradation voltage lines is five and the number of switches is twelve. Thus, as compared with a conventional D/A conversion circuit, the area can be made small and the miniaturization of the entire of the driving circuit can be realized. Further, since the D/A conversion circuit can be miniaturized, the improvement in fineness of the active matrix liquid crystal display device can also be realized.

Moreover, as described above, since the voltage supplied from the output line of the second D/A conversion circuit is always stable even if a potential of a pixel TFT is changed, a stable voltage can be supplied to a pixel TFT.

In this embodiment, although a 4-bit digital signal is divided into an upper 2-bit signal and a lower 2-bit signal and each signal controls switching of the switch circuits swA, swB and swC, division of the 4-bit digital signal is not limited to this.

For example, upper three bits may be used for switching of the switch circuits swA and swB, and lower one bit may be used for switching of the switch circuit swC. In this case, the number of inner switches of the switch circuits swA and swB are respectively eight (swA1 to swA8, swB1 to swB8), and the number of gradation voltage lines becomes 9 (V0 to V8). The number of inner switches of the switch circuit swC becomes two (swC1 and swC2), and the number of resistors becomes two (R1 and R2). A 3-bit digital signal is inputted to the switch circuit swA, one of the eight inner switches of the switch circuit swA is closed, one gradation voltage line is selected, and its voltage is supplied to the first output line (H). Also, a 3-bit digital signal is inputted to the switch circuit swB, one of the eight switches of the switch circuit swB is closed, one gradation voltage line is selected, and its voltage is supplied to the first output line (L). A 1-bit digital signal is inputted to the switch circuit swC, one of the two inner switches of the switch circuit swC is closed, and a corresponding gradation voltage is supplied to the second output line. A gradation voltage supplied to the second output line is supplied to the source signal line through a buffer or the like.

In this embodiment, although the description has been made to the D/A conversion circuit which processes a 4-bit digital signal, according to the present invention, a D/A conversion circuit which processes an n-bit (n is a natural number not smaller than 2) digital signal can be realized. In this case, an n-bit digital signal can be divided into upper x bits and lower y bits (x+y=n) and be considered. In this case, the number of inner switches of the switch circuit swA is $2^x$ (swA1 to swA$2^x$), and the number of inner switches of the switch circuit swB becomes $2^x$ (swB1 to swB$2^x$). The number of gradation voltage lines becomes ($2^x+1$). Further, the number of inner switches of the switch circuit swC becomes $2^y$ (swC1 to swC$2^y$), and the number of resistors also becomes $2^y$ (R1 to R$2^y$).

Here, in the ($2^x+1$) gradation voltage lines, a gradation voltage line to which the lowest voltage is applied can be made a first gradation voltage line, and a gradation voltage line to which the highest voltage is applied can be made a ($2^x+1$)-th gradation voltage line. In this case, voltages supplied to the gradation voltage lines become high in a direction from the first gradation voltage line to the ($2^x+1$)-th gradation voltage line.

If a z-th gradation voltage line and a (z+1)-th gradation voltage line ($1 \leq z \leq 2^x$; z is a natural number) are selected from the ($2^x+1$) gradation voltage lines by the upper x bits of the n-bit digital signal, and their gradation voltages are outputted to the first output lines (H) and (L), different $2^y$ gradation voltages are formed from the gradation voltages supplied to the selected z-th and (z+1)-th gradation voltage lines by the $2^y$ resistors (R1 to R$2^y$) of the second D/A conversion circuit. By the lower y bits of the n-bit digital signal, a corresponding voltage is selected from the $2^y$ voltages, and is supplied to the second output line.

As described above, in the case where the n-bit digital signal is divided into upper x bits and lower y bits and is used, the number of gradation voltages capable of being selected becomes $2^x$ (upper x bits)×$2^y$ (lower y bits)=$2^{(x+y)}=2^n$, and also in this case, the number of gradation voltages is not decreased.

Here, a manufacturing method of an active matrix type liquid crystal display device provided with a D/A conversion circuit of this embodiment will be described. Incidentally, the following manufacturing method is merely an example of the present invention, and the D/A conversion circuit of the present invention can also be realized by other manufacturing methods.

Here, an example in which a plurality of TFTs are formed on a substrate having an insulating surface, and a pixel matrix circuit, a driving circuit provided with the foregoing D/A conversion circuit, a logic circuit, and the like are monolithically formed, will be described with reference to FIGS. 16 to 19. In this embodiment, a state in which one pixel of the pixel matrix circuit and a CMOS circuit as a basic circuit of the other circuits (driving circuit provided with the D/A conversion circuit, logic circuit, and the like) are formed at the same time, will be described. In this embodiment, although manufacturing steps of a case in which a P-channel TFT and an N-channel TFT respectively include one gate electrode will be described, a CMOS circuit composed of TFTs each including a plurality of gate electrodes, such as a double gate type or a triple gate type, can also be manufactured in the same way.

Reference will be made to FIGS. 16A to 16D. First, a quartz substrate 1601 is prepared as a substrate having an insulating surface. Instead of the quartz substrate, a silicon substrate on which a thermal oxidation film is formed may be used. Moreover, such a method may be adopted that an amorphous silicon film is temporarily formed on a quartz substrate and the film is completely thermally oxidized to form an insulating film. In addition, a quartz substrate, a ceramic substrate, or a silicon substrate, each having a silicon nitride film formed as an insulating film, may be used.

Reference numeral 1602 denotes an amorphous silicon film, and adjustment is made so that a final film thickness (film thickness determined after paying consideration to a film decrease subsequent to thermal oxidation) becomes 10 to 75 nm (preferably 15 to 45 nm). In the film formation, it is important to thoroughly manage the concentration of impurities in a film.

In the case of this embodiment, management is made so that the concentration of each of C (carbon) and N (nitrogen), which are impurities to block crystallization in the amorphous silicon film 1602, becomes less than $5 \times 10^{18}$ atoms/cm$^3$ (typically, $5 \times 10^{17}$ atoms/cm$^3$ or less, preferably $2 \times 10^{17}$ atoms/cm$^3$ or less), and the concentration of O (oxygen) becomes less than $1.5 \times 10^{19}$ atoms/cm$^3$ (typically $1 \times 10^{18}$ atoms/cm$^3$ or less, preferably $5 \times 10^{17}$ atoms/cm$^3$ or less). If the concentration of any one of the impurities exceeds the above value, the impurity has a bad influence at subsequent crystallization and causes a film quality to be degraded after the crystallization. In the present specification, the foregoing concentration of the impurity in the film is defined as a minimum value in measurement results of the SIMS (Secondary Ion Mass Spectroscopy).

In order to obtain the above structure, it is desirable to periodically carry out dry cleaning of a low pressure CVD furnace using in this embodiment to make a film growth chamber clean. It is appropriate that the dry cleaning of the film growth chamber is carried out by flowing a ClF$_3$ (chlorine fluoride) gas of 100 to 300 sccm into the furnace heated up to about 200 to 400° C. and by using fluorine produced by pyrolysis.

According to the knowledge of the present inventors, in the case where the temperature in the furnace is made 300° C. and the flow of the ClF$_3$ (chlorine fluoride) gas is made 300 sccm, it is possible to completely remove an incrustation (containing silicon as the main ingredient) with a thickness of 2 μm in four hours.

The concentration of hydrogen in the amorphous silicon film 1602 is also a very important parameter, and it appears that as the hydrogen content is made low, a film with superior crystallinity is obtained. Thus, it is preferable to form the amorphous silicon film 1602 by a low pressure CVD method. A plasma CVD method may also be used if film forming conditions are optimized.

Next, the amorphous silicon film 1602 is crystallized. A technique disclosed in Japanese Patent Unexamined Publication No. Hei. 7-130652 is used as a means for crystallization. Although both means of embodiment 1 and embodiment 2 disclosed in the publication may be used, in this embodiment, it is preferable to use the technical content (described in detail in Japanese Patent Unexamined Publication No. Hei. 8-78329) set forth in the embodiment 2 of the publication.

According to the technique disclosed in Japanese Patent Unexamined Publication No. Hei. 8-78329, a mask insulating film 1603 for selecting an added region of a catalytic element is first formed. The mask insulating film 1603 has a plurality of openings for addition of the catalytic element. Positions of crystal regions can be determined by the positions of the openings.

Figure 16A:
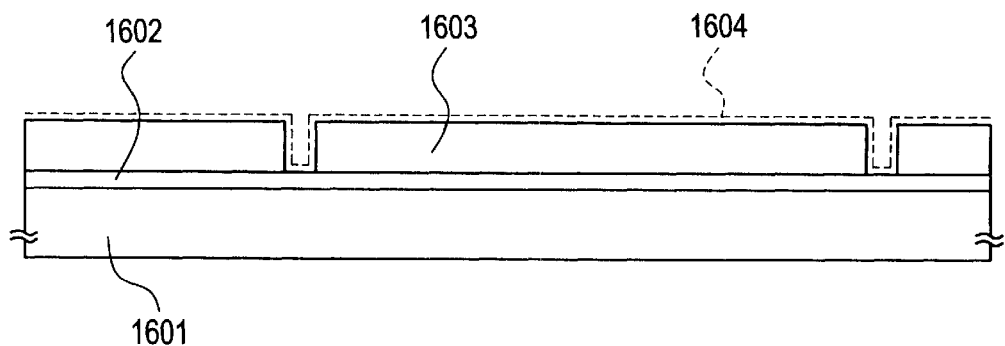
FIGS. 16A to 16D are views showing a manufacturing method of a liquid crystal display device provided with a D/A conversion circuit according to embodiment 6 of the present invention.

A solution containing nickel (Ni) as the catalytic element for facilitating the crystallization of the amorphous silicon film is applied by a spin coating method to form a Ni containing layer 1604. As the catalytic element, cobalt (Co), iron (Fe), palladium (Pd), germanium (Ge), platinum (Pt), copper (Cu), gold (Au), or the like may be used other than nickel (FIG. 16A).

As the foregoing adding step of the catalytic element, an ion implantation method or a plasma doping method using a resist mask may also be used. In this case, since it becomes easy to decrease an occupied area of an added region and to control a growth distance of a lateral growth region, the method becomes an effective technique when a minute circuit is formed.

Next, after the adding step of the catalytic element is completed, dehydrogenating is carried out at about 450° C. for 1 hour, and then, a heat treatment is carried out in an inert gas atmosphere, a hydrogen atmosphere, or an oxygen atmosphere at a temperature of 500 to 700° C. (typically 550 to 650° C.) for 4 to 24 hours to crystallize the amorphous silicon film 1602. In this embodiment, a heat treatment is carried out in a nitrogen atmosphere, at 570° C., and for 14 hours.

Figure 16B:
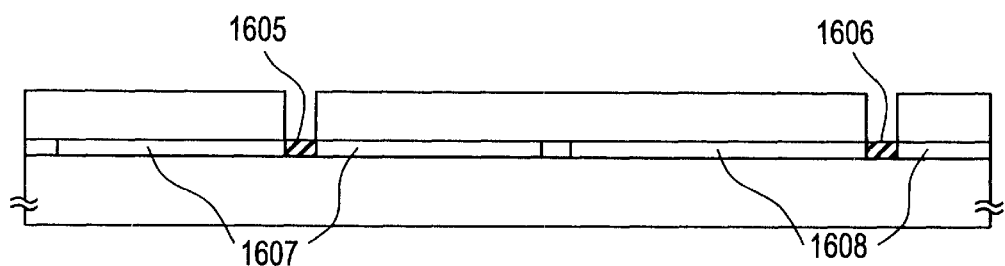

At this time, crystallization of the amorphous silicon film 1602 progresses first from nuclei produced in regions 1605 and 1606 added with nickel, and crystal regions 1607 and 1608 grown almost parallel to the surface of the substrate 1601 are formed. The crystal regions 1607 and 1608 are respectively referred to as a lateral growth region. Since respective crystals in the lateral growth region are gathered in a comparatively uniform state, the lateral growth region has such an advantage that the total crystallinity is superior (FIG. 16B).

Incidentally, even in the case where the technique set forth in embodiment 1 of the above-mentioned Japanese Patent Unexamined Publication No. Hei. 7-130652 is used, a region which can be called a lateral growth region is microscopically formed. However, since production of nuclei occurs irregularly in the surface, it is difficult to control crystal grain boundaries.

Figure 16C:
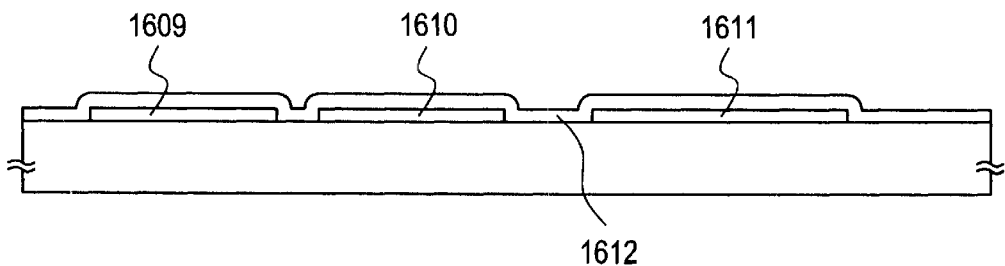

After the heat treatment for crystallization is completed, the mask insulating film 1603 is removed and patterning is carried out, so that island-like semiconductor layers (active layers) 1609, 1610, and 1611 made of the lateral growth regions 1607 and 1608 are formed (FIG. 16C).

Here, reference numeral 1609 denotes the active layer of the N-channel TFT constituting the CMOS circuit, 1610 denotes the active layer of the P-channel TFT constituting the CMOS circuit, and 1611 denotes the active layer of the N-channel TFT (pixel TFT) constituting the pixel matrix circuit.

After the active layers 1609, 1610 and 1611 are formed, a gate insulating film 1612 made of an insulating film containing silicon is formed thereon (FIG. 16C).

Figure 16D:
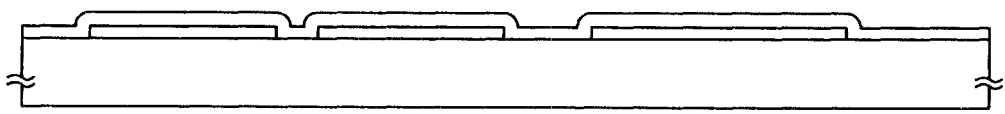

Next, as shown in FIG. 16D, a heat treatment (gettering process for the catalytic element) for removing or reducing the catalytic element (nickel) is carried out. In this heat treatment, a halogen element is made contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained.

Thus, in this embodiment, the heat treatment is carried out at a temperature exceeding 700° C., preferably 800 to 1000° C. (typically 950° C.), and a processing time is made 0.1 to 6 hours, typically 0.5 to 1 hour.

In this embodiment, there is shown an example in which a heat treatment is carried out in an oxygen atmosphere containing hydrogen chlorine (HCl) of 0.5 to 10 vol % (in this embodiment, 3 vol %) at 950° C. for 30 minutes. If the concentration of HCl is higher than the above-mentioned concentration, asperities comparable to a film thickness are produced on the surfaces of the active layers 1609, 1610 and 1611. Thus, such a high concentration is not preferable.

Although an example in which the HCl gas is used as a compound containing a halogen element has been described, one kind or plural kinds of gases selected from compounds containing halogen, such as typically $HF$, $NF_3$, $HBr$, $Cl_2$, $ClF_3$, $BCl_2$, $F_2$, and $Br_2$, may be used other than the HCl gas.

In this step, it is conceivable that nickel is removed in such a manner that nickel in the active layers 1609, 1610 and 1611 is gettered by the action of chlorine and is transformed into volatile nickel chloride which is released into the air. By this step, the concentration of nickel in the active layers 1609, 1610 and 1611 is lowered down to $5 \times 10^{17}$ atoms/cm³ or less.

Incidentally, the value of $5 \times 10^{17}$ atoms/cm³ is the lower detection limit of the SIMS (Secondary Ion Mass Spectroscopy). As the result of analysis of TFTs experimentally produced by the present inventors, when the concentration was not higher than $1 \times 10^{18}$ atoms/cm³ (preferably $5 \times 10^{17}$ atoms/cm³ or less), an influence of nickel upon TFT characteristics was not ascertained. However, the concentration of an impurity in the present specification is defined as a minimum value in measurement results of the SIMS analysis.

By the above heat treatment, a thermal oxidation reaction progresses at the interface between the gate insulating film 1612 and the active layers 1609, 1610 and 1611, so that the thickness of the gate insulating film 1612 is increased by the thickness of a thermal oxidation film. When the thermal oxidation film is formed in this way, it is possible to obtain an interface of semiconductor/insulating film, which has very few interfacial levels. Moreover, there is also an effect to prevent inferior formation (edge thinning) of the thermal oxidation film at the end of the active layer.

The gettering process of the catalytic element may be carried out after the mask insulating film 1603 is removed and before the active layer is patterned. And also, the gettering process of the catalytic element may be carried out after the active layer is patterned. Besides, any gettering processes may be combined.

Incidentally, the gettering process of the catalytic element may also be carried out by using P (phosphorus). The gettering process using phosphorus may be combined with the foregoing gettering process. Only the gettering process using phosphorus may be carried out.

Further, it is also effective that after the heat treatment in the above-mentioned halogen atmosphere is carried out, a heat treatment approximately at 950° C. for one hour is carried out in a nitrogen atmosphere to improve the film quality of the gate insulating film 1612.

Incidentally, it is also ascertained by the SIMS analysis that the halogen element, which was used for the gettering process, having a concentration of $1 \times 10^{15}$ to $1 \times 10^{20}$ atoms/cm³ remains in the active layers 1609, 1610 and 1611. Moreover, it is also ascertained by the SIMS analysis that at that time, the foregoing halogen element with a high concentration is distributed between the active layers 1609, 1610 and 1611 and the thermal oxidation film formed by the heat treatment.

As the result of the SIMS analysis for other elements, it was ascertained that the concentration of any of C(carbon), N (nitrogen), O (oxygen), and S (sulfur) as typical impurities was less than $5 \times 10^{18}$ atoms/cm³ (typically $1 \times 10^{18}$ atoms/cm³ or less).

Figure 17A:
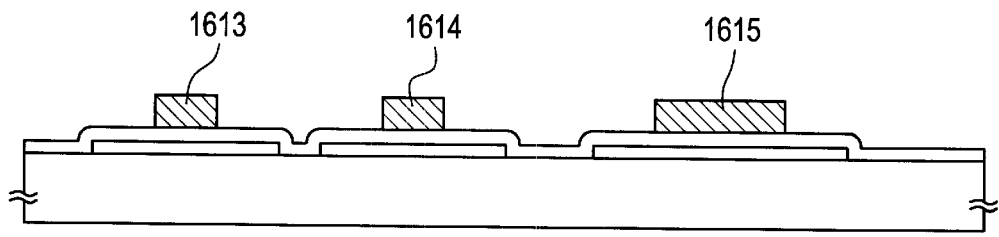
FIGS. 17A to 17D are views showing the manufacturing method of the liquid crystal display device provided with the D/A conversion circuit according to embodiment 6 of the present invention.

Next, a not-shown metal film containing aluminum as the main ingredient is formed, and originals 1613, 1614 and 1615 of subsequent gate electrodes are formed by patterning. In this embodiment, an aluminum film containing scandium of 2 wt % is used (FIG. 17A).

Incidentally, a polycrystalline silicon film added with impurities may be used for the gate electrode, instead of the metal film containing aluminum as the main ingredient.

Figure 17B:
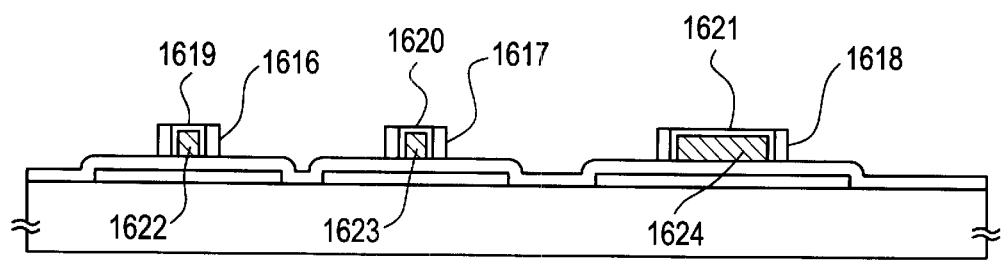
Figure 17C:
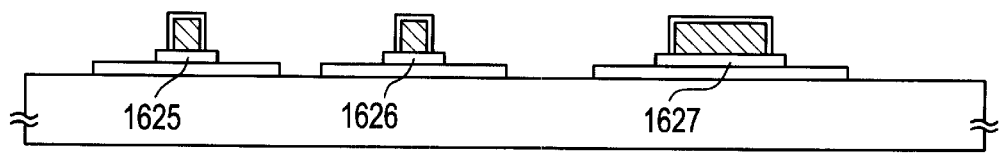

Next, by a technique disclosed in Japanese Patent Unexamined Publication No. Hei. 7-135318, porous anodic oxidation films 1616, 1617 and 1618, nonporous anodic oxidation films 1619, 1620 and 1621, and gate electrodes 1622, 1623 and 1624 are formed (FIG. 17B).

After the state shown in FIG. 17B is obtained in this way, the gate insulating film 1612 is next etched by using the gate electrodes 1622, 1623 and 1624, and the porous anodic oxidation films 1616, 1617 and 1618 as masks. Then the porous anodic oxidation films 1616, 1617 and 1618 are removed to obtain the state shown in FIG. 17C. Incidentally, reference numerals 1625, 1626 and 1627 in FIG. 17C denote gate insulating films after processing.

Next, an adding step of impurities giving one conductivity is carried out. As the impurity elements, P (phosphorus) or As (arsenic) may be used for an N-channel type, and B (boron) or Ga (gallium) may be used for a P-channel type.

In this embodiment, the addition of impurities is divided and is carried out two times.

First, an impurity addition for forming an N-channel TFT is carried out. The first impurity addition (P (phosphorus) is used in this embodiment) is carried out at a high acceleration voltage of about 80 KeV to form an n⁻ region. Adjustment is made so that the concentration of P ions in the n⁻ region becomes $1 \times 10^{18}$ to $1 \times 10^{19}$ atoms/cm³.

Further, the second impurity addition is carried out at a low acceleration voltage of about 10 KeV to form an n⁺ region. Since the acceleration voltage is low at this time, the gate insulating film functions as a mask. Adjustment is made so that the sheet resistance of the n⁺ region becomes 500 Ω or less (preferably 300 Ω or less).

Through the above described steps, a source region 1628, a drain region 1629, a low concentration impurity region 1630, and a channel formation region 1631 of the N-channel TFT constituting the CMOS circuit are formed. Moreover, a source region 1632, a drain region 1633, a low concentration impurity region 1634, and a channel formation region 1635 of the N-channel TFT constituting the pixel TFT are defined (FIG. 17D).

Figure 17D:
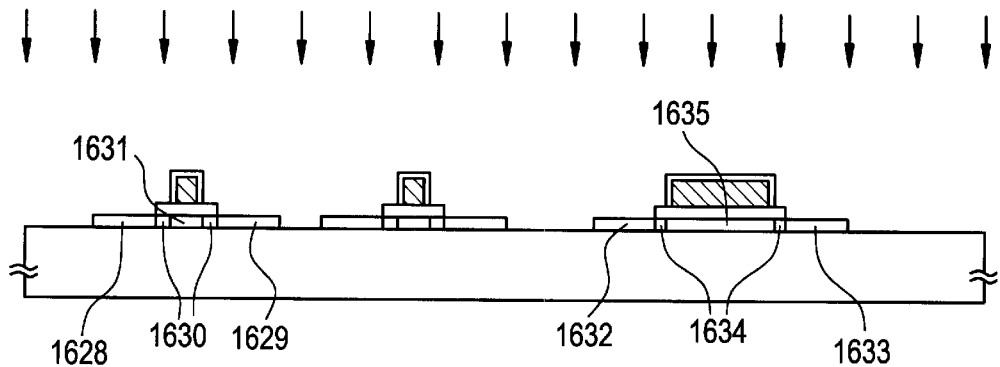

In the state shown in FIG. 17D, the active layer of the P-channel TFT constituting the CMOS circuit has the same structure as the active layer of the N-channel TFT.

Figure 18A:
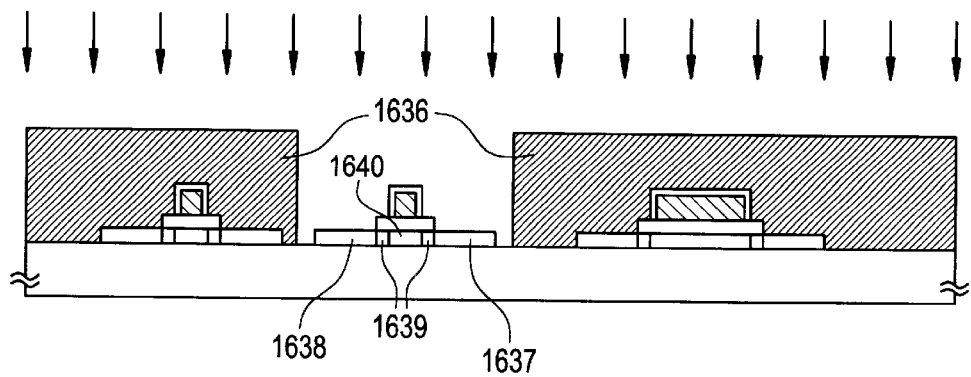
FIGS. 18A, 18B and 18C are views showing the manufacturing method of the liquid crystal display device provided with the D/A conversion circuit according to embodiment 6 of the present invention.

Next, as shown in FIG. 18A, a resist mask 1636 covering the N-channel TFTs is provided, and an impurity ion for giving a P type (boron is used in this embodiment) is added.

Although this step is also divided and is carried out two times like the foregoing adding step of the impurity, since the N-channel type must be inverted to the P-channel type, the B (boron) ion with a concentration several times the foregoing addition concentration of the P ion is added.

In this way, a source region 1637, a drain region 1638, a low concentration impurity region 1639, and a channel formation region 1640 of the P-channel TFT constituting the CMOS circuit are formed (FIG. 18A).

After the active layer is completed in the manner as described above, activation of the impurity ions is made by combination of furnace annealing, laser annealing, lamp annealing, and the like. At the same time, damages of the active layers caused in the adding steps are repaired.

Next, as an interlayer insulating film 1641, a lamination film of a silicon oxide film and a silicon nitride film is formed. Next, after contact holes are formed in the interlayer insulating film, source electrodes 1642, 1643 and 1644, and drain electrodes 1645 and 1646 are formed to obtain the state shown in FIG. 18B. An organic resin film may be used as the interlayer insulating film 1641.

Figure 18B:
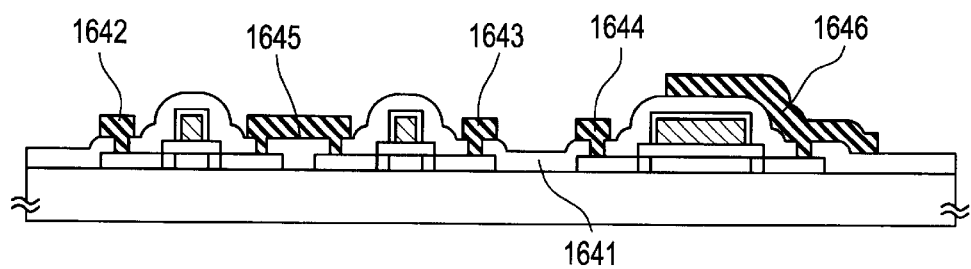

After the state shown in FIG. 18B is obtained, a first interlayer insulating film 1647 made of an organic resin film and having a thickness of 0.5 to 3 μm is formed. Polyimide, acryl, polyimide amide, or the like may be used for the organic resin film. The merits of using the organic resin film are listed as follow: a film forming method is simple, a film thickness is easily made thick, parasitic capacitance can be reduced since its relative dielectric constant is low, and flatness is excellent. An organic resin film other than the above may be used.

Next, a black mask 1648 made of a film with shading properties and having a thickness of 100 nm is formed on the first interlayer insulating film 1647. Although a titanium film is used as the black mask 1648 in this embodiment, a resin film containing black pigments, or the like may be used.

In the case where the titanium film is used for the black mask 1648, part of the wiring line of the driving circuit or other peripheral circuit portions can be formed of titanium. This titanium wiring line can be formed at the same time as the formation of the black mask 1648.

Figure 18C:
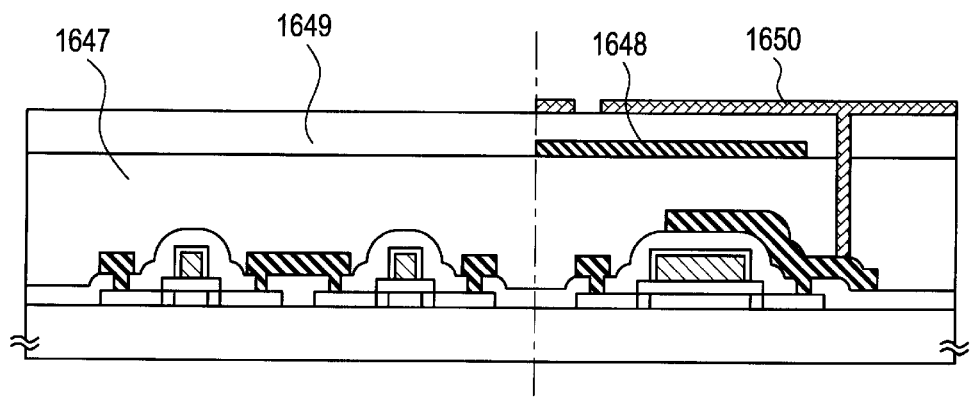

After the black mask 1648 is formed, a second interlayer insulating film 1649 made of one of a silicon oxide film, a silicon nitride film, and an organic resin film, or a lamination film thereof and having a thickness of 0.1 to 0.3 μm is formed. A contact hole is formed in the interlayer insulating film 1647 and the interlayer insulating film 1649, and a pixel electrode 1650 with a thickness of 120 nm is formed. According to the structure of this embodiment, auxiliary capacitance is formed at a region where the black mask 1648 overlaps with the pixel electrode 1650 (FIG. 18C). Since this embodiment relates to an example of a transmission type active matrix liquid crystal display device, a transparent conductive film of ITO or the like is used as a conductive film forming the pixel electrode 1650.

Next, the entire of the substrate is heated in a hydrogen atmosphere at a temperature of 350° C. for 1 to 2 hours to hydrogenate the entire of the device, so that the dangling bonds (unpaired bonds) in the film (especially in the active layer) are compensated. Through the above steps, it is possible to manufacture the CMOS circuit and the pixel matrix circuit on the same substrate.

Figure 19:
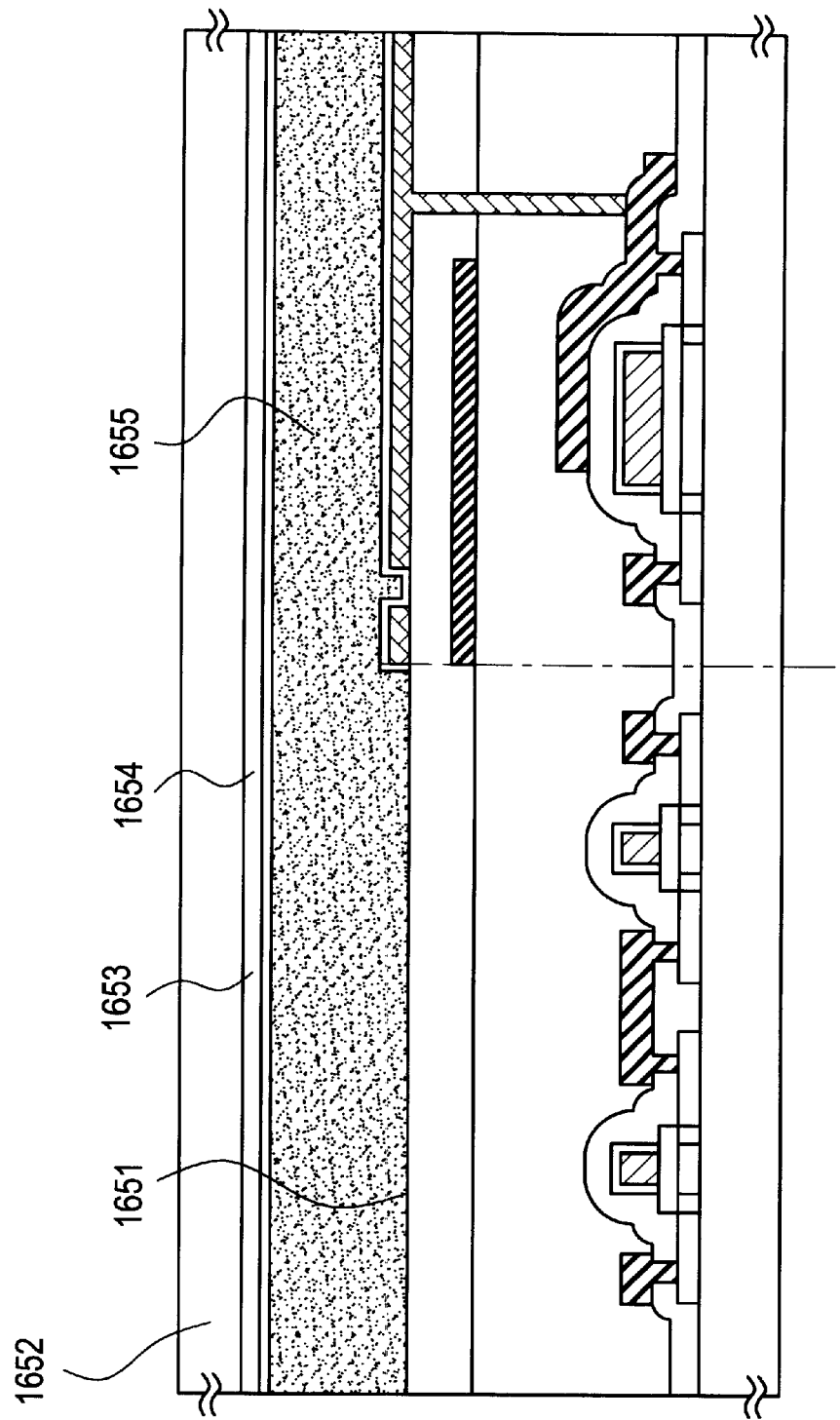
FIG. 19 is a view showing an embodiment of a liquid crystal display device provided with a D/A conversion circuit according to embodiment 6 of the present invention.

Next, as shown in FIG. 19, a step of manufacturing an active matrix type liquid crystal display device on the basis of the active matrix substrate manufactured through the above steps will be described.

An oriented film 1651 is formed on the active matrix substrate in the state of FIG. 18C. In this embodiment, polyimide is used for the oriented film 1651. Next, an opposite substrate is prepared. The opposite substrate is constituted by a glass substrate 1652, a transparent conductive film 1653, and an oriented film 1654.

In this embodiment, such a polyimide film that liquid crystal molecules are oriented parallel to the substrate is used as the oriented film. Incidentally, after the oriented film is formed, a rubbing process is carried out so that the liquid crystal molecules are parallel oriented with a fixed pretilt angle.

Next, the active matrix substrate obtained through the above steps and the opposite substrate are bonded to each other through a sealing material, a spacer (both are not shown), and the like. Thereafter, a liquid crystal material 1655 is injected between both the substrates, and is completely sealed with a sealing agent (not shown). Thus, the transmission type active matrix liquid crystal display device as shown in FIG. 19 is completed.

In this embodiment, the liquid crystal panel is designed to make display with a TN (twisted nematic) mode. Thus, a pair of polarizing plates (not shown) are disposed so that the liquid crystal panel is held between the polarizing plates in cross Nicol (in the state in which polarizing axes of the pair of polarizing plates cross each other at right angles).

Thus, it is seen that in this embodiment, display is made in a so-called normally white mode in which white display is made when a voltage is not applied to the liquid crystal display device.

In the liquid crystal panel of this embodiment, the active matrix substrate is exposed at only an end surface where an FPC is attached, and the remaining three end surfaces are flush.

It is seen that by the foregoing manufacturing method, the D/A conversion circuit of this embodiment can be integrally formed on an insulating substrate, such as a quartz substrate or a glass substrate, together with other driving circuits and other peripheral devices of the active matrix liquid crystal display device. The two P-channel TFTs and two N-channel TFTs connected to each gradation voltage line of the D/A conversion circuit of this embodiment may be formed on the same semiconductor layer. Alternatively, two independent P-channel TFTs and two independent N-channel TFTs may be connected by metal wiring lines through contacts. However, the former is preferable since the area of the D/A conversion circuit can be made smaller.

Here, a semiconductor thin film manufactured according to the manufacturing method of this embodiment will be described. According to the foregoing manufacturing method of this embodiment, it is possible to crystalize an amorphous silicon film and to obtain a crystal silicon film called continuous grain boundary crystal silicon (so-called Continuous Grain Silicon: CGS).

The lateral growth region of the semiconductor thin film obtained through the manufacturing method of this embodiment has a unique crystal structure made of a collective of rod-like or flattened rod-like crystals. The features thereof will be described below.

[Findings as to crystal structure of a lateral growth region]

The lateral growth region formed in accordance with the manufacturing steps of the above-mentioned embodiment has microscopically a crystal structure in which a plurality of rod-like (or flattened rod-like) crystals are arranged in almost parallel to each other and with regularity to a specific direction. This can be easily ascertained by observation with a TEM (Transmission Electron Microscope).

Figure 27:
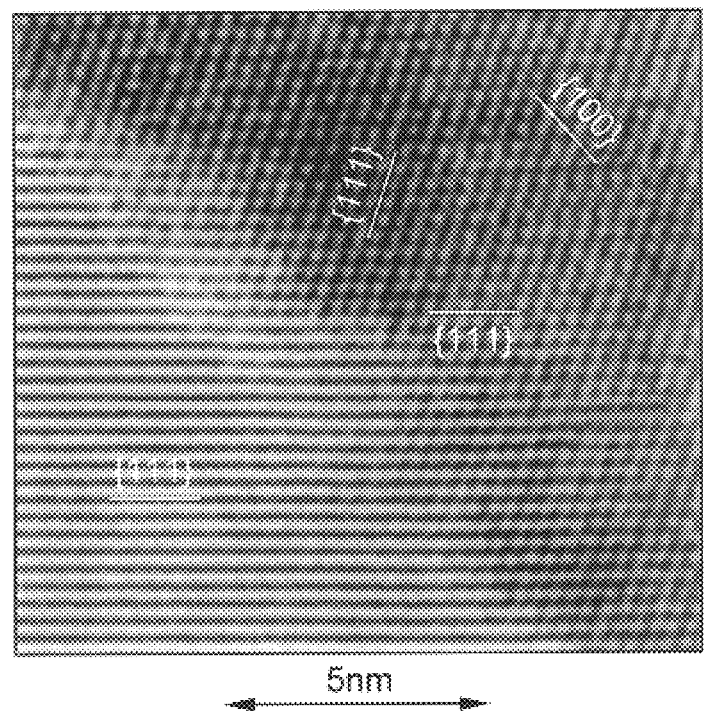
FIG. 27 is a TEM photographic view of CGS according to embodiment 6.

The present inventors observed the crystal grain boundaries of the semiconductor thin film obtained by the manufacturing method of the foregoing embodiment in detail by using an HR-TEM (High Resolution Transmission Electron Microscope) (FIG. 27). In the present specification, the crystal grain boundary is defined as a grain boundary formed at an interface where different rod-like crystals are in contact with each other, unless specified otherwise. Thus, the crystal grain boundary is regarded as different from, for example, a macroscopic grain boundary formed by collision of separate lateral growth regions.

The foregoing HR-TEM (High Resolution Transmission Electron Microscope) is a method in which a sample is vertically irradiated with an electron beam, and the arrangement of atoms and molecules is estimated by using interference of transmitted electrons or elastically scattered electrons. By using this method, it is possible to observe the state of arrangement of crystal lattices as lattice stripes. Thus, by observing the crystal grain boundary, it is possible to infer the bonding state of atoms in the crystal grain boundary.

In the TEM photograph (FIG. 27) obtained by the present inventors, the state where two different crystal grains (rod-like crystal grains) are in contact with each other at the crystal grain boundary is clearly observed. At this time, it is ascertained by electron beam diffraction that the two crystal grains are almost in {110} orientation although some deviations are included in crystal axes.

In the observation of lattice stripes by the TEM photograph as described above, lattice stripes corresponding to a {111} plane are observed in a {110} plane. Incidentally, the lattice stripe corresponding to the {111} plane indicates such a lattice stripe that when a crystal grain is cut along the lattice stripe, the {111} plane appears in the section. In a simplified manner, it is possible to ascertain by the distance between the lattice stripes to what plane the lattice stripe corresponds.

At this time, the present inventors observed in detail the TEM photograph of the semiconductor thin film obtained through the manufacturing method of the foregoing embodiment, and as a result, very interesting findings were obtained. In both of the two different crystal grains seen in the photograph, lattice stripes corresponding to the {111} plane were seen. And it was observed that the lattice stripes were obviously parallel to each other.

Further, irrespective of the existence of the crystal grain boundary, the lattice stripes of the two different crystal grains were connected to each other so as to cross the crystal grain boundary. That is, it was ascertained that almost all lattice stripes observed to cross the crystal grain boundary were linearly continuous with each other in spite of the fact that they were lattice stripes of different crystal grains. This is the case with any crystal grain boundary.

Such a crystal structure (precisely the structure of crystal grain boundary) indicates that two different crystal grains are in contact with each other with excellent conformity at the crystal grain boundary. That is, crystal lattices are continuously connected to each other at the crystal grain boundary, so that such a structure is formed that it is very hard to produce trap levels caused by crystal defects or the like. In other words, it can be said that the crystal lattices have continuity at the crystal grain boundary.

Figure 28:
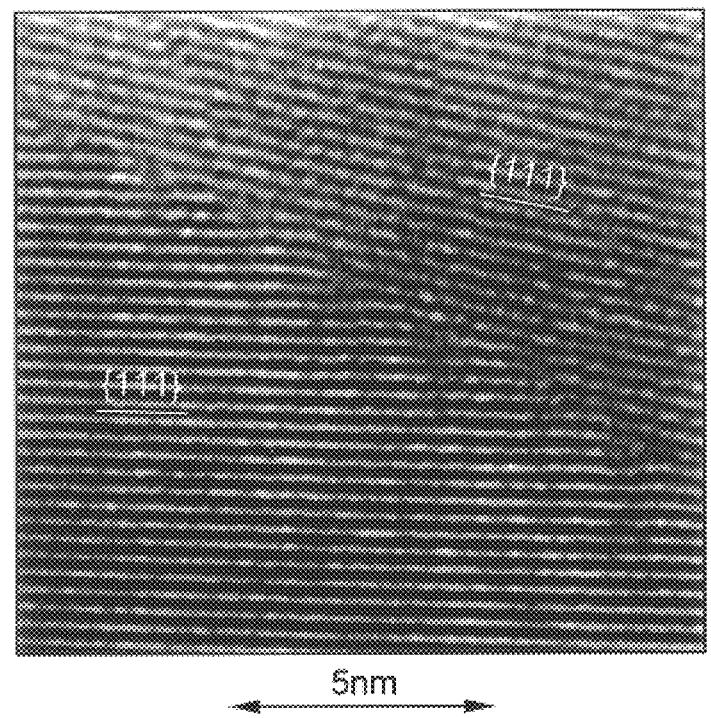
FIG. 28 is a TEM photographic view of high temperature polysilicon according to embodiment 6.

In FIG. 28, for reference, analysis by the electron beam diffraction and HR-TEM observation was carried out by the present inventors for a conventional polycrystalline silicon film (so-called high temperature polysilicon film) as well. As a result, it was found that lattice stripes were random in the two different crystal grains and there hardly existed connection continuous at the crystal grain boundary with excellent conformity. That is, it was found that there were many portions where the lattice stripes were discontinuous at the crystal grain boundary, and there were many crystal defects.

The present inventors refer to the bonding state of atoms in the case where the lattice stripes correspond to each other with good conformity, like the semiconductor thin film used in the liquid crystal panel of the active matrix type liquid crystal display device of the present invention, as conformity bonding, and refers to a chemical bond at that time as a conformity bond. On the contrary, the present inventors refer to the bonding state of atoms in the case where the lattice stripes do not correspond to each other with good conformity, often seen in a conventional polycrystalline silicon film, as unconformity bonding, and refers to a chemical bond at that time as an unconformity bond (or an unpaired bond).

Since the semiconductor thin film used in the present invention is extremely excellent in conformity at the crystal grain, the foregoing unconformity bonds are very few. As the result of study for arbitrary plural crystal grain boundaries conducted by the present inventors, the existing ratio of the unconformity bonds to the total bonds was 10% or less (preferably 5% or less, more preferably 3% or less). That is, 90% or more of the total bonds (preferably 95% or more, more preferably 97% or more) are constituted by the conformity bonds.

Figure 29A:
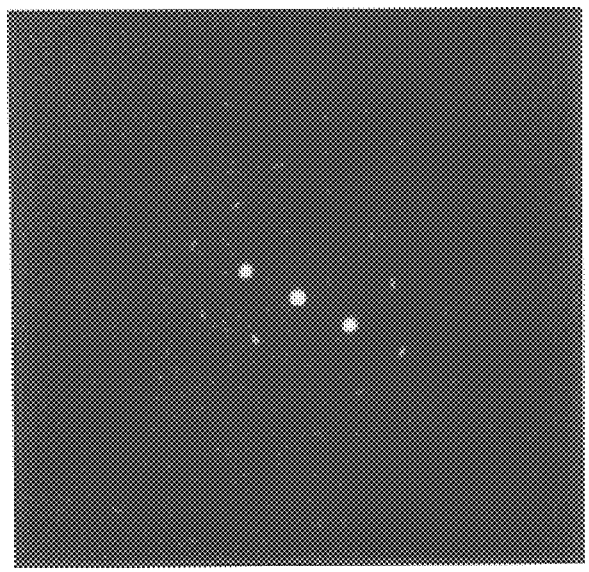
FIGS. 29A and 29B are photographic views showing electron beam diffraction patterns of CGS and high temperature polysilicon according to embodiment 6.
Figure 29B:
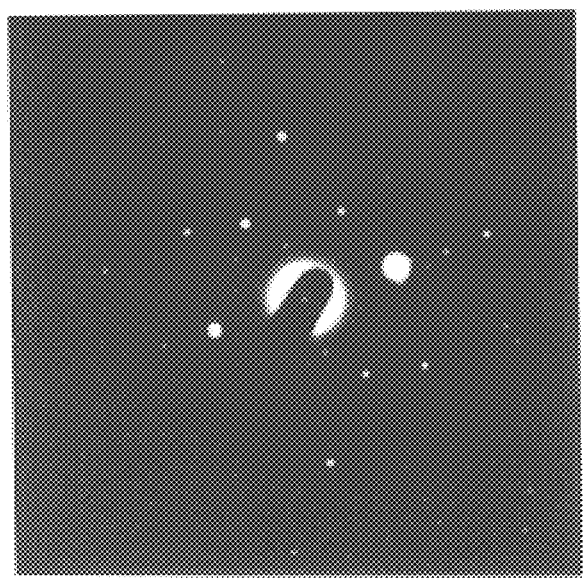

FIG. 29A shows the result of observation by electron beam diffraction for a lateral growth region formed in accordance with the manufacturing steps of this embodiment. FIG. 29B shows an electron beam diffraction pattern of a conventional polysilicon film (what is called a high temperature polysilicon film) observed for comparison.

In the electron beam diffraction patterns shown in FIGS. 29A and 29B, the diameter of an irradiation area of an electron beam is 4.25 $\mu$m, and the information for a sufficiently wide region is collected. The photographs here show typical diffraction patterns in the results of investigation for arbitrary plural portions.

In the case of FIG. 29A, since diffraction spots (diffraction speckles) corresponding to the <110> incidence appear relatively clearly, it can be ascertained that in the irradiation area of the electron beam, almost all crystal grains are oriented in {110}. On the other hand, in the case of the conventional high temperature silicon film shown in FIG. 29B, definite regularity was not seen in the diffraction spots, and it was found that crystal grains with plain orientation other than the {110} plane were irregularly mixed.

Like this, the feature of the semiconductor thin film used in the present invention is that although the semiconductor thin film includes crystal grain boundaries, the semiconductor thin film shows the electron beam diffraction pattern having regularity peculiar to the {110} orientation. When the electron beam diffraction pattern is compared with a conventional one, the difference from the conventional semiconductor thin film is clear.

As described above, the semiconductor thin film manufactured through the manufacturing steps of this embodiment was a semiconductor thin film having a crystal structure (precisely, structure of a crystal grain boundary) quite different from a conventional semiconductor thin film. The present inventors have explained the results of analysis as to the semiconductor thin film used in the present invention also in Japanese Patent Application Nos. Hei. 9-55633, Hei. 9-165216 and Hei. 9-212428.

Moreover, since 90% or more of the crystal grains of the foregoing semiconductor thin film used in the present invention are constituted by the conformity bonds, they have hardly any functions as a barrier for blocking the movement of carriers. That is, it can be said that there are substantially no crystal grain boundaries in the semiconductor thin film used in the present invention.

Although crystal grain boundaries function as barriers for blocking the movement of carriers in a conventional semiconductor thin film, since such crystal grain boundaries do not substantially exist in the semiconductor thin film used in the present invention, high carrier mobility can be realized. Thus, the electrical characteristics of a TFT manufactured by using the semiconductor thin film used in the present invention show extremely excellent values. This will be described below.

[Findings as to electrical characteristics of a TFT]

Since the semiconductor thin film used in the present invention can be regarded substantially as a single crystal (crystal grain boundaries do not exist substantially), a TFT using the semiconductor thin film as an active layer shows electrical characteristics comparable to a MOSFET using single crystal silicon. Data as shown below are obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFT.

(2) The field effect mobility ($\mu_{FE}$) as an index showing an operation speed of a TFT is as large as 200 to 650 cm$^2$/Vs (typically 250 to 300 cm$^2$/Vs) for an N-channel TFT, and 100 to 300 cm$^2$/Vs (typically 150 to 200 cm$^2$/Vs) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, it is ascertained that the TFT obtained in the present invention can realize extremely superior switching characteristics and high speed operation characteristics.

Incidentally, in the formation of the CGS, the foregoing annealing step at a temperature (700 to 1100° C.) above the crystallizing temperature plays an important role with respect to lowering of defects in crystal grains. This will be described below.

Figure 30A:
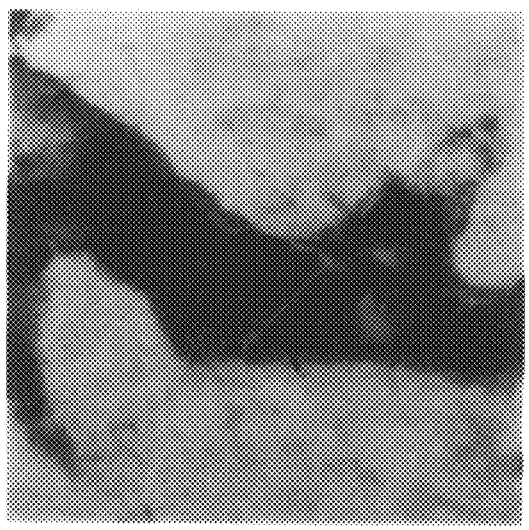
FIGS. 30A and 30B are TEM photographic views of CGS and high temperature polysilicon according to embodiment 6.

FIG. 30A is a TEM photograph of a crystalline silicon film at the point of time when steps up to the foregoing crystallizing step have been completed, which is magnified 250 thousands times. Zigzag defects as indicated by arrows are ascertained in the crystal grain (a black portion and a white portion appear due to the difference in contrast).

Although such defects are mainly lamination defects in which the order of lamination of atoms on a silicon crystal lattice plane is discrepant, there is also a case of dislocation or the like. It appears that FIG. 30A shows the lamination defects having a defect plane parallel to the {111} plane. This can be ascertained from the fact that the zigzag defects are bent at about 70°.

Figure 30B:
Figure 31:
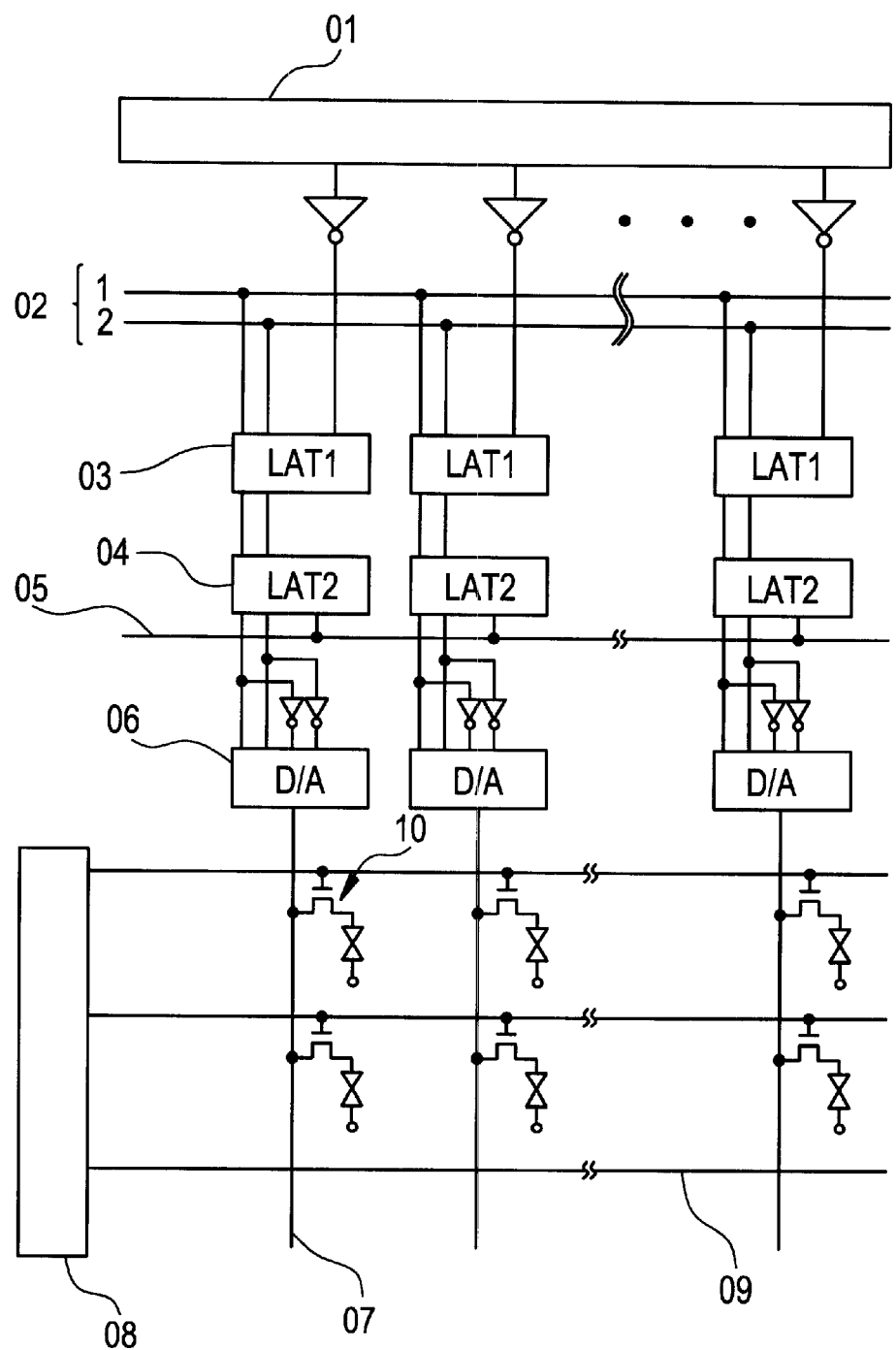
FIG. 31 is a schematic structural view of a conventional liquid crystal display device.
Figure 32:
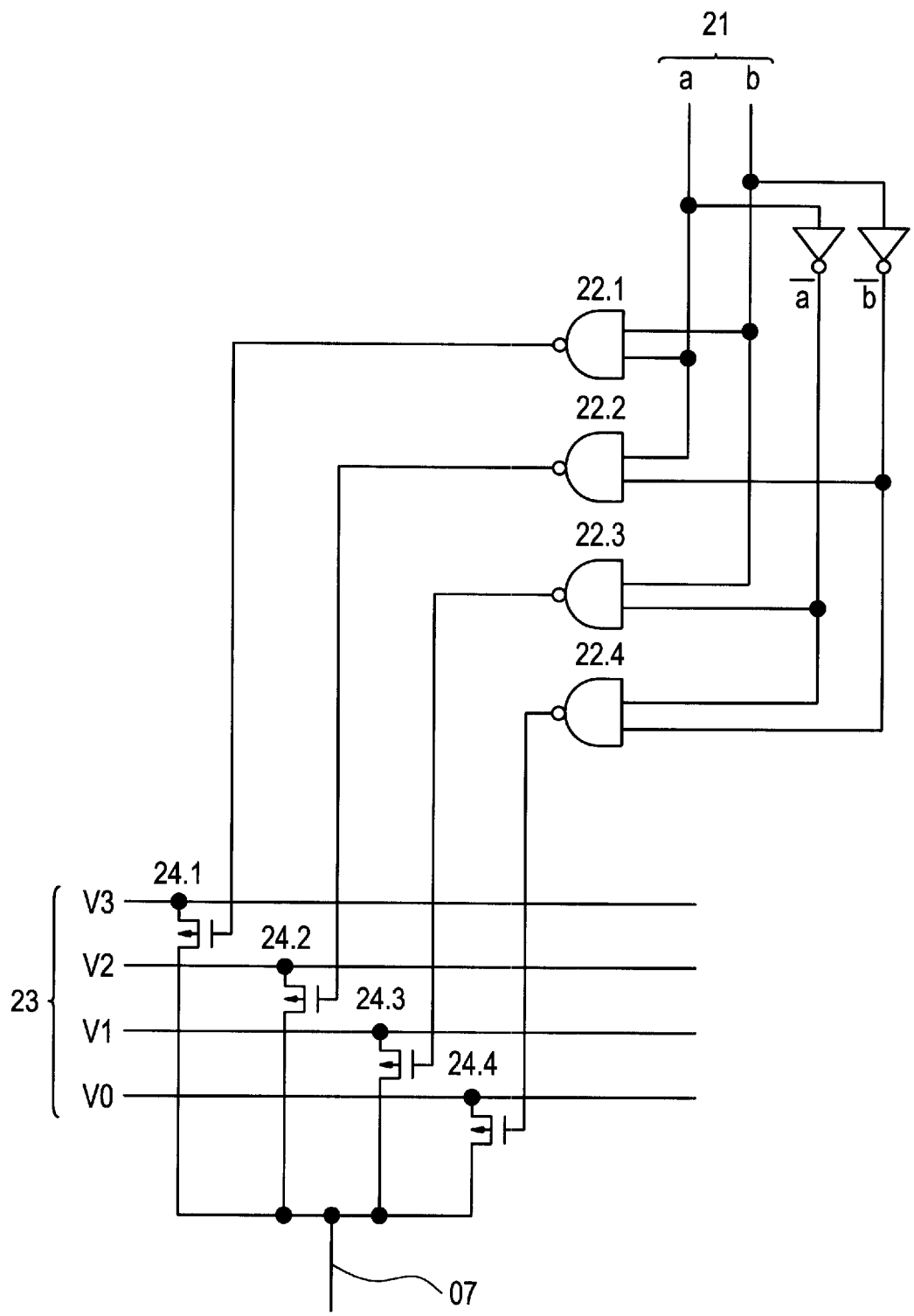
FIG. 32 is a circuit diagram of a conventional D/A conversion circuit.
Figure 33A:
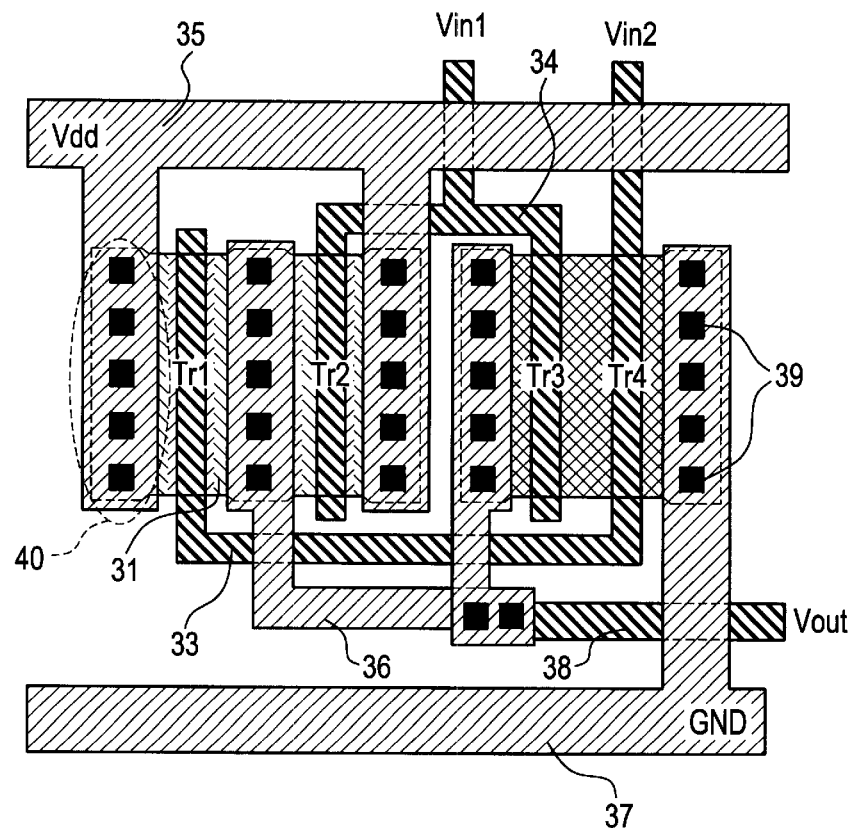
FIGS. 33A and 33B are a conventional circuit pattern diagram of a NAND circuit and its equivalent circuit diagram, respectively.
Figure 33B:
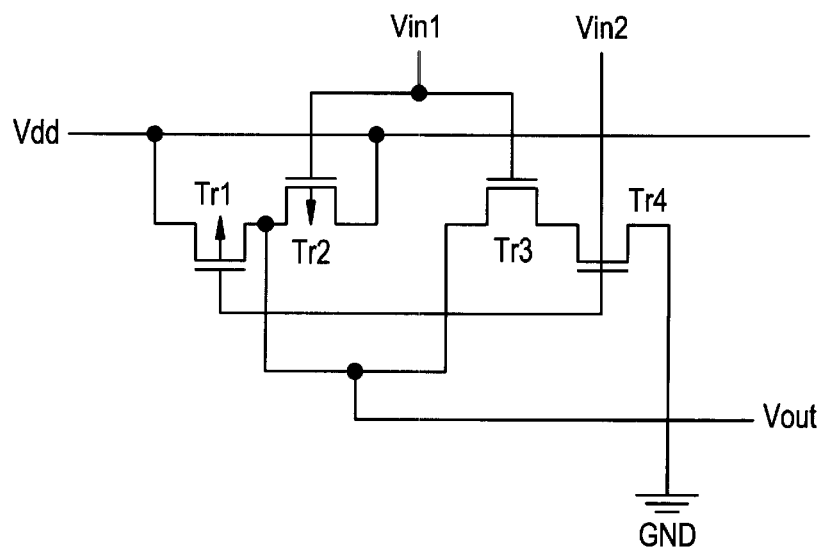
Figure 34:
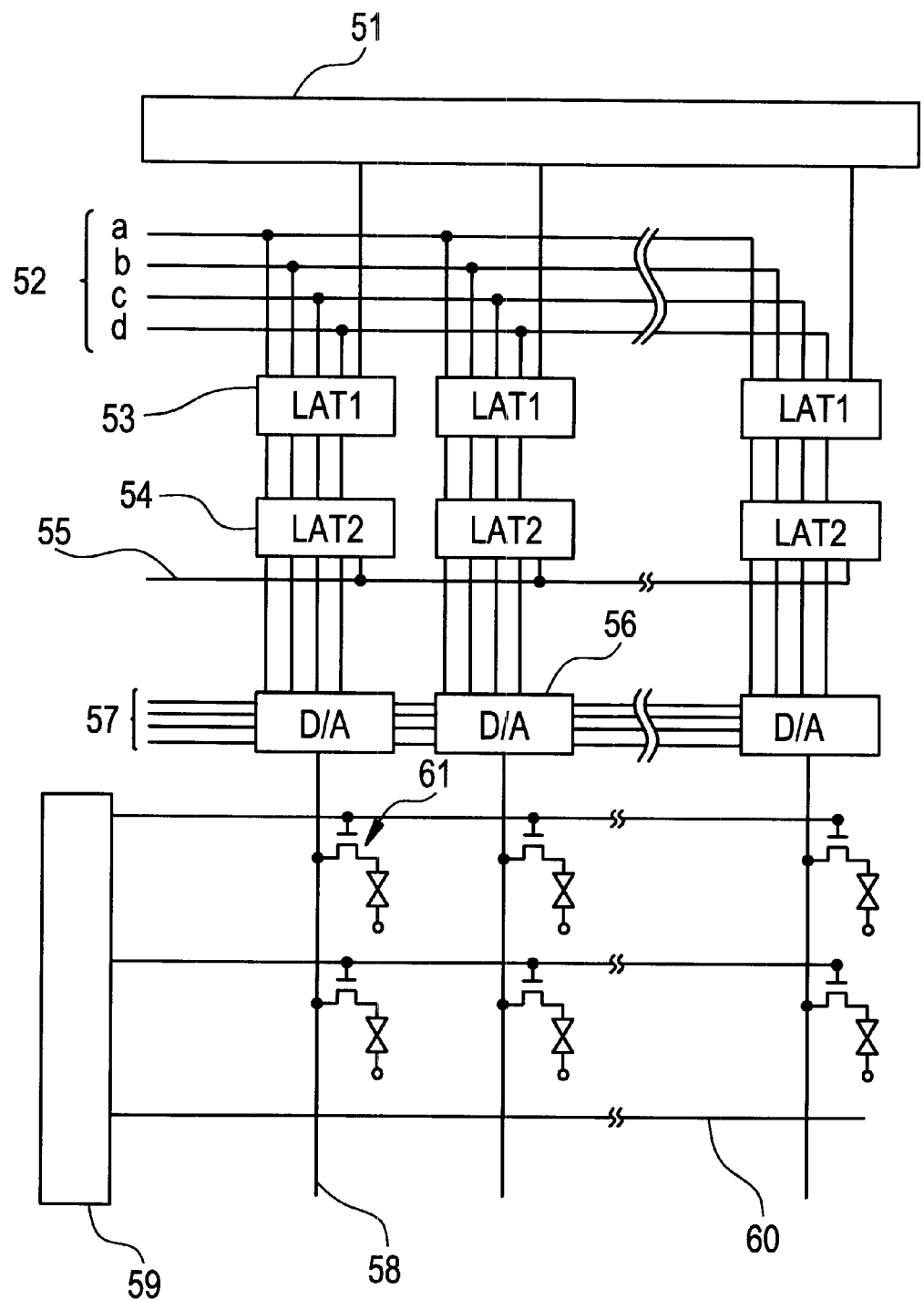
FIG. 34 is a structural view of a conventional digital driving system liquid crystal display device.
Figure 35:
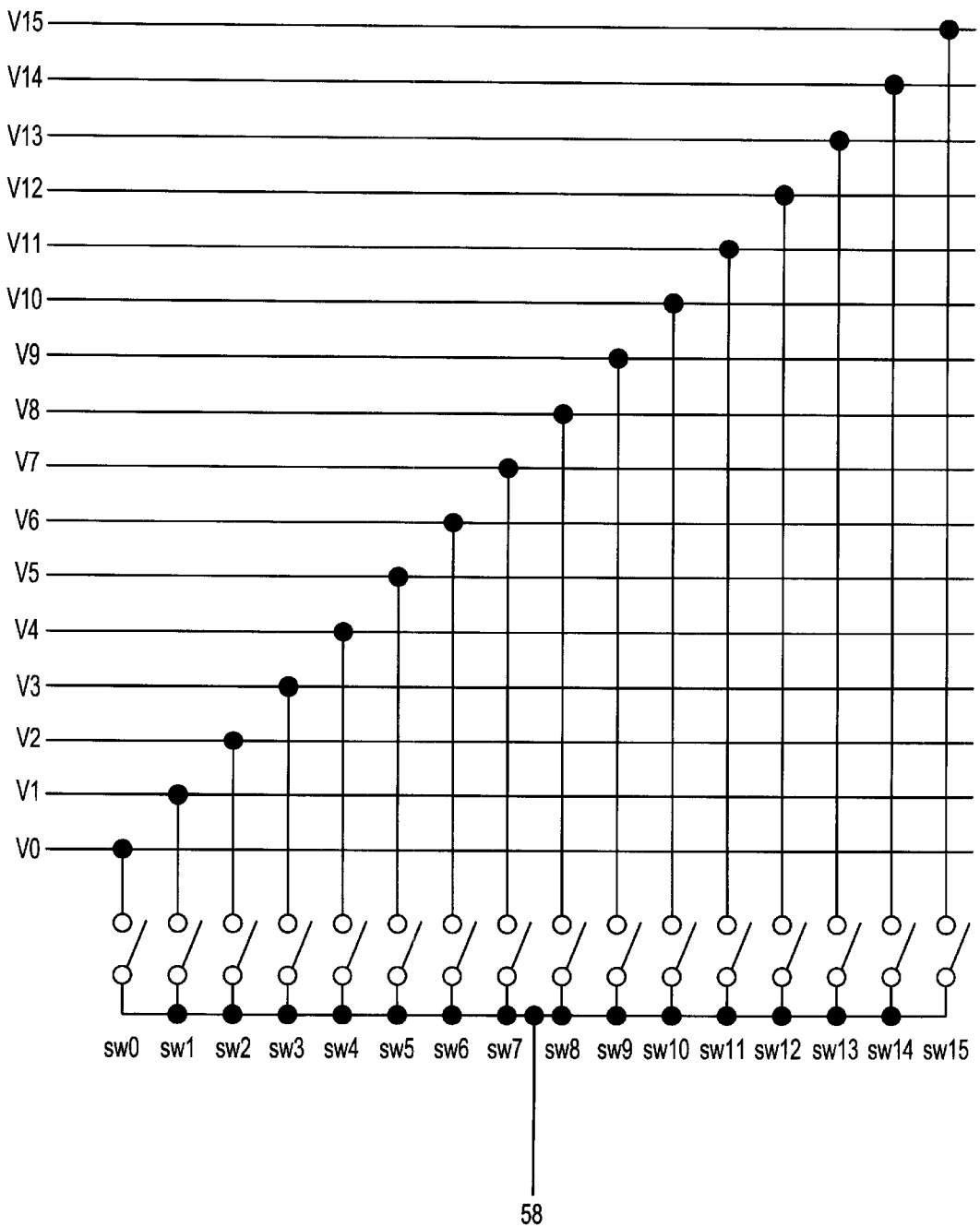
FIG. 35 is a view showing a conventional D/A conversion circuit used in a conventional digital driving system liquid crystal display device.
Figure 36:
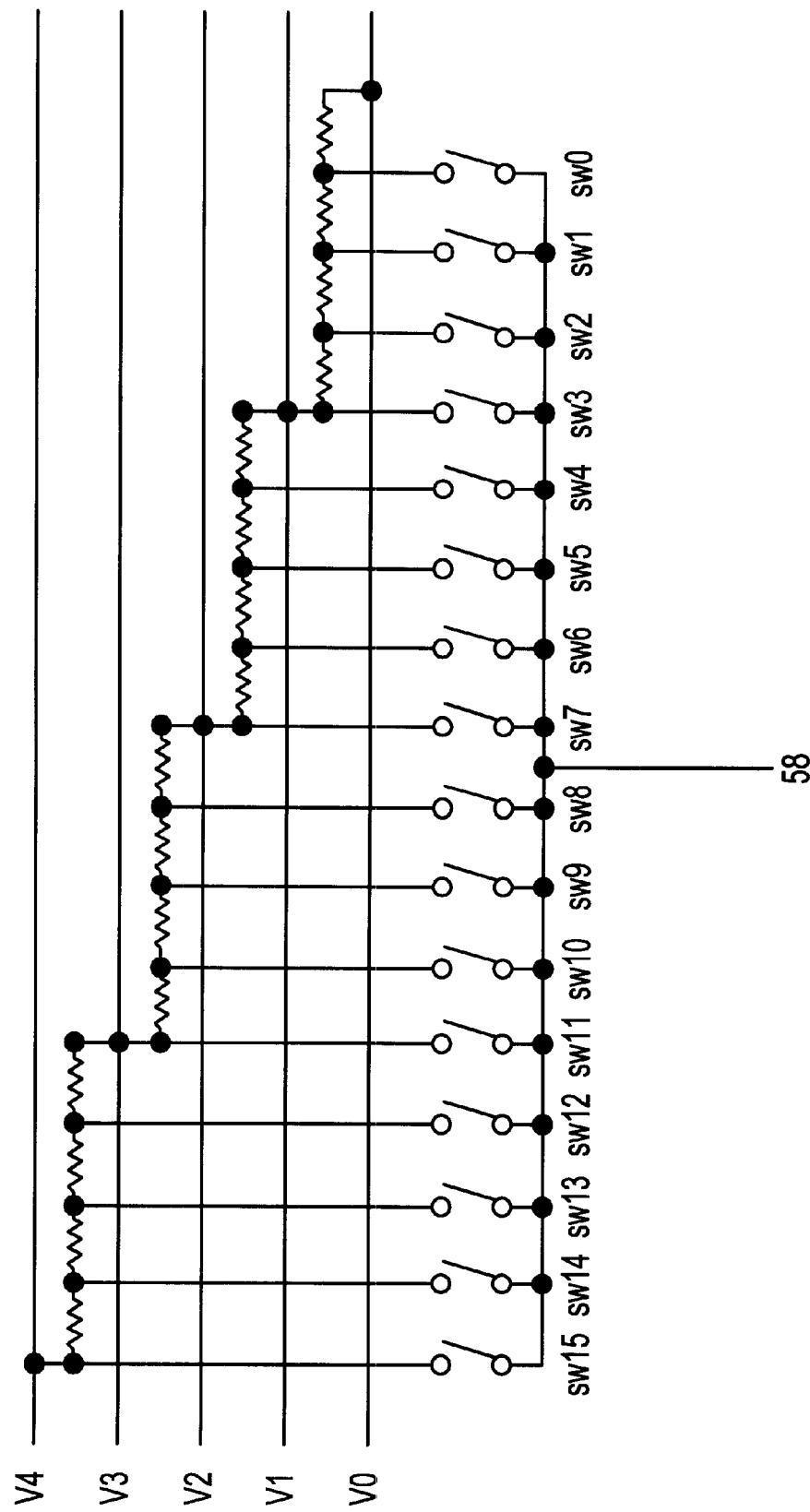
FIG. 36 is a view showing a conventional D/A conversion circuit used in a conventional digital driving system liquid crystal display device.

On the other hand, as shown in FIG. 30B, in the crystalline silicon film used in the present invention, which is magnified at the same magnification, it is ascertained that there are hardly seen defects caused by lamination defects, dislocations, and the like, and the crystallinity is very high. This tendency can be seen in the entire of the film surface, and although it is difficult to reduce the number of defects to zero in the present circumstances, it is possible to lower the number to substantially zero.

That is, in the crystalline silicon film used in the liquid crystal panel of the active matrix type liquid crystal display device of the present invention, defects in the crystal grain are reduced to the degree that the defects can be almost neglected, and the crystal grain boundary can not become a barrier against movement of carriers because of the high continuity, so that the film can be regarded as a single crystal or substantially a single crystal.

As described above, in the crystalline silicon films shown in the photographs of FIGS. 30A and 30B, although the crystal grain boundaries have almost equal continuity, there is a large difference in the number of defects in the crystal grain. The reason why the crystalline silicon film shown in FIG. 30B shows electrical characteristics much higher than the crystalline silicon film shown in FIG. 30A is mainly the difference in the number of defects.

From the above, it is seen that the gettering process of a catalytic element is an indispensable step in the formation of the CGS. The present inventors consider the following model for a phenomenon occurring in this step.

First, in the state shown in FIG. 30A, the catalytic element (typically nickel) is segregated at the defects (mainly lamination defects) in the crystal grain. That is, it is conceivable that there are many bonds having form such as Si—Ni—Si.

However, when Ni existing in the defects is removed by carrying out the gettering process of the catalytic element, the bond of Si—Ni is cut. Thus, the remaining bond of silicon immediately forms Si—Si bond and becomes stable. In this way, the defects disappear.

Of course, although it is known that the defects in a crystalline silicon film disappear by thermal annealing at a high temperature, it can be presumed that since bonds with nickel are cut and many unpaired bonds are generated, so that recombination of silicon is smoothly carried out.

The present inventors consider also a model in which the crystalline silicon film is bonded to its under layer by a heat treatment at a temperature (700 to 1100° C.) above the crystallizing temperature and adhesiveness is increased, so that the defects disappear.

The thus obtained crystalline silicon film (FIG. 30B) has the feature that the number of defects in the crystal grain is extremely smaller than that in the crystalline silicon film (FIG. 30A) in which merely crystallization is carried out. This difference in the number of defects appears as the difference in spin density by an electron spin resonance analysis (Electron Spin Resonance: ESR). In the present circumstances, the spin density of the crystalline silicon film used in the present invention is at most $1 \times 10^{18}$ spins/cm$^3$ (typically $5 \times 10^{17}$ spins/cm$^3$ or less).

The crystalline silicon film having the above described crystal structure and the features, which is used in the present invention, is called a continuous grain boundary crystal silicon (Continuous Grain Silicon: CGS).

[Embodiment 7]

In this embodiment, another example of the D/A conversion circuit of the present invention will be described. In this embodiment, although description will be made to a 8-bit D/A conversion circuit as an example, the present invention is not limited to this, but a D/A conversion circuit which processes a signal of two or more bits can be realized.

In this embodiment, a D/A conversion circuit installed in a driving circuit of a liquid crystal display device in which the number of pixels is 1920×1080 in horizontal and vertical is quoted as an example and its description will be made.

Figure 11A:
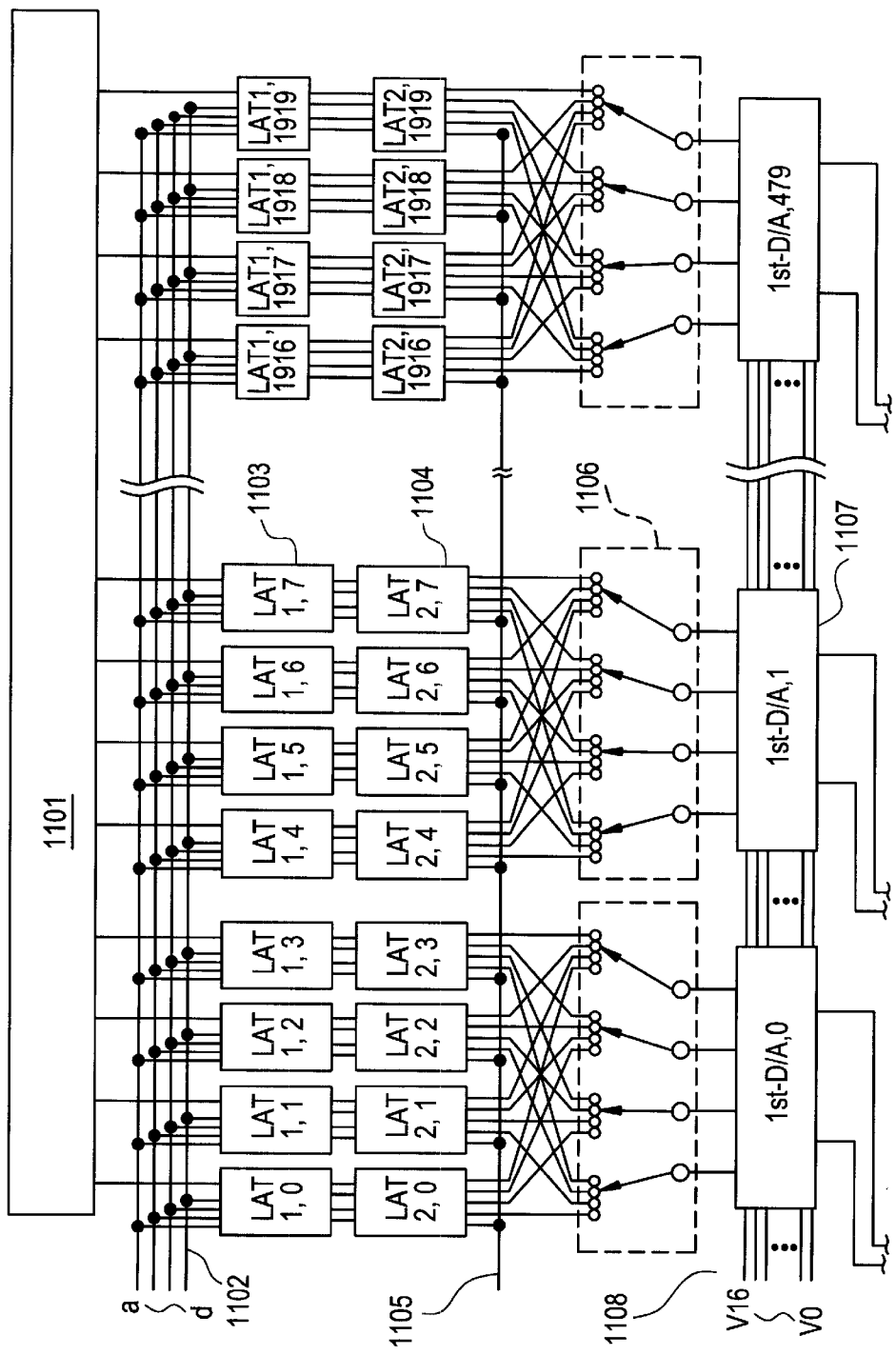
FIG. 11 is a structural view of an active matrix type liquid crystal display device with a D/A conversion circuit according to embodiment 7 of the present invention.
Figure 11B:
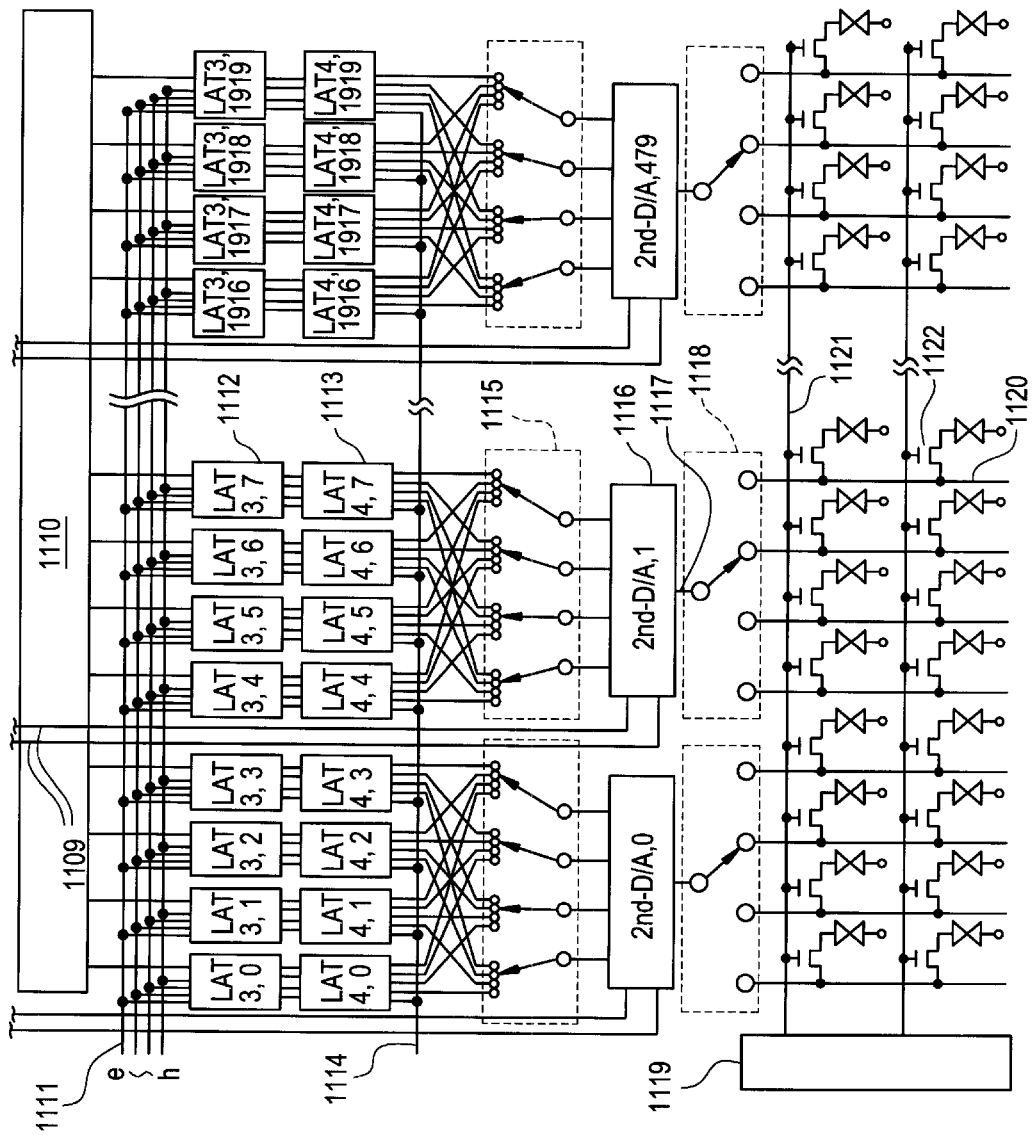

FIG. 11 is a schematic structural view of a liquid crystal display device of this embodiment. The liquid crystal display device of this embodiment is made up of a first source signal line side shift register 1101, address lines (a, b, c, d) 1102 of a digital decoder, latch circuits (LAT1.0 to LAT1.1919) 1103, latch circuits (LAT2.0 to LAT2.1919) 1104, a latch pulse line 1105, switching circuits 1106, a first D/A conversion circuit (1st-D/A.0 to 1st-D/A.479) 1107, gradation voltage lines (V0 to V16) 1108, first output lines 1109 (1109-1 and 1109-2) of the first D/A conversion circuit, a second source signal line side shift register 1110, address lines (e, f, g, h) 1111 of the digital decoder, latch circuits (LAT3.0 to LAT3.1919) 1112, latch circuits (LAT4.0 to LAT4.1919) 1113, a latch pulse line 1114, switching circuits 1115, second D/A conversion circuits (2nd-D/A.0 to 2nd-D/A.479) 1116, second output lines 1117 of the second D/A conversion circuits, switching circuits 1118, a gate signal line side shift register 1119, source signal lines 1120, gate signal lines (scanning lines) 1121, pixel TFTs 1122, and the like.

In a 8-bit digital signal supplied from the outside, the upper 4-bit digital signal is supplied to the address lines a, b, c, and d, and the lower 4-bit digital signal is supplied to the address lines e, f, g, and h.

Different voltages are supplied to the 17 gradation voltage lines (V0 to V16) 1108 by resistance-division of a voltage applied between the gradation voltage lines V0 to V16. A higher voltage is applied to the gradation voltage line V16 than the gradation voltage line V0. That is, also in this embodiment, similarly to the embodiment 1, voltages applied to the gradation voltage lines become high in the order of gradation voltage lines V0, V1 . . . , V15, V16.

Since a step in which the first source signal line side shift register 1101 sequentially supplies latch signals to the latch circuits 1103 (LAT1.0 to LAT1.1919), the latch circuits 1103 take in digital signals from the address lines 1102 (a, b, c, d) at the timing of input of the latch signals, and hold the digital signals, and a step in which a latch signal is inputted to the latch circuits 1104 (LAT2.0 to LAT2.1919), the digital signals are entered from the latch circuit 1103, and are held, are in accordance with the embodiment 6, their explanation will be omitted here.

The 4-bit digital signals entered in and held by the latch circuits 1104 (LAT2.0 to LAT2.1919) are inputted to the switching circuit 1106. In this embodiment, the first D/A conversion circuits 1107 and the second D/A conversion circuits 1116 are respectively provided for every four source signal lines. Thus, selection of the latch circuits by the switching circuit 1106 is necessary. Actually, each latch circuit is selected for every fourth line period. Please refer to the details of the function of the switching circuit 1106 is disclosed in Embodiment 1 of Japanese Patent Application No. Hei. 9-286098 by the present applicant.

In this embodiment, since a set of D/A conversion circuits (the first D/A conversion circuit 1107 and the second D/A conversion circuit 1116) are provided for the four source signal lines, each of the four latch circuits LAT2.0 to LAT3 is selected by the switching circuit 1106 for fourth period of one line period, and a 4-bit digital signal is supplied to the first D/A conversion circuit (1st-D/A.0) 1107.

The 4-bit digital signal is converted into a gradation voltage by the first D/A conversion circuit 1107 and is supplied to the second D/A conversion circuit 1116.

Since a step in which the second source signal line side shift register 1110 sequentially supplies latch signals to the latch circuits 1112 (LAT3.0 to LAT3.1919), the latch circuits take in digital signals from the address lines 1111 (e, f, g, h) at the timing of input of the latch signals, and hold the digital signals, and a step in which a latch signal is inputted to the latch circuits 1113 (LAT4.0 to LAT4.1919), the digital signals are entered from the latch circuits 1112, and are held, are in accordance with the embodiment 6, their explanation will be omitted here. Also in this embodiment, the timing when the first source signal line side shift register 1101 transmits the latch signal to the latch circuit 1103 (LAT1.0 to LAT1.1919) is the same as the timing when the second source signal line side shift register 1110 transmits the latch signal to the latch circuit 1112 (LAT3.0 to LAT3.1919).

The 4-bit digital signals entered in and held by the latch circuits (LAT4.0 to LAT4.1919) are inputted to the switching circuits 1115. Also here, selection of the latch circuits by the switching circuit 1115 is necessary. The latch circuit is selected for every fourth line period. In this way, the 4-bit digital signals are sequentially entered in the second D/A conversion circuits 1116 from the latch circuits.

The second D/A conversion circuit 1116 supplies a gradation voltage according to the input digital signal to the output line 1117.

Figure 12:
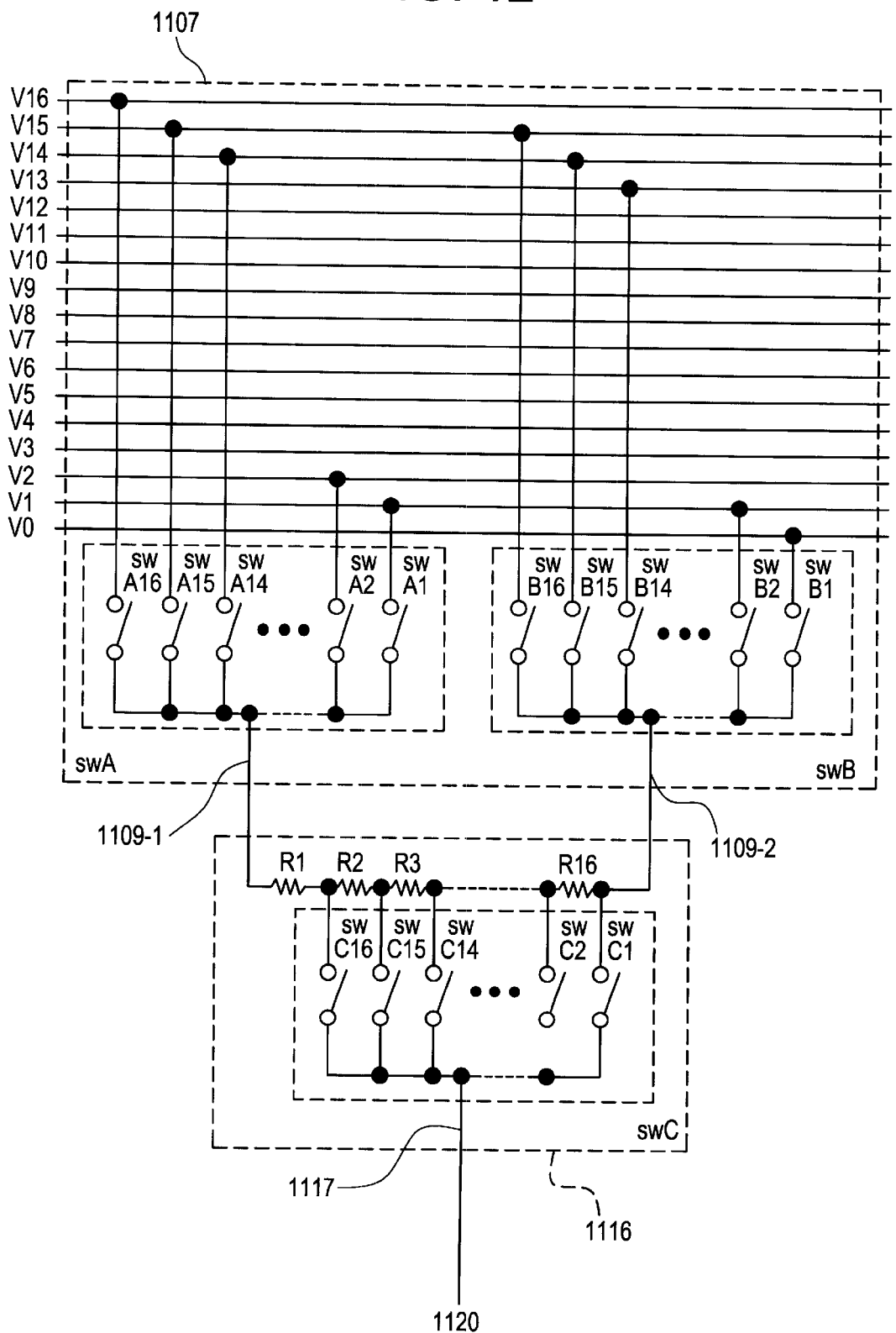
FIG. 12 is a structural view of a D/A conversion circuit according to embodiment 7 of the present invention.

Here, the first and second D/A conversion circuits of this embodiment will be described. FIG. 12 is a schematic view of the first D/A conversion circuit 1107 and the second D/A conversion circuit 1116. First, with reference to FIG. 12, the operation of the first D/A conversion circuit 1107 and the second D/A conversion circuit 1116 will be described.

The first D/A conversion circuit 1107 is made up of a switch circuit swA including sixteen switches (swA1 to swA16), a switch circuit swB including sixteen switches (swB1 to swB16), and seventeen gradation voltage lines (V0 to V16). The second D/A conversion circuit 1116 is made up of a switch circuit swC including sixteen switches (swC1 to swC16) and sixteen resistors (R1 to R16). Here, the intrinsic resistance of a wiring line itself is not taken into consideration.

In the first D/A conversion circuit 1107, the 4-bit digital signals supplied from the address lines a, b, c and d through the latch circuits selected by the switching circuit 1106 control the switch circuits swA and swB. In the sixteen switches (swA1 to swA16) of the switch circuit swA, according to the digital gradation signal supplied from the address lines a, b, c, and d through the latch circuit, only one of the switches is closed, and two or more switches are not closed at the same time. Also in the sixteen switches (swB1 to swB16) of the switch circuit swB, according to the digital signal supplied from the address lines a, b, c, and d through the latch circuit, only one of the switches is closed, and two or more switches are not closed at the same time. Further, the timing when the four switches of the switch circuit swA are closed and the timing when the four switches of the switch circuit swB have the following relation. That is, it is designed such that when the switch swA1 is closed, the switch swB1 is closed, when the switch swA2 is closed, the switch swB2 is closed, when the switch swA3 is closed, the switch swB3 is closed, and when the switch swA4 is closed, the switch swB4 is closed. With respect to other switches as well, the switch swAn and the switch swBn ($1 \leq n \leq 16$; n is a natural number) are closed at the same time. Thus, by the switch circuits swA and swB, two adjacent gradation voltage lines are always selected. In this way, two adjacent gradation voltage lines are selected by the switch circuits swA and swB, and are supplied to the first output line (H) 1109-1 and the first output line (L) 1109-2.

In the second D/A conversion circuit 1116, the 4-bit digital signals supplied from the address lines e, f, g and h through the latch circuits control the switch circuit swC. In the sixteen switches (swC1 to swC16), according to the digital signal supplied from the address lines e, f, g, and h, only one switch is closed.

Sixteen different gradation voltages are formed by sixteen resistors (R1 to R16) from the gradation voltage supplied to the first output line (H) 1109-1 and the gradation voltage supplied to the first output line (L) 1109-2. One of the sixteen switches of the switch circuit swC is closed and the corresponding gradation voltage is supplied to the second output line 1117. The gradation voltage supplied to the second output line 1117 is supplied to the source signal line 1120 through a buffer (not shown) or the like.

Thus, in this embodiment, the upper four bits of the 8-bit digital signal can select sixteen gradation voltages, and the lower four bits thereof can output sixteen gradation voltages from the selected gradation voltages. Thus, it is possible to select 16 (upper four bits)×16 (lower four bits)=256 gradation voltages.

Figure 13:
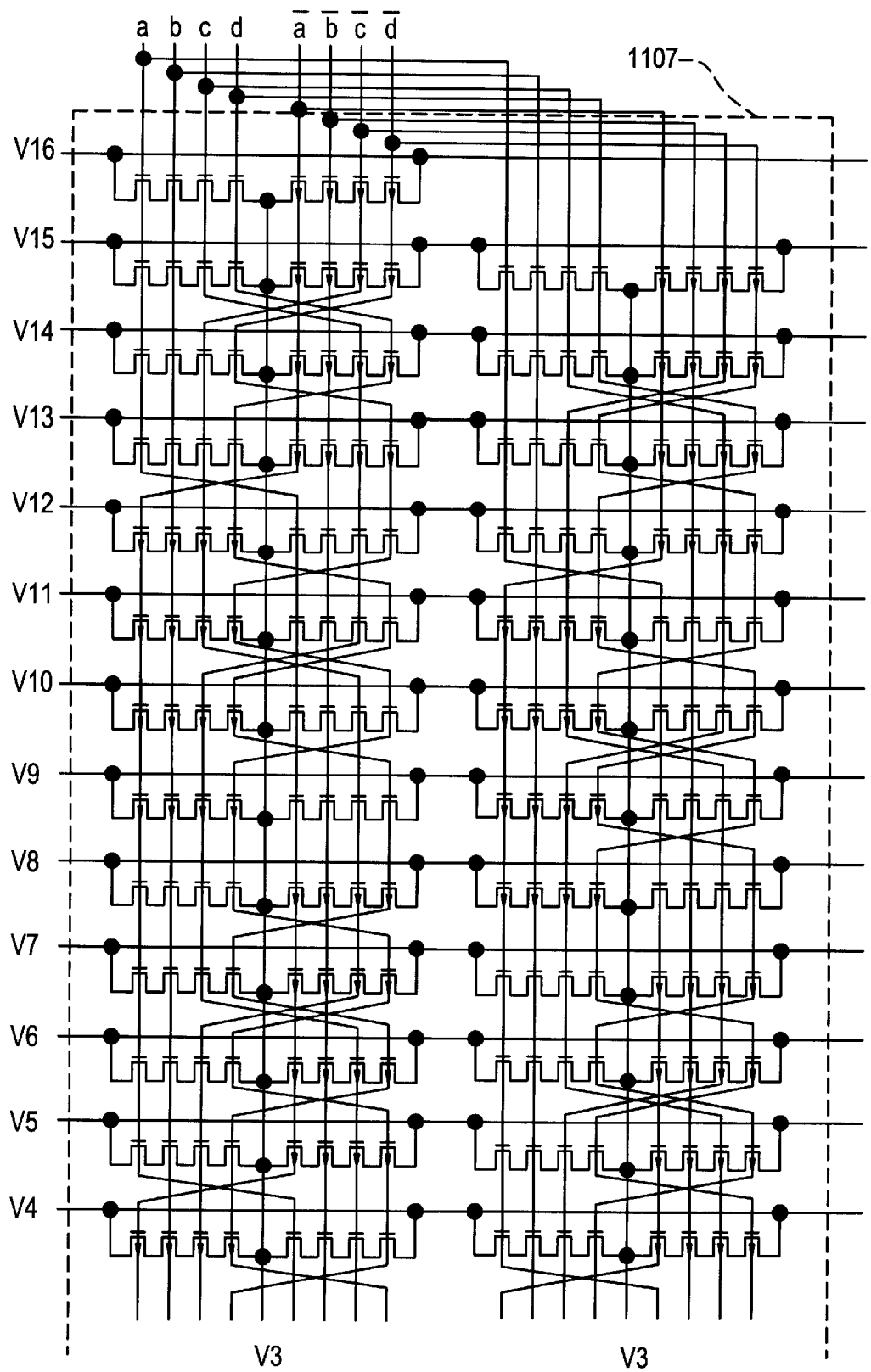
FIG. 13 is a view showing an example of a D/A conversion circuit according to embodiment 7 of the present invention.
Figure 14:
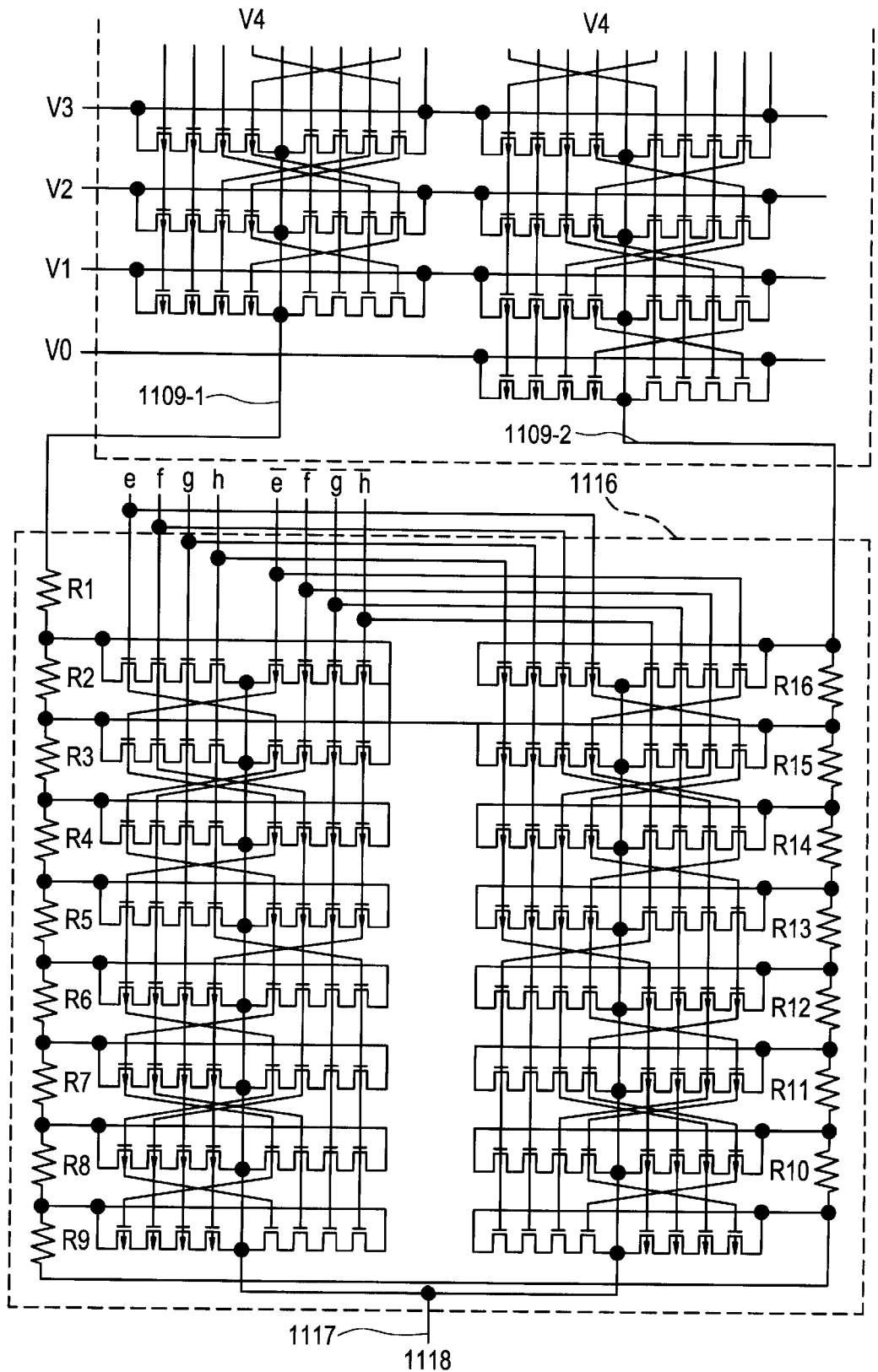
FIG. 14 is a view showing an example of a D/A conversion circuit according to embodiment 7 of the present invention.

FIGS. 13 and 14 show an example of the circuit structure of the first D/A conversion circuit 1107 and the second D/A conversion circuit 1116 of this embodiment.

Figure 15:
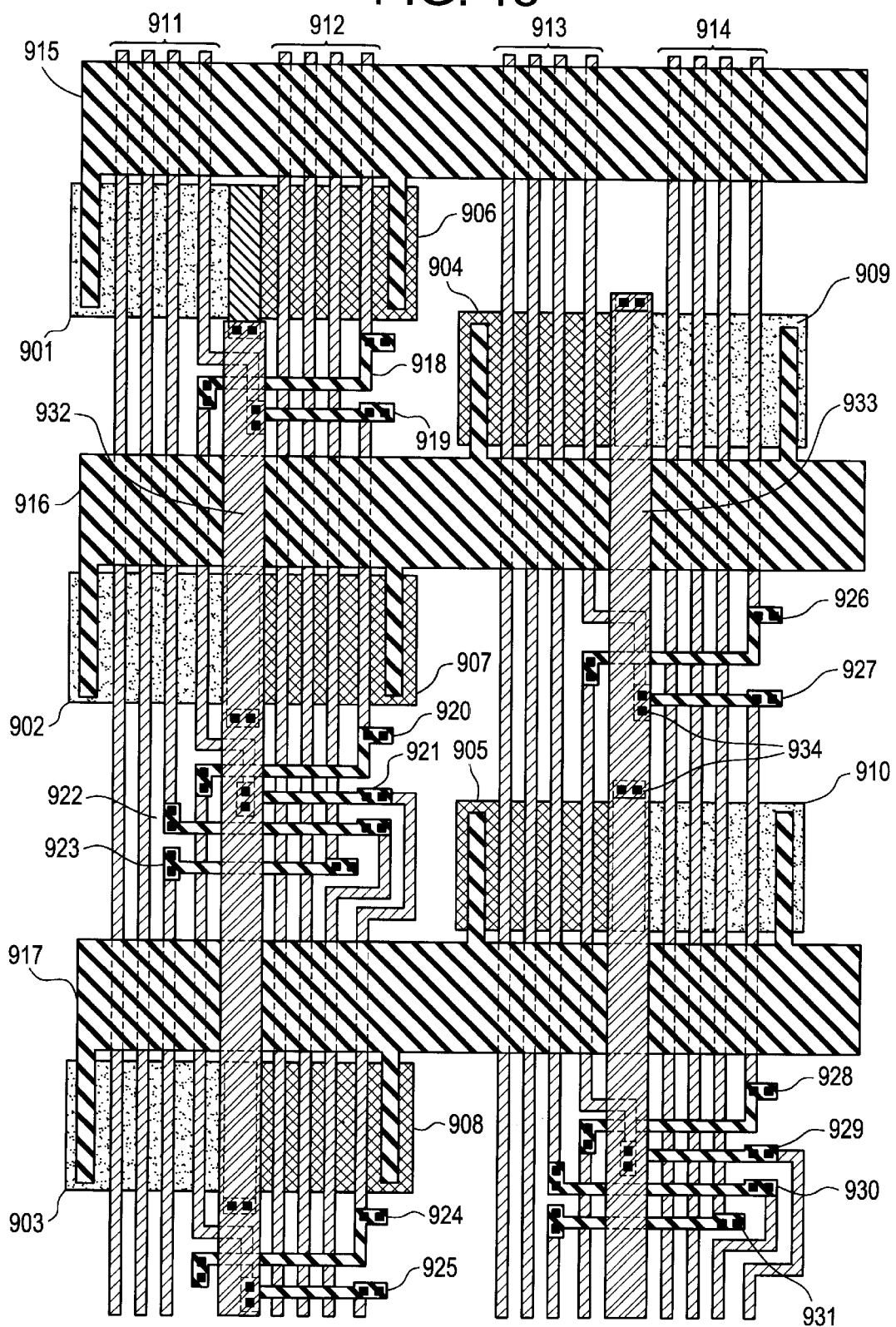
FIG. 15 is a circuit pattern diagram of a D/A conversion circuit according to embodiment 7 of the present invention.

FIG. 15 shows a part of the circuit pattern of the DIA conversion circuits of this embodiment shown in FIGS. 13 and 14 (a part of the circuit pattern of the first D/A conversion circuit 1107 shown in FIG. 13). In FIG. 15, reference numeral 901 to 905 denote semiconductor active layers added with N-type impurities. Reference numerals 906 to 910 denote semiconductor active layers added with P-type impurities. Reference numeral 911 to 914 denote gate electrode wiring lines, and Al (aluminum) containing Sc (scandium) of 2 wt % is used in this embodiment. Reference numeral 915 to 917 and 918 to 931 denote second wiring lines, and Al is used in this embodiment. Reference numerals 932 and 933 denote third wiring lines. Blackened portions typically denoted by reference numeral 934 are portions where connection (contact) between the gate electrode and the second wiring line or between the second wiring line and the third wiring line is made.

In the drawing, wiring lines with the same pattern are positioned at the same wiring layer. In the drawing, portions indicated by broken lines denote lower wiring lines concealed with upper wiring lines.

Reference numeral 915 denotes a gradation voltage line V16, 916 denotes a gradation voltage line V15, and 917 denotes a gradation voltage line V14.

In this embodiment, although the third wiring line is formed at the same time as a BM (black mask) layer at the side of the active matrix substrate of the liquid crystal display device, it may be formed by using another wiring layer. In that case, it is desirable to change its line width and its film thickness in accordance with a material (Al, Ti, etc.) used. For example, in the case where Ti is used as a material of the third wiring line, since the resistivity of Ti is higher than that of Al, it is desirable to thicken the line width or to thicken the film thickness. A lamination structure of two or more kinds of metals, for example, Al and Ti, may be used.

Here, the D/A conversion circuit of this embodiment will be compared with a conventional D/A conversion circuit. As is seen from FIG. 12 as well, in the 8-bit D/A conversion circuit of this embodiment, the number of gradation voltage lines is 17, and the number of switches is 48. In a conventional 8-bit D/A conversion circuit, the number of gradation voltages is 256 or 17, and the number of switches is also 256. Thus, as compared with the conventional D/A conversion circuit, the number of switches can be extremely decreased, so that the area can be made small, and the miniaturization of the entire of the driving circuit can be realized. Further, since the miniaturization of the D/A conversion circuit can be realized, the improvement of fineness of the active matrix liquid crystal display device can also be realized.

In this embodiment, although a 8-bit digital signal is divided into the upper four bits and the lower four bits, and each controls switching of the switch circuits swA and swB, and the switch circuit swC, the division of the 8-bit digital signal is not limited to this. For example, it is also possible to divide the 8-bit digital signal into the upper six bits and the lower two bits, so that each controls switching of the switch circuits swA and swB, and the switch circuit swC.

Also in the D/A conversion circuit of this embodiment, even if the potential of a pixel TFT is changed, a voltage supplied from the second output line of the second D/A conversion circuit is always stable, so that the D/A conversion circuit can supply the stable voltage to the pixel TFT.

The D/A conversion circuit of this embodiment can also be integrally formed on an insulating substrate, such as a quartz substrate or a glass substrate, together with other driving circuits and other peripheral circuits of the liquid crystal display device. The D/A conversion circuit of this embodiment can be formed by the manufacturing method of the embodiment 1. The D/A conversion circuit can also be formed by other manufacturing methods.

Although four P-channel TFTs and four N-channel TFTs connected to each of the gradation voltage lines of the D/A conversion circuit of this embodiment are formed on the same semiconductor layer, four independent P-channel TFTs and four N-channel TFTs may be connected by metal wiring lines or the like through contacts. However, the former is preferable since the area of the D/A conversion circuit can be made small.

Figure 24A:
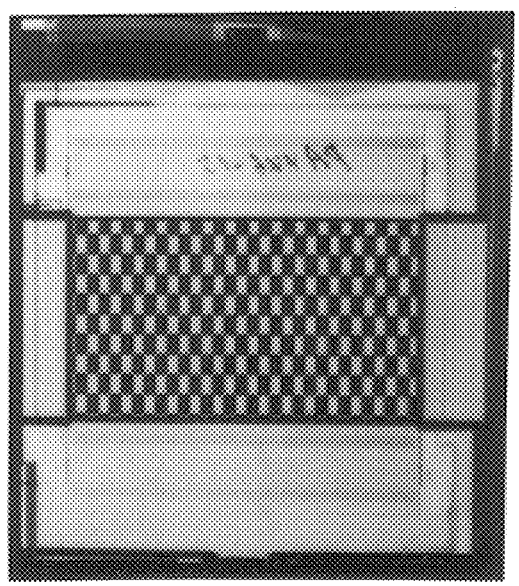
FIGS. 24A and 24B are a photographic views of an active matrix type liquid crystal display device according to embodiment 7 of the present invention.
Figure 24B:
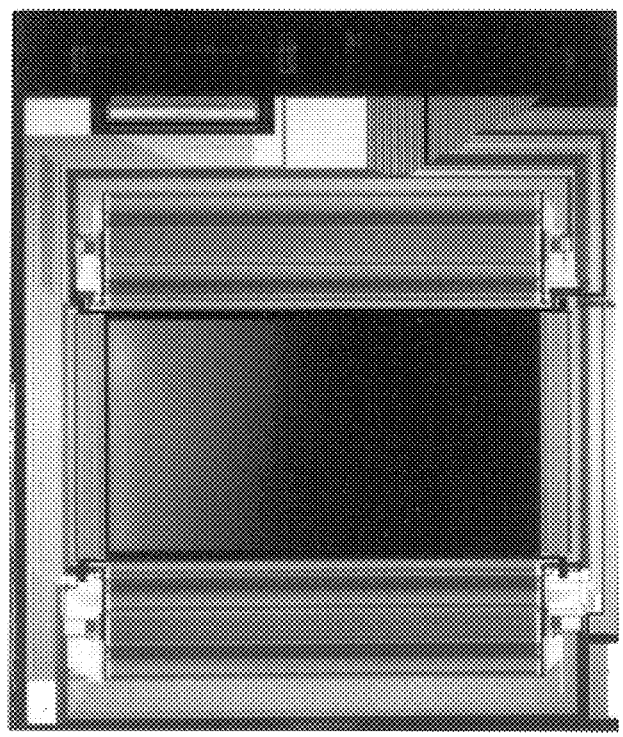

FIGS. 24A and 24B are photographs showing the active matrix type liquid crystal display device of this embodiment. They are seen the display of an excellent check pattern (FIG. 24A) and the display of an excellent gradation pattern (FIG. 24B).

Figure 25:
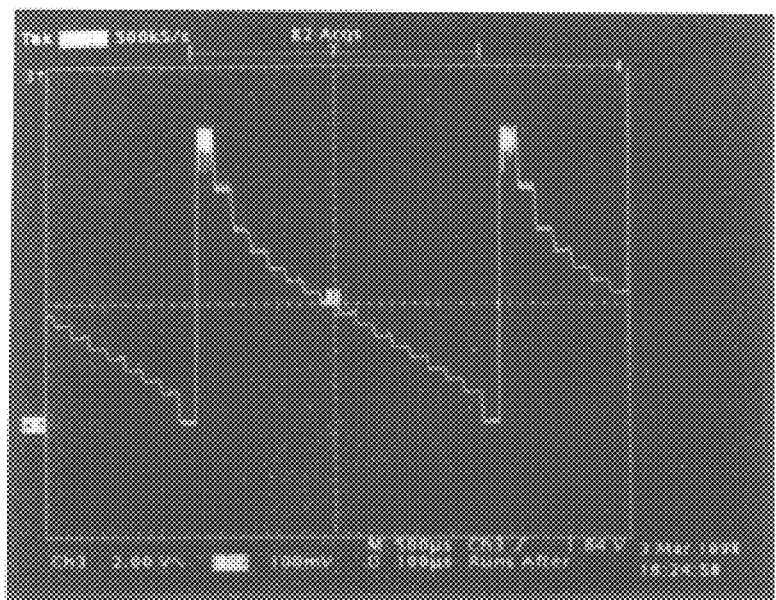
FIG. 25 is an oscilloscopic view of an output signal of a D/A conversion circuit according to embodiment 27 of the present invention.
Figure 26:
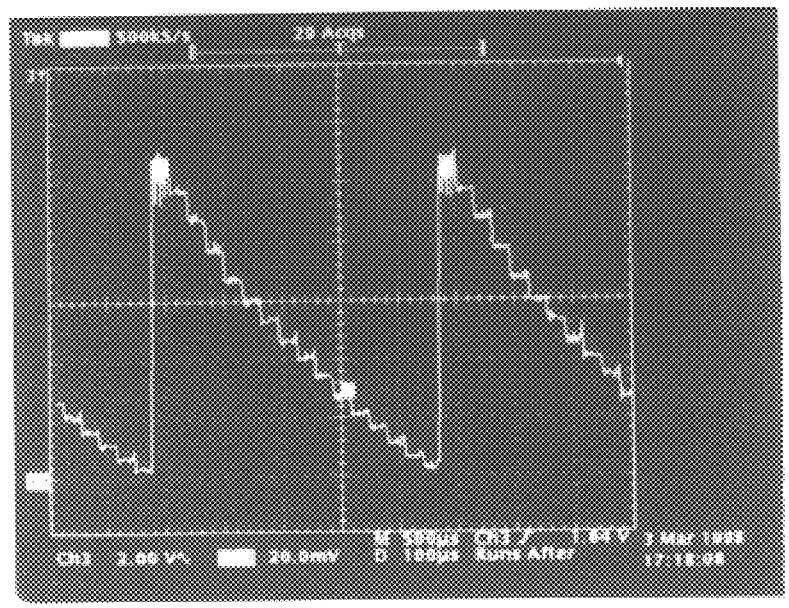
FIG. 26 is an oscilloscopic view of an output signal of a D/A conversion circuit according to embodiment 7 of the present invention.

FIGS. 25 and 26 are oscilloscopic views when the D/A conversion circuit of this embodiment is operated and data are measured.

FIG. 25 shows voltage data of the gradation voltage lines V0 to V16 (see FIG. 12) supplied to the first D/A conversion circuit of this embodiment. It is seen that the seventeen stable voltages of the gradation voltage lines V0 to V16 are supplied.

FIG. 26 shows voltage data outputted to the output line of the second D/A conversion circuit. It is seen that the sixteen stable voltages are outputted by the lower 4-bit digital signal. Incidentally, glitches shown in the output signal are due to DE signals, and do not affect the charge of an analog data signal of the source signal line.

[Embodiment 8]

In this embodiment, an example of a specific circuit structure of the switch circuit shown in the embodiment 6 will be described. In this embodiment, a block diagram of the main portion of an active matrix type liquid crystal display device which processes 4-bit digital video data will be shown. With respect to a shift register circuit, a latch circuit, a D/A conversion circuit, and the like, the embodiment 6 may be seen. The switch circuit explained in this embodiment can be used in the active matrix type liquid crystal display device described in the embodiment 7.

Figure 20:
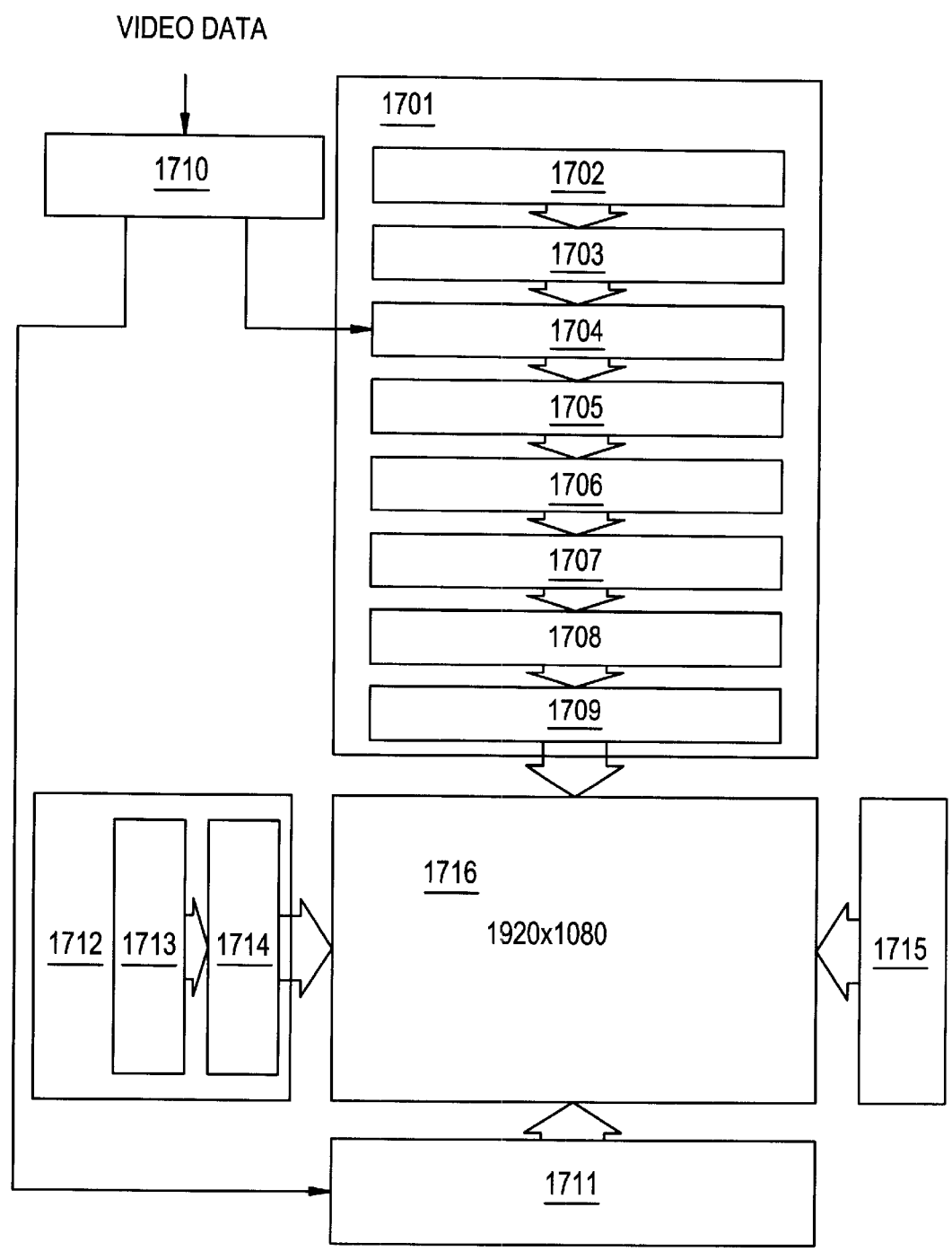
FIG. 20 is a block diagram of a semiconductor display device according to embodiment 8 of the present invention.

FIG. 20 is shows the block diagram of the main portion of the active matrix type liquid crystal display device of this embodiment. This embodiment is different from the embodiment 6 in that source signal line side driving circuits are used up and down so that a pixel matrix circuit is put between the source signal line side driving circuits, gate signal line side driving circuits are used right and left so that the pixel matrix circuit is put between the gate signal line side driving circuits, a level shifter circuit is used for the respective source signal line side driving circuits, a digital video data dividing circuit is provided, and the like. The level shifter circuit may be used as the need arises, and it does not necessarily required to be used.

The active matrix type liquid crystal display device of this embodiment includes a source signal line side driving circuit A1701, a source signal line side driving circuit B1711, a gate signal line side driving circuit A1712, a gate signal line side driving circuit B1715, a pixel matrix circuit 1716, and a digital video data dividing circuit 1710.

The source signal line side driving circuit A1701 includes a shift register circuit 1702, a buffer circuit 1703, a latch circuit (1) 1704, a latch circuit (2) 1705, a selector (switch) circuit (1) 1706, a level shifter circuit 1707, a D/A conversion circuit 1708, and a selector (switch) circuit (2) 1709. The source signal line side driving circuit A1701 supplies a picture signal (gradation voltage signal) to odd source signal lines. In this embodiment, a circuit equivalent to the switch circuit explained in the foregoing embodiment 6 will be referred to as a selector circuit. For convenience of explanation, the first and second D/A conversion circuits are set forth in one bundle as the D/A conversion circuit 1708.

In the source signal line side driving circuit 1701, with respect to the operations up to the latch circuit (2) 1705, the embodiment 6 or the embodiment 7 may be seen.

In the 4-bit digital video data from the latch circuit and selected by the selector circuit (1) 1706, the upper 2-bit digital video data is supplied to the level shifter 1707. The voltage level of the digital video data is raised by the level shifter 1707, and is supplied to the first D/A conversion circuit of the D/A conversion circuit 1708. The D/A conversion circuit 1708 converts the 2-bit digital video data into analog signals (gradation voltages), and supplies the analog signals to the second D/A conversion circuit. The second D/A conversion circuit selects further a gradation voltage from the gradation voltages supplied from the first D/A conversion circuit by the lower 2-bit digital video data of the 4-bit digital video data, and supplies the gradation voltage to the selector circuit (2) 1709. The gradation voltage is sequentially supplied to the source signal line selected by the selector circuit (2) 1709. The analog signal supplied to the source signal line is supplied to the source region of a pixel TFT of the pixel matrix circuit 1716 connected to the source signal line. With respect to this series of operations, the embodiment 6 may be seen.

Reference numeral 1711 denotes the source signal line side driving circuit B, and its structure is the same as the source signal line side driving circuit A1701. The source signal line side driving circuit B1711 supplies a picture signal to even source signal lines.

Reference numeral 1715 denotes the gate signal line side driving circuit B, and its structure is the same as the gate signal line side driving circuit A1712. In this embodiment, like this, the gate signal line side driving circuits are provided at both ends of the pixel matrix circuit 1716, and both the gate signal line side driving circuits are operated, so that even if one of them does not work, inferior display does not occur.

Reference numeral 1710 denotes the digital video data dividing circuit. The digital video data dividing circuit 1710 is a circuit for making the frequency of digital video data, which are inputted from the outside, fall to 1/m. By dividing the digital video data, the frequency of a signal necessary for the operation of the driving circuit can also be made to fall to 1/m. Integral forming of the digital video data dividing circuit on the same substrate as the pixel matrix circuit and other driving circuits is disclosed in Japanese Patent Application No. Hei. 9-356238 by the same assignee as this application. The patent application discloses the details of the operation of the digital video data dividing circuit, and may be seen for understanding of the operation of the digital video data dividing circuit of this embodiment.

Here, the structure and operation of the selector circuit (1) 1706 and the selector circuit (2) 1709 will be described. The basic concept of the selector circuit is the same as the switch circuit explained in the embodiment 6. In this embodiment, one selector circuit (1) 1706 and one selector circuit (2) 1709 are used for every four source signal lines. Thus, 240 selector circuits (1) 1706 and 240 selector circuits (2) 1709 are used in the source signal line side driving circuit (A) 1701, and 240 selector circuits (1) and 240 selector circuits (2) are used in the source signal line side driving circuit (b) 1711.

Figure 21:
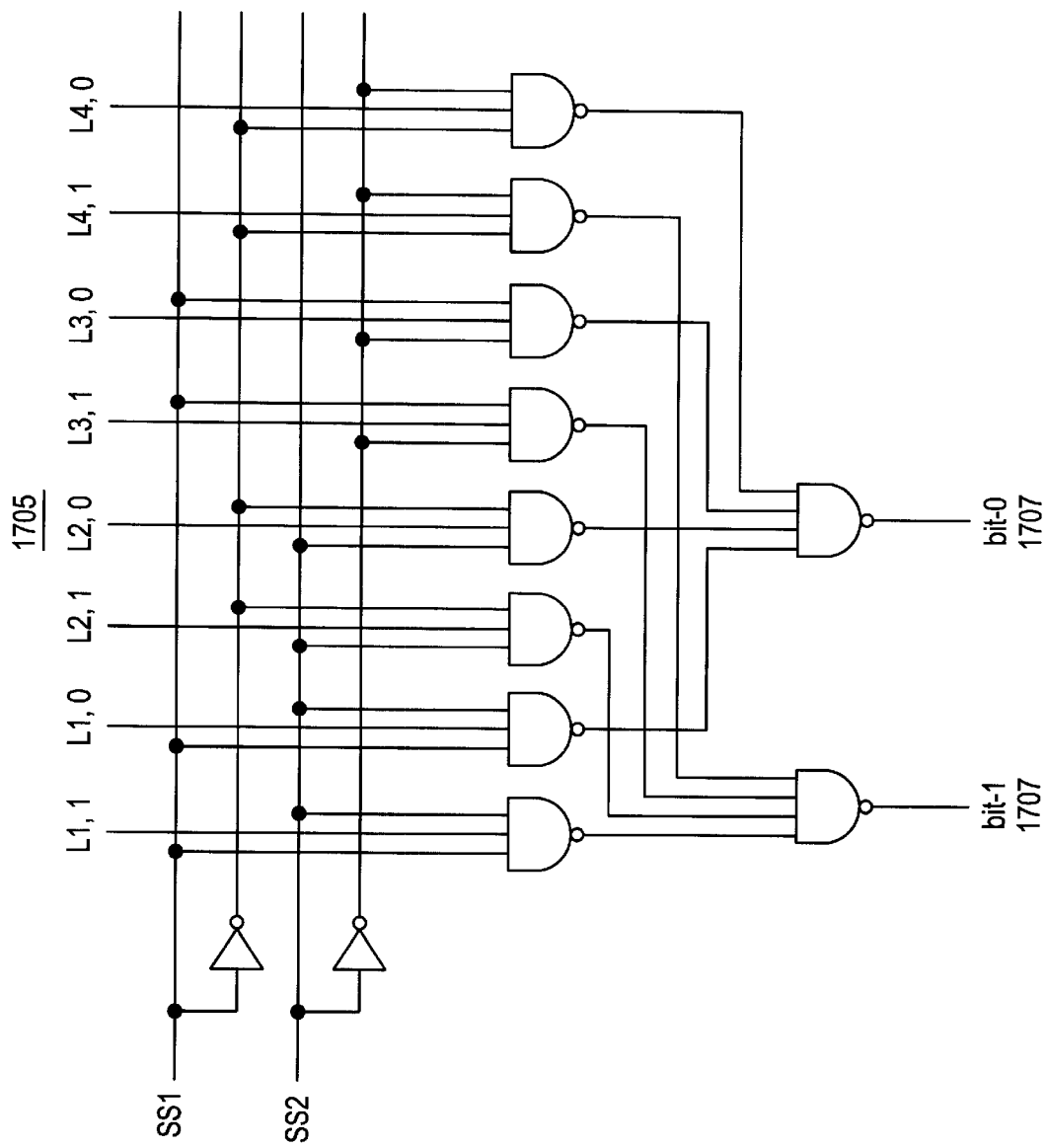
FIG. 21 is a circuit structural view of a selector circuit (switch circuit) according to embodiment 8 of the present invention.

For convenience of explanation, FIG. 21 shows only the leftmost selector circuit (1) of the source signal line side driving circuit (A)1701. In the actual source signal line side driving circuit, 240 such selector circuits are used.

One of the selector circuits (1) of this embodiment includes, as shown in FIG. 21, eight 3-input NAND circuits, two 4-input NAND circuits, and two inverters. A signal from the latch circuit (2) 1705 is inputted to the selector circuit (1) 1706 of this embodiment, and signal lines L0.0, L1.0, L1.0, L1.1, L2.0, L2.1, L3.0, L3.1 of the signal lines L0.0, L0.1, L1.0, L1.1, . . . , L1919.0, L1919.1 from the latch circuit (2) 1705 are connected to the selector circuit (1) shown in FIG. 21. The notation La.b means that the b-th bit signal of a digital video signal supplied to the a-th source signal line from the left is supplied. Timing signals are inputted to the selector circuit (1) from the signal lines SS1 and SS2. The signal from the selector circuit (1) is inputted to the level shifter 1707, and then, is inputted to the D/A conversion circuit 1708.

Figure 22:
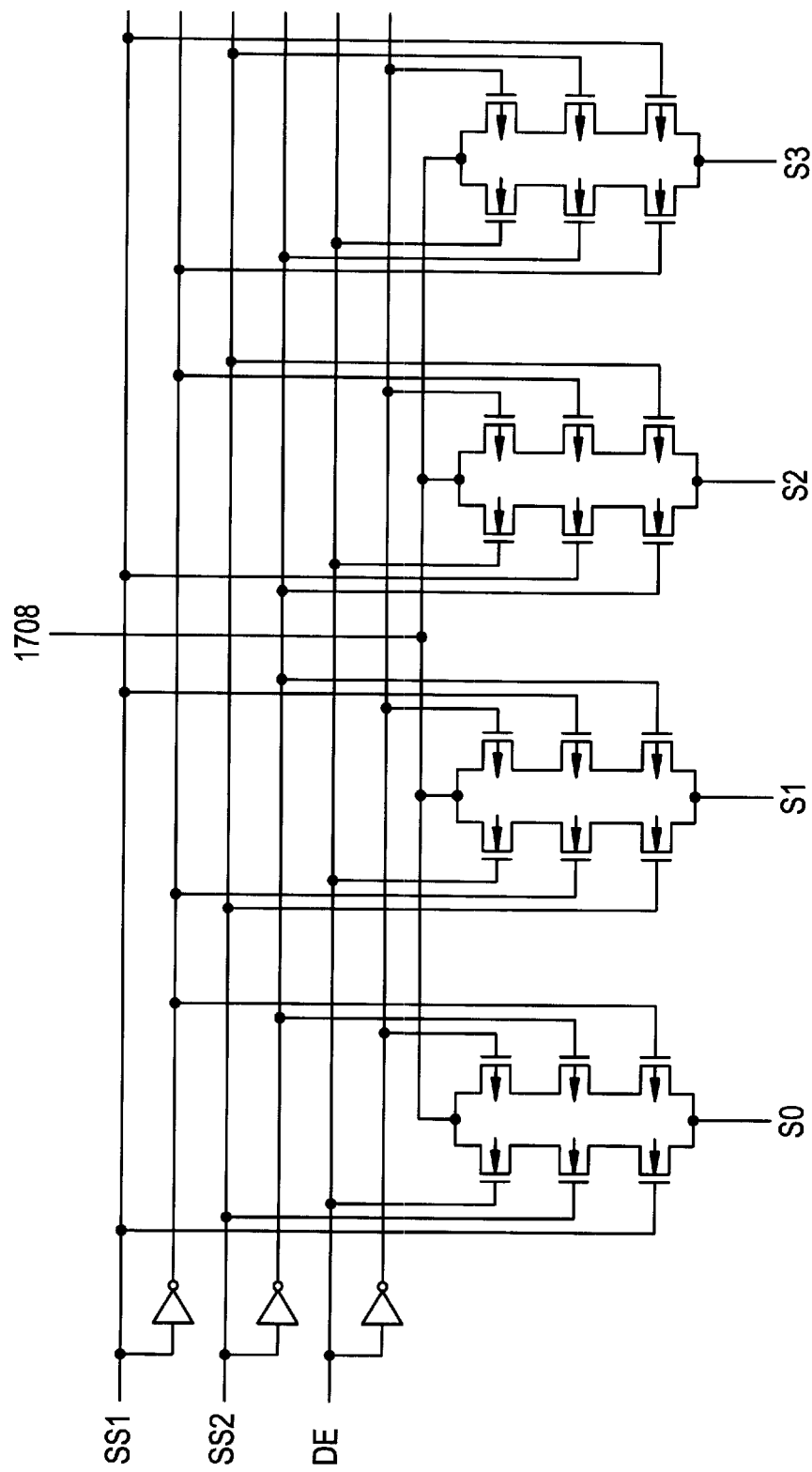
FIG. 22 is a circuit structural view of a selector circuit (switch circuit) according to embodiment 8 of the present invention.

FIG. 22 shows the selector circuit (2). For convenience of explanation, FIG. 22 shows the leftmost selector circuit (2). In the actual source signal line side driving circuit, 240 such selector circuits are used.

As shown in FIG. 22, the selector circuit (2) of this embodiment includes four analog switches each having three P-channel TFTs and three N-channel TFTs, and three inverters. An analog picture signal (gradation voltage) converted into an analog signal by the D/A conversion circuit 1708 is inputted to the selector circuit (2).

Figure 23:
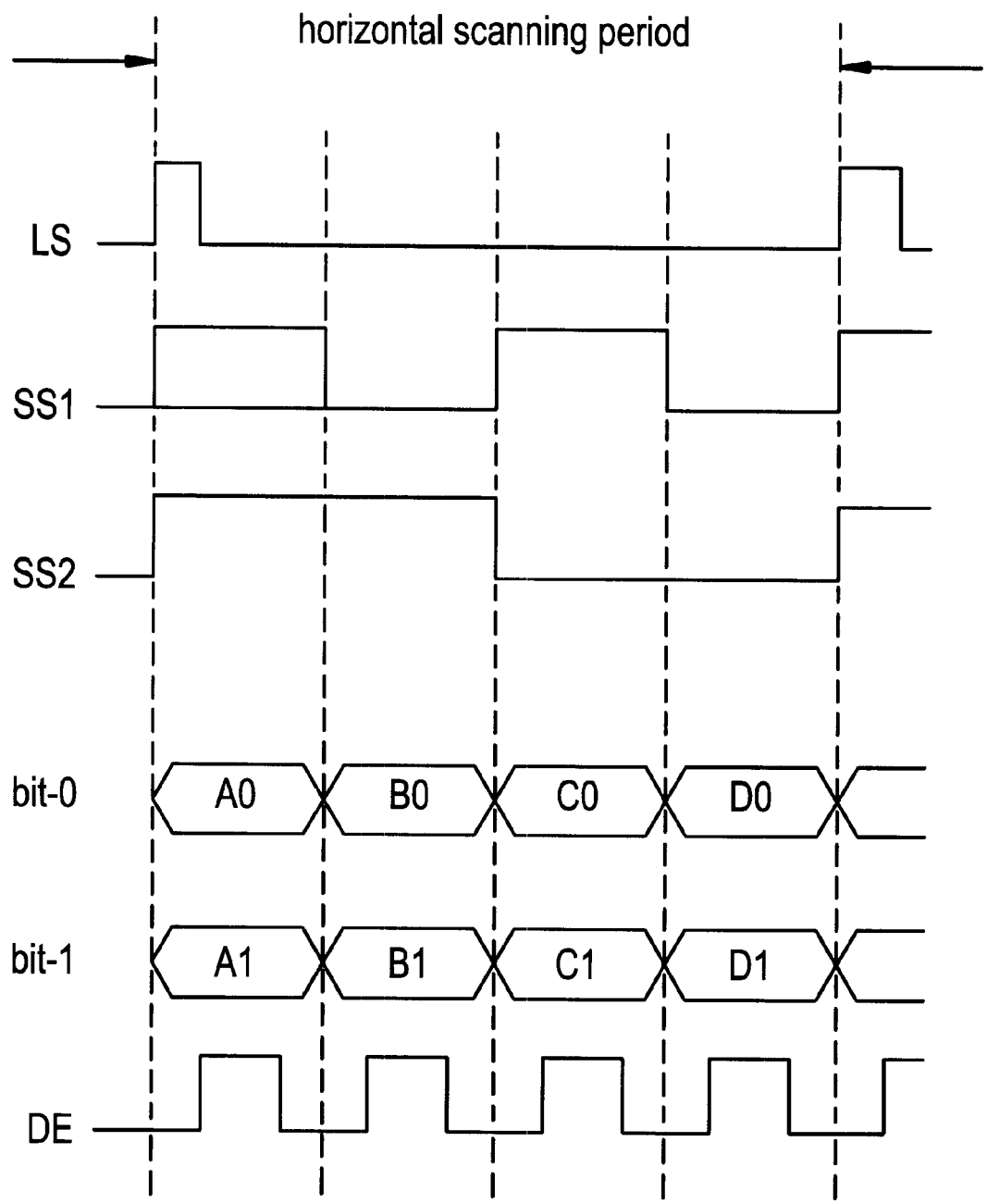
FIG. 23 is a timing chart of a selector circuit according to embodiment 8 of the present invention.

FIG. 23 is a timing chart showing 2-bit digital video data inputted to the selector circuit (1) 1706 and timing signals inputted to the selector circuit (1) 1706 and selector circuit (2) 1709. Reference character LS denotes a latch signal which is supplied to the latch circuit (2) 1705 at the start of one line period (horizontal scanning period). Reference characters bit-0 and bit-1 denote 0-th bit data and 1st bit data of the digital picture signal outputted from the latch circuit (2) 1705. Here, it is assumed that digital signals A1 and A0 are respectively supplied to the signal lines L0.1 and L0.0 from the latch circuit (2) connected to the selector circuit (1) shown in FIG. 21, digital signals B1 and B0 are respectively supplied to the signal lines L1.1 and L1.0, digital signals C1 and C0 are respectively supplied to the signal lines L2.1 and L2.0, and digital signals D1 and D0 are respectively supplied to the signal lines L3.1 and L3.0.

In the selector circuit (1), based on the timing signals supplied to the signal lines SS1 and SS2, signals outputted to the bit-1 and bit-0 are selected. That is, in the first (¼) line period, the digital signal A1 is outputted to the bit-1, and the digital signal A0 is outputted to the bit-0. In the next (¼) line period, the digital signal B1 is outputted to the bit-1, and the digital signal B0 is outputted to the bit-0. In the next (¼) line period, the digital signal C1 is outputted to the bit-1, and the digital signal C0 is outputted to the bit-0. In the final (¼) line period, the digital signal D1 is outputted to the bit-1, and the digital signal D0 is outputted to the bit-0. Like this, data from the latch circuit (2) are supplied to the level shifter circuit 1707 for every (¼) line period.

The analog picture signals supplied from the D/A conversion circuit are selected by the selector circuit (2), and are supplied to the source signal lines. Also in this case, although the analog picture signal is supplied to the corresponding source signal line for every (¼) line period, the analog picture signal is supplied to the source signal line only in the period in which the voltage of the analog signal becomes completely definite by a decode enable signal (DE).

In this embodiment, although the 4-bit digital video data are processed, digital video data of more than 4 bits can also be processed.

In this embodiment, since the switch circuit is used so that one D/A conversion circuit is provided for four source signal lines, the number of D/A conversion circuits is made ¼ of a conventional one. However, the number of D/A conversion circuits is made a number other than this. For example, in the case where one D/A conversion circuit is assigned to eight source signal lines, the number of the D/A conversion circuits becomes 240 in the active matrix type liquid crystal display device of this embodiment, so that the area of the driving circuit can be further reduced. Like this, the number of source signal lines to which one D/A conversion circuit is assigned is not limited to this embodiment.

In the foregoing embodiment, the example in which the D/A conversion circuit of the present invention shown in the embodiment 6 or 7 is typically used for the driving circuit of the liquid crystal display device has been described. In this case, as a method of display used in the liquid crystal display device, a TN mode using a nematic liquid crystal, a mode using electric field birefringence, a so-called polymer dispersion mode of a mixed layer of liquid crystal and polymer, and the like may be used. In the foregoing embodiments, although the D/A conversion circuit of the present invention is used for the driving circuit of a transmission type active matrix liquid crystal display device, the D/A conversion circuit of the present invention can also be used for a driving circuit of a reflection type active matrix liquid crystal display device.

Moreover, the digital driving system driving circuit provided with the D/A conversion circuit of the present invention typically shown in the embodiment 6 or 7 performs line-sequential scanning of pixel TFTs, and the number of pixels is sufficiently large so that the driving circuit can deal with a future ATV (Advanced TV). Thus, if the D/A conversion circuit is employed for an active matrix type liquid crystal display device using an antiferroelectric liquid crystal with high response speed and no threshold voltage, the effect can be further shown.

Moreover, the D/A conversion circuit of the present invention typically shown in the embodiment 6 or 7 may be used for a driving circuit of a display device provided with any display medium having optical characteristics which can be modulated according to an applied voltage. For example, the D/A conversion circuit may be used for a driving circuit of a display device using an electroluminescence element or the like.

Moreover, the D/A conversion circuit of the present invention typically shown in the embodiment 6 and 7 may be used for a driving circuit of a semiconductor device such as an image sensor. In this case, the D/A conversion circuit can be applied to an image sensor in which a light receiving portion of the image sensor and a picture display portion for displaying a picture converted into electric signals by the light receiving portion are integrally formed. Besides, the D/A conversion circuit can be applied to any image sensor of a line sensor and an area sensor.

[Embodiment 9]

The active matrix type liquid crystal display device described in the embodiment 6 or 7 can be used as a display for various electronic equipments. Incidentally, the electronic equipment in this embodiment is defined as an active matrix type liquid crystal display device or a product incorporating a semiconductor circuit or a display device.

As such electronic equipments, a video camera, a still camera, a projector, a projection TV, a head mount display, a car navigation system, a personal computer (including a note-sized computer), a portable information terminal (mobile computer, portable telephone, etc.) and the like are enumerated. An example of those equipments will be shown in FIGS. 37A to 37F.

Figure 37A:
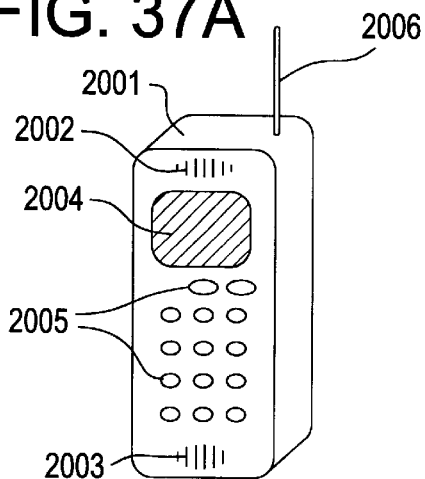
FIGS. 37A to 37F are views showing structures of electronic equipments according to embodiment 9 of the present invention.

FIG. 37A shows a portable telephone which is constituted by a main body 2001, an audio output portion 2002, an audio input portion 2003, a display device 2004, an operation switch 2005, and an antenna 2006. The present invention can be applied to the audio output portion 2002, the audio input portion 2003, the display device 2004, and the like.

Figure 37B:
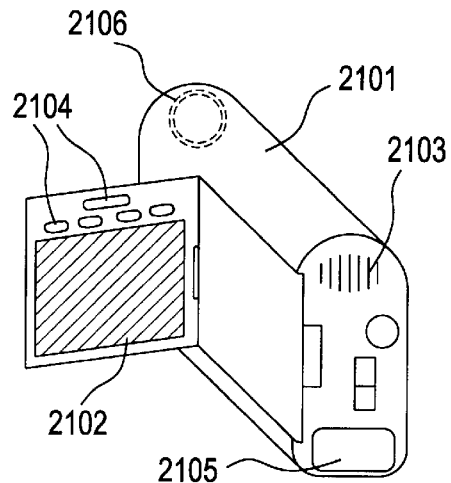

FIG. 37B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and the image receiving portion 2106.

Figure 37C:
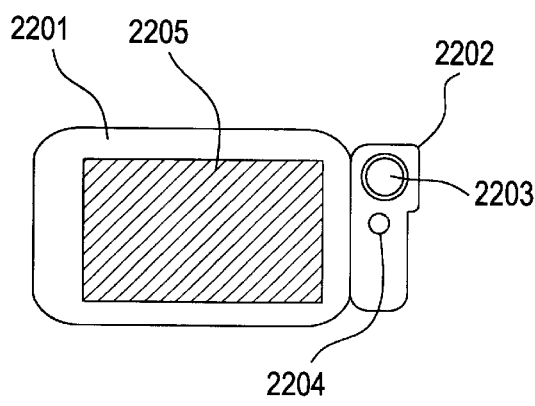

FIG. 37C shows a mobile computer which is constituted by a main body 2201, a camera portion 2202, an image receiving portion 2203, an operation switch 2204, and a display device 2205. The present invention can be applied to the image receiving portion 2203, the display device 2205, and the like.

Figure 37D:
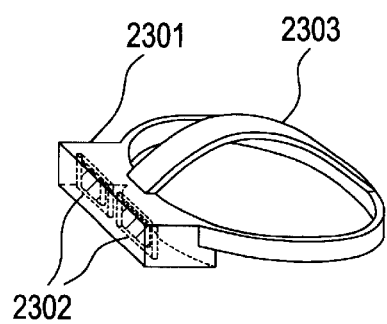

FIG. 37D shows a head mount display which is constituted by a main body 2301, a display device 2302, and a band portion 2303. The present invention can be applied to the display device 2302.

Figure 37E:
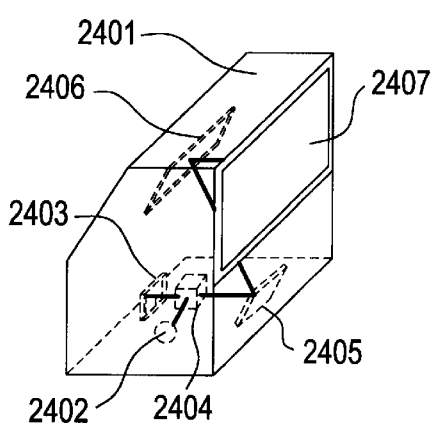

FIG. 37E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 37F:
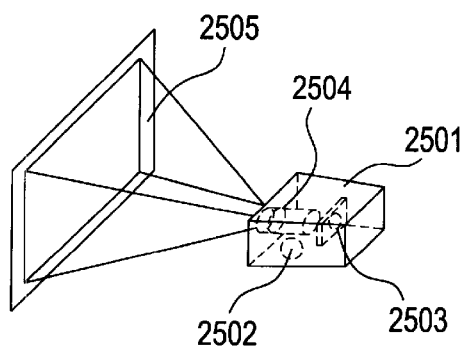

FIG. 37F shows a front type projector which is constituted by a main body 2501, a light source 2502, a display device 2503, an optical system 2504, and a screen 2505. The present invention can be applied to the display device 2503.

As described above, the scope of application of the present invention is very wide, and the present invention can be applied to electronic equipments of any field. Moreover, the present invention can also be effectively applied to a videobillboard, a display for promo, and the like.

According to the present invention, a D/A conversion circuit with few crossings of wiring lines can be realized. Thus, even a D/A conversion circuit, which processes a digital signal of a large bit number, in a semiconductor device of a large screen and high fineness can be realized with a small area. Since the D/A conversion circuit of the present invention can be designed in accordance with some fixed rule, great saving of a designing time can also be achieved.

What is claimed is:

1. A D/A conversion circuit, comprising:
   $2^n$ gradation voltage lines, one of the $2^n$ gradation voltage lines being selected according to an inputted n-bit (n is an integer not less than 2) digital signal, and a gradation voltage being supplied to an output line from the selected gradation voltage line;
   a circuit including a first circuit with n P-channel TFTs connected in series to each other and a second circuit with n N-channel TFTs connected in series to each other, the circuit including the first circuit and the second circuit connected in series to each other and being connected in parallel to each of the $2^n$ gradation voltage lines; and
   a connection portion between the first circuit and the second circuit, the connection portion being connected to the output line,
   wherein the digital signal performs switching of the n P-channel TFTs and the n N-channel TFTs connected to each of the $2^n$ gradation voltage lines.

2. A D/A conversion circuit according to claim 1, wherein the n P-channel TFTs are connected each other through only a semiconductor layer, and the n N-channel TFTs are connected each other through only a semiconductor layer.

3. A D/A conversion circuit according to claim 1, wherein the D/A conversion circuit is formed over an insulating substrate.

4. A D/A conversion circuit according to claim 1, further comprising a black mask (BM) layer used as a third wiring line.

5. A D/A conversion circuit according to claim 4, wherein the BM layer includes an Al film or a lamination film of Al and Ti.

6. A D/A conversion circuit, comprising:
   $2^n$ gradation voltage lines, one of the $2^n$ gradation voltage lines being selected according to an inputted n-bit (n is an integer not less than 2) digital signal, and a gradation voltage being supplied to an output line from the selected gradation voltage line;
   a circuit including a first circuit with n P-channel TFTs connected in series to each other and a second circuit with n N-channel TFTs connected in series to each other, the circuit including the first circuit and the second circuit connected in series to each other and being connected in parallel to each of the $2^n$ gradation voltage line; and
   a connection portion between the first circuit and the second circuit, the connection portion being connected to the output line,
   wherein the digital signal is supplied to gate electrodes of the n P-channel TFTs and gate electrodes of the n N-channel TFTs connected to each of the $2^n$ gradation voltage lines.

7. A D/A conversion circuit according to claim 6, wherein the n P-channel TFTs are connected each other through only a semiconductor layer, and the n N-channel TFTs are connected each other through only a semiconductor layer.

8. A D/A conversion circuit according to claim 6, wherein the D/A conversion circuit is formed over an insulating substrate.

9. A D/A conversion circuit according to claim 6, further comprising a black mask (BM) layer used as a third wiring line.

10. A D/A conversion circuit according to claim 9, wherein the BM layer includes an Al film or a lamination film of Al and Ti.

11. A D/A conversion circuit, comprising:
    $2^n$ gradation voltage lines, one of the $2^n$ gradation voltage lines being selected according to an inputted n-bit (n is an integer not less than 2) digital signal, and a gradation voltage being supplied to an output line from the selected gradation voltage line;
    a circuit including a first circuit with n P-channel TFTs connected in series to each other and a second circuit with n N-channel TFTs connected in series to each other, the circuit including the first circuit and the second circuit connected in series to each other and being connected in parallel to each of the $2^n$ gradation voltage lines; and
    a connection portion between the first circuit and the second circuit, the connection portion being connected to the output line, wherein:
    voltages supplied to the $2^n$ gradation voltage lines become high in a direction from the first gradation voltage line to the $2^n$-th gradation voltage line;
    the x-th ($1 \leq x \leq 2^n$; x is an integer) gradation voltage line and the ($2^n+1-x$)-th gradation voltage line are paired and are adjacent to each other;
    an arrangement of the first circuit and the second circuit is reversed between the paired gradation voltage lines; and
    the digital signal is supplied to gate electrodes of the n P-channel TFTs and gate electrodes of the n N-channel TFTs connected to each of the $2^n$ gradation voltage lines.

12. A D/A conversion circuit according to claim 11, wherein the n P-channel TFTs are connected each other through only a semiconductor layer, and the n N-channel TFTs are connected each other through only a semiconductor layer.

13. A D/A conversion circuit according to claim 11, wherein the D/A conversion circuit is formed over an insulating substrate.

14. A D/A conversion circuit according to claim 11, further comprising a black mask (BM) layer used as a third wiring line.

15. A D/A conversion circuit according to claim 14, wherein the BM layer includes an Al film or a lamination film of Al and Ti.

16. A D/A conversion circuit in which a gradation voltage corresponding to an inputted n-bit (n is a natural number not less than 2) digital signal is supplied to an output line, characterized in that:
    the n-bit digital signal is divided into upper x bits and lower y bits (x+y=n; both x and y are natural numbers);
    adjacent two gradation voltage lines are selected from ($2^x+1$) gradation voltage lines by the upper x bits of the n-bit digital signal;
    $2^y$ gradation voltages are generated from gradation voltages of the two selected adjacent gradation voltage lines; and
    a corresponding gradation voltage is supplied to the output line from the $2^y$ gradation voltages by the lower y bits of the n-bit digital signal.

17. A D/A conversion circuit according to claim 16, wherein the D/A conversion circuit is formed of thin film transistors over an insulating substrate.

18. A D/A conversion circuit according to claim 16, further comprising a black mask (BM) layer used as a third wiring line.

19. A D/A conversion circuit according to claim 18, wherein the BM layer includes an Al film or a lamination film of Al and Ti.

20. A D/A conversion circuit in which a gradation voltage corresponding to an inputted n-bit (n is a natural number not less than 2) digital signal is supplied to an output line, characterized in that:
the n-bit digital signal is divided into upper x bits and lower y bits (x+y=n; both x and y are natural numbers);
a z-th gradation voltage line and a (z+1)-th gradation voltage line ($1 \leq z \leq 2^x$; z is a natural number) are selected from ($2^x+1$) gradation voltage lines by the upper x bits of the n-bit digital signal, voltages supplied to the gradation voltage lines becoming high in a direction from the first gradation voltage line to the ($2^x+1$)-th gradation voltage line;
$2^y$ gradation voltages are formed from gradation voltages of the selected z-th and (z+1)-th gradation voltage lines; and
a corresponding gradation voltage from the $2^y$ gradation voltages is supplied to the output line by the lower y bits of the n-bit digital signal.

21. A D/A conversion circuit according to claim 20, wherein the D/A conversion circuit is formed of thin film transistors over an insulating substrate.

22. A D/A conversion circuit according to claim 20, further comprising a black mask (BM) layer used as a third wiring line.

23. A D/A conversion circuit according to claim 22, wherein the BM layer includes an Al film or a lamination film of Al and Ti.

24. A semiconductor device, comprising;
a plurality of TFTs disposed in matrix;
a source signal line side driving circuit for driving the plurality of TFTs; and
a gate signal line side driving circuit for driving the plurality of TFTs, wherein:
the source signal line side driving circuit includes a D/A conversion circuit in which a gradation voltage corresponding to an inputted n-bit (n is a natural number not less than 2) digital signal is supplied to an output line;
the n-bit digital signal is divided into upper x bits and lower y bits (x+y=n; both x and y are natural numbers);
adjacent two gradation voltage line are selected from ($2^x+1$) gradation voltage lines by the upper x bits of the n-bit digital signal;
$2^y$ gradation voltage lines are formed from gradation voltages of the two selected adjacent gradation voltage lines; and
a corresponding gradation voltage from the $2^y$ gradation voltages is supplied to the output line by the lower y bits of the n-bit digital signal.

25. A semiconductor device according to claim 24, wherein the plurality of TFTs, the source signal line side driving circuit, and the gate signal line side driving circuit are integrally formed of thin film transistors over an insulating substrate.

26. A semiconductor device according to claim 24, further comprising a black mask (BM) layer used as a third wiring line of the source signal line side driving circuit or the gate signal line side driving circuit.

27. A semiconductor device according to claim 26, wherein the BM layer is made of an Al film, or a lamination film of Al and Ti.

28. A semiconductor device, comprising:
a plurality of TFTs disposed in matrix;
a source signal line side driving circuit for driving the plurality of TFTs; and
a gate signal line side driving circuit for driving the plurality of TFTs, wherein:
the source signal line side driving circuit includes a D/A conversion circuit in which a gradation voltage corresponding to an inputted n-bit (n is a natural number not less than 2) digital signal is supplied to an output line;
the n-bit digital signal is divided into upper x bits and lower y bits (x+y=n; both x and y are natural numbers);
a z-th gradation voltage line and a (z+1)-th gradation voltage line ($1 \leq z \leq 2^x$; z is a natural number) are selected from ($2^x+1$) gradation voltage lines by the upper x bits of the n-bit digital signal, voltages supplied to the gradation voltage lines becoming high in a direction from the first gradation voltage line to the ($2^x+1$)-th gradation voltage line;
$2^y$ gradation voltages are formed from gradation voltages of the selected z-th and (z+1)-th gradation voltage lines; and
a corresponding gradation voltage from the $2^y$ gradation voltages is supplied to the output line by the lower y bits of the n-bit digital signal.

29. A semiconductor device according to claim 28, wherein the plurality of TFTs, the source signal line side driving circuit, and the gate signal line side driving circuit are integrally formed of thin film transistors over an insulating substrate.

30. A semiconductor device according to claim 28, further comprising a black mask (BM) layer used as a third wiring line of the source signal line side driving circuit or the gate signal line side driving circuit.

31. A semiconductor device according to claim 30, wherein the BM layer is made of an Al film, or a lamination film of Al and Ti.

32. A semiconductor device, comprising:
a plurality of TFTs;
a source signal line side driving circuit for driving the plurality of TFTs; and
a gate signal line side driving circuit for driving the plurality of TFTs, wherein:
the source signal line side driving circuit includes a D/A conversion circuit in which a gradation voltage corresponding to an inputted n-bit (n is a natural number not less than 2) digital signal is supplied to an output line;
the n-bit digital signal is divided into upper x bits and lower y bits (x+y=n; both x and y are natural numbers);
a z-th gradation voltage line and a (z+1)-th gradation voltage line ($1 \leq z \leq 2^x$; z is a natural number) are selected from the ($2^x+1$) gradation voltage lines by the upper x bits of the n-bit digital signal, voltages supplied to the gradation voltage lines becoming high in a direction from the first gradation voltage line to the ($2^x+1$)-th gradation voltage line;
$2^y$ gradation voltages are formed from gradation voltages of the selected z-th and (z+1)-th gradation voltage lines; and
a corresponding gradation voltage from the $2^y$ gradation voltages is supplied to the output line by the lower y bits of the n-bit digital signal.

33. A semiconductor device according to claim 32, wherein the plurality of TFTs, the source signal line side driving circuit, and the gate signal line side driving circuit are integrally formed of thin film transistors over an insulating substrate.

34. A semiconductor device according to claim 32, further comprising a black mask (BM) layer used as a third wiring line of the source signal line side driving circuit or the gate signal line side driving circuit.

35. A semiconductor device according to claim 34, wherein the BM layer is made of an Al film, or a lamination film of Al and Ti.

36. A semiconductor device having a pixel region and a peripheral circuit region over a substrate, said peripheral circuit region having a D/A converter for n-bit digital signal comprising:

$2^n$ gradation voltage lines;

n P-ch TFTs connected in series to each other;

n N-ch TFTs connected in series to each other; and output line connected to a connection portion between n P-ch TFTs and n N-ch TFTs.

37. A device according to claim 36, wherein voltage supplied to the $2^n$ gradation voltage lines become high in a direction from the first gradation voltage line to the $2^n$-th gradation voltage line.

38. A device according to claim 36, wherein the x-th ($1 \leq x \leq 2^n$; x is an integer gradation voltage line and the ($2^2+1-x$)-th gradation voltage line are paired and are adjacent to each other.

39. A device according to claim 36, wherein the n P-ch TFTs and n N-ch TFTs comprise a crystalline semiconductor layer form over the substrate.

40. A semiconductor device having a pixel region and a peripheral circuit region over a substrate, said peripheral circuit region having a D/A converter for n-bit digital signal comprising:

$2^n$ gradation voltage lines;

n P-ch TFTs connected in series to each other;

n N-ch TFTs connected in series to each other; and output line connected to a connection portion between n P-ch TFTs and n N-ch TFTs, wherein said n P-ch TFTs and n N-ch TFTs are connected in series each other.

41. A device according to claim 40, wherein voltage supplied to the $2^n$ gradation voltage lines become high in a direction from the first gradation voltage line to the $2^n$-th gradation voltage line.

42. A device according to claim 40, wherein the x-th ($1 \leq x \leq 2^n$; x is an integer) gradation voltage line and the ($2^n+1-x$)-th gradation voltage line are paired and are adjacent to each other.

43. A device according to claim 40, wherein the n P-ch TFTs and n N-ch TFTs comprise a crystalline semiconductor layer formed over the substrate.

44. A semiconductor device having a pixel region and a peripheral circuit region over a substrate, said peripheral circuit region having a D/A converter for n-bit digital signal comprising:

$2^n$ gradation voltage lines;

n P-ch TFTs connected in series to each other;

n N-ch TFTs connected in series to each other; and output line connected to a connection portion between n P-ch TFTs and n N-ch TFTs, wherein said n P-ch TFTs and n N-ch TFTs are connected in series each other and in parallel to each of said $2^n$ gradation voltage lines.

45. A device according to claim 44, wherein voltage supplied to the $2^n$ gradation voltage lines become high in a direction from the first gradation voltage line to the $2^n$-th gradation voltage line.

46. A device according to claim 44, wherein the x-th ($1 \leq x \leq 2^n$; x is an integer) gradation voltage line and the ($2^n+1-x$)-th gradation voltage line are paired and are adjacent to each other.

47. A device according to claim 44, wherein the n P-ch TFTs and n N-ch TFTs comprise a crystalline semiconductor layer formed over the substrate.

48. A method for driving a D/A converstion circuit for n-bit (n is a natural number not less than 2) digital signal, comprising the steps of:

dividing the n-bit digital signal into upper x bits and lower y bits (x+y=n; both x and y are natural numbers);

selecting adjacent two gradation voltage lines from ($2^x+1$) gradation voltage lines by the upper x bits of the n-bit digital signal;

generating $2^y$ gradation voltages from gradation voltages of the two selected adjacent gradation voltage lines; and supplying a corresponding gradation voltage to an output line from the $2^y$ gradation voltages by the lower y bits of the n-bit digital signal.

49. A method according to claim 48, wherein the D/A converstion circuit is formed of thin film transistors over an insulating substrate.

50. A method for driving a D/A conversion circuit for n-bit (n is a natural number not less than 2) digital signal, comprising the steps of:

dividing the n-bit digital signal into upper x bits and lower y bits (x+y=n; both x and y are natural numbers);

selecting a z-th gradation voltage line and a (z+1)-th gradation voltage line ($1 \leq z \leq 2^x$; z is a natural number) from ($2^x+1$) gradation voltage lines by the upper x bits of the n-bit digital signal, voltages supplied to the gradation voltage lines becoming high in a direction from the first gradation voltage line to the ($2^x+1$)-th gradation voltage line;

generating $2^y$ gradation voltages from gradation voltages of the selected z-th and (z+1)-th gradation voltages lines; and supplying a corresponding gradation voltage from the $2^y$ gradation voltages to the output line by the lower y bits of the n-bit digital signal.

51. A method according to claim 50, wherein the D/A conversion circuit is formed of thin film transistors over an insulating substrate.

* * * * *